(12) United States Patent
Harjee et al.

(10) Patent No.: US 10,784,472 B2
(45) Date of Patent: Sep. 22, 2020

(54) NOZZLE-DROPLET COMBINATION TECHNIQUES TO DEPOSIT FLUIDS IN SUBSTRATE LOCATIONS WITHIN PRECISE TOLERANCES

(71) Applicant: Kateeva, Inc., Newark, CA (US)

(72) Inventors: Nahid Harjee, Sunnyvale, CA (US); Lucas D. Barkley, Lexington, KY (US); Christopher R. Hauf, Belmont, CA (US); Eliyahu Vronsky, Los Altos, CA (US); Conor F. Madigan, San Francisco, CA (US)

(73) Assignee: KATEEVA, INC., Newark, CA (US)

( * ) Notice: Subject to any disclaimer, the term of this patent is extended or adjusted under 35 U.S.C. 154(b) by 0 days.

(21) Appl. No.: 16/174,063

(22) Filed: Oct. 29, 2018

(65) Prior Publication Data

US 2019/0074484 A1    Mar. 7, 2019

Related U.S. Application Data

(63) Continuation of application No. 15/361,845, filed on Nov. 28, 2016, which is a continuation of application
(Continued)

(51) Int. Cl.
*H01L 51/56* (2006.01)
*B41J 2/045* (2006.01)
(Continued)

(52) U.S. Cl.
CPC .............. *H01L 51/56* (2013.01); *B41J 2/01* (2013.01); *B41J 2/0456* (2013.01);
(Continued)

(58) Field of Classification Search
CPC . H01L 51/56; H01L 51/0005; H01L 51/0012; H01L 51/0029; B41J 2/04586;
(Continued)

(56) References Cited

U.S. PATENT DOCUMENTS

| 4,922,270 A | 5/1990 | Cobbs et al. |
| 4,963,882 A | 10/1990 | Hickman |

(Continued)

FOREIGN PATENT DOCUMENTS

| CN | 1258250 A | 6/2000 |
| CN | 1311100 A | 9/2001 |

(Continued)

OTHER PUBLICATIONS

Office Action dated Apr. 25, 2019 for JP Patent Application 2018-089271.
(Continued)

*Primary Examiner* — Sharon A. Polk
(74) *Attorney, Agent, or Firm* — Hauptman Ham, LLP

(57) ABSTRACT

An ink printing process employs per-nozzle droplet volume measurement and processing software that plans droplet combinations to reach specific aggregate ink fills per target region, guaranteeing compliance with minimum and maximum ink fills set by specification. In various embodiments, different droplet combinations are produced through different print head/substrate scan offsets, offsets between print heads, the use of different nozzle drive waveforms, and/or other techniques. Optionally, patterns of fill variation can be introduced so as to mitigate observable line effects in a finished display device. The disclosed techniques have many other possible applications.

20 Claims, 15 Drawing Sheets

Related U.S. Application Data

No. 14/937,739, filed on Nov. 10, 2015, now Pat. No. 9,537,119, which is a continuation of application No. 14/680,960, filed on Apr. 7, 2015, now Pat. No. 9,224,952, which is a continuation of application No. 14/162,525, filed on Jan. 23, 2014, now Pat. No. 9,010,899, which is a continuation of application No. PCT/US2013/077720, filed on Dec. 24, 2013.

(60) Provisional application No. 61/920,715, filed on Dec. 24, 2013, provisional application No. 61/898,769, filed on Nov. 1, 2013, provisional application No. 61/857,298, filed on Jul. 23, 2013, provisional application No. 61/842,351, filed on Jul. 2, 2013, provisional application No. 61/822,855, filed on May 13, 2013, provisional application No. 61/746,545, filed on Dec. 27, 2012.

(51) Int. Cl.
  *B41J 2/205* (2006.01)
  *B41J 2/01* (2006.01)
  *H01L 51/00* (2006.01)

(52) U.S. Cl.
  CPC ....... *B41J 2/04581* (2013.01); *B41J 2/04586* (2013.01); *B41J 2/04588* (2013.01); *B41J 2/04593* (2013.01); *B41J 2/2054* (2013.01); *H01L 51/0005* (2013.01); *H01L 51/0012* (2013.01); *H01L 51/0029* (2013.01)

(58) Field of Classification Search
  CPC ........ B41J 2/04593; B41J 2/01; B41J 2/2054; B41J 2/0456; B41J 2/04581; B41J 2/04588; B41J 2/12; B41J 2/07; B41J 29/393
  See application file for complete search history.

(56) References Cited

U.S. PATENT DOCUMENTS

| | | |
|---|---|---|
| 5,317,169 A | 5/1994 | Nakano et al. |
| 5,434,430 A | 7/1995 | Stewart |
| 5,469,276 A | 11/1995 | Shu |
| 5,555,006 A | 9/1996 | Cleveland et al. |
| 5,561,449 A | 10/1996 | Raskin et al. |
| 5,681,757 A | 10/1997 | Hayes |
| 5,707,684 A | 1/1998 | Hayes et al. |
| 5,711,989 A | 1/1998 | Ciardella et al. |
| 5,847,720 A | 12/1998 | Dunand |
| 5,895,692 A | 4/1999 | Shirasaki et al. |
| 5,906,682 A | 5/1999 | Bouras et al. |
| 5,932,012 A | 8/1999 | Ishida et al. |
| 6,013,982 A | 1/2000 | Thompson et al. |
| 6,019,454 A | 2/2000 | Serra et al. |
| 6,066,357 A | 5/2000 | Tang et al. |
| 6,149,263 A | 11/2000 | Nakano |
| 6,164,746 A | 12/2000 | Akahira et al. |
| 6,228,228 B1 | 5/2001 | Singh et al. |
| 6,247,787 B1 | 6/2001 | Giere et al. |
| 6,283,572 B1 | 9/2001 | Kumar et al. |
| 6,328,395 B1 | 12/2001 | Kitahara et al. |
| 6,347,857 B1 | 2/2002 | Purcell et al. |
| 6,352,331 B1 | 3/2002 | Armijo et al. |
| 6,401,001 B1 | 6/2002 | Jang et al. |
| 6,406,114 B1 | 6/2002 | Shioya |
| 6,481,816 B1 | 11/2002 | Oyen |
| 6,495,917 B1 | 12/2002 | Ellis-Monaghan et al. |
| 6,517,176 B1 | 2/2003 | Chaug |
| 6,629,741 B1 | 10/2003 | Okuda et al. |
| 6,736,484 B2 | 5/2004 | Nakamura |
| 6,739,686 B2 | 5/2004 | Imai |
| 6,754,551 B1 | 6/2004 | Zohar et al. |
| 6,783,210 B2 | 8/2004 | Takahashi et al. |
| 6,793,324 B2 | 9/2004 | Hosono et al. |
| 6,824,238 B2 | 11/2004 | Chang |
| 6,837,568 B2 | 1/2005 | Nakamura |
| 6,863,961 B2 | 3/2005 | Miyashita et al. |
| 6,910,762 B2 | 6/2005 | Nakamura |
| 6,960,036 B1 | 11/2005 | Fujita et al. |
| 7,073,727 B2 | 7/2006 | Usuda |
| 7,093,924 B2 | 8/2006 | Nakamura |
| 7,101,013 B2 | 9/2006 | Nakamura |
| 7,111,755 B2 | 9/2006 | Koyama et al. |
| 7,121,642 B2 | 10/2006 | Stoessel et al. |
| 7,138,304 B2 | 11/2006 | Hirai |
| 7,188,919 B2 | 3/2007 | Satomura |
| 7,204,573 B2 | 4/2007 | Koyama |
| 7,216,950 B2 | 5/2007 | Eguchi et al. |
| 7,223,309 B2 | 5/2007 | Takahashi et al. |
| 7,258,408 B2 | 8/2007 | Usuda |
| 7,270,712 B2 | 9/2007 | Edwards et al. |
| 7,278,847 B2 | 10/2007 | Silverbrook |
| 7,381,449 B2 | 6/2008 | Miyasaka |
| 7,461,912 B2 | 12/2008 | Kamiyama et al. |
| 7,503,637 B2 | 3/2009 | Komatsu et al. |
| 7,513,595 B2 | 4/2009 | Nakamura |
| 7,517,549 B2 | 4/2009 | Hayashi |
| 7,600,840 B2 | 10/2009 | Kim et al. |
| 7,611,754 B2 | 11/2009 | Edwards et al. |
| 7,612,917 B2 | 11/2009 | Nagaishi et al. |
| 7,658,465 B2 | 2/2010 | Newsome et al. |
| 7,677,689 B2 | 3/2010 | Kim et al. |
| 7,699,428 B2 | 4/2010 | Kato |
| 7,775,179 B2 | 8/2010 | Kim et al. |
| 7,815,965 B2 | 10/2010 | Edwards et al. |
| 7,823,535 B2 | 11/2010 | Hanafusa et al. |
| 7,850,267 B2 | 12/2010 | Usuda |
| 7,857,242 B2 | 12/2010 | Huang |
| 7,891,752 B2 | 2/2011 | Liu et al. |
| 7,909,427 B2 | 3/2011 | Kim et al. |
| 7,914,104 B2 | 3/2011 | Silverbrook |
| 7,920,934 B2 | 4/2011 | Aruga |
| 7,972,875 B2 | 7/2011 | Rogers et al. |
| 8,025,353 B2 | 9/2011 | Hasenbein |
| 8,066,345 B2 | 11/2011 | Komori et al. |
| 8,119,186 B2 | 2/2012 | Sakai |
| 8,123,324 B2 | 2/2012 | Komori et al. |
| 8,124,190 B2 | 2/2012 | Miyasaka |
| 8,235,487 B2 | 8/2012 | Madigan et al. |
| 8,248,656 B2 | 8/2012 | Lin et al. |
| 8,323,724 B2 | 12/2012 | Shinohara |
| 8,342,623 B2 | 1/2013 | Hong et al. |
| 8,342,636 B2 | 1/2013 | Nakano et al. |
| 8,343,869 B2 | 1/2013 | Gothait et al. |
| 8,382,232 B2 | 2/2013 | Silverbrook |
| 8,383,202 B2 | 2/2013 | Somekh et al. |
| 8,413,602 B2 | 4/2013 | Nakamura |
| 8,435,093 B2 | 5/2013 | Takeuchi |
| 8,449,058 B2 | 5/2013 | Hasenbein |
| 8,459,768 B2 | 6/2013 | Hasenbein et al. |
| 8,466,484 B2 | 6/2013 | Slyke et al. |
| 8,579,408 B2 | 11/2013 | Kelly et al. |
| 8,784,938 B2 | 7/2014 | Suzuki et al. |
| 9,010,899 B2 | 4/2015 | Harjee et al. |
| 9,224,952 B2 | 12/2015 | Harjee et al. |
| 9,352,561 B2 | 5/2016 | Harjee et al. |
| 9,527,276 B2 | 12/2016 | Mala et al. |
| 9,537,119 B2 | 1/2017 | Harjee et al. |
| 9,700,908 B2 | 7/2017 | Baker et al. |
| 9,802,403 B2 | 10/2017 | Harjee et al. |
| 9,873,273 B2 | 1/2018 | Mauck et al. |
| 2001/0017703 A1 | 8/2001 | Szumla |
| 2002/0109862 A1 | 8/2002 | Hayama |
| 2003/0087026 A1 | 5/2003 | Dijksman et al. |
| 2003/0184613 A1 | 10/2003 | Nakamura et al. |
| 2003/0197747 A1 | 10/2003 | Hattori |
| 2004/0004643 A1 | 1/2004 | Satomura |
| 2004/0009309 A1 | 1/2004 | Raksha et al. |
| 2004/0019143 A1 | 1/2004 | Koloski et al. |
| 2004/0027405 A1 | 2/2004 | Stoessel et al. |
| 2004/0104951 A1 | 6/2004 | Shibata et al. |

(56) References Cited

U.S. PATENT DOCUMENTS

| | | |
|---|---|---|
| 2004/0169691 A1 | 9/2004 | Newsome et al. |
| 2004/0170762 A1 | 9/2004 | Newsome et al. |
| 2005/0009213 A1 | 1/2005 | Wang et al. |
| 2005/0030612 A1 | 2/2005 | Yamazaki et al. |
| 2005/0078133 A1 | 4/2005 | Molinet et al. |
| 2005/0140709 A1 | 6/2005 | Sekiya |
| 2005/0247340 A1 | 11/2005 | Zeira |
| 2006/0093751 A1 | 5/2006 | White et al. |
| 2006/0126121 A1 | 6/2006 | Chung |
| 2006/0132529 A1 | 6/2006 | Verhoest et al. |
| 2006/0209347 A1 | 9/2006 | Nagaishi et al. |
| 2006/0214976 A1 | 9/2006 | Iwao et al. |
| 2007/0070099 A1 | 3/2007 | Beer et al. |
| 2007/0109342 A1 | 5/2007 | Kato |
| 2007/0176173 A1 | 8/2007 | Ramakrishnan et al. |
| 2008/0024532 A1 | 1/2008 | Kim |
| 2008/0049231 A1 | 2/2008 | Bachalo et al. |
| 2008/0117247 A1 | 5/2008 | Miller et al. |
| 2008/0150419 A1 | 6/2008 | Kang |
| 2008/0158278 A1 | 7/2008 | Inoue |
| 2008/0180473 A1 | 7/2008 | Gardner et al. |
| 2008/0227663 A1 | 9/2008 | Tisone et al. |
| 2008/0278534 A1 | 11/2008 | Kim et al. |
| 2008/0305969 A1 | 12/2008 | Dijksman et al. |
| 2008/0308037 A1 | 12/2008 | Bulovic et al. |
| 2008/0317941 A1 | 12/2008 | Hanaoka |
| 2009/0096823 A1 | 4/2009 | Watt et al. |
| 2009/0096825 A1 | 4/2009 | Takahashi et al. |
| 2009/0117261 A1 | 5/2009 | Sakai |
| 2009/0184990 A1 | 7/2009 | Shang et al. |
| 2009/0191342 A1 | 7/2009 | Chu et al. |
| 2009/0322828 A1 | 12/2009 | Kim et al. |
| 2010/0024725 A1 | 2/2010 | Lennon et al. |
| 2010/0066779 A1 | 3/2010 | Gothait et al. |
| 2010/0166950 A1 | 7/2010 | Nieminen |
| 2010/0184244 A1 | 7/2010 | Hunt |
| 2010/0311298 A1 | 12/2010 | Suzuki et al. |
| 2011/0032297 A1 | 2/2011 | Mitsuzawa |
| 2011/0084290 A1 | 4/2011 | Nakamura et al. |
| 2011/0087718 A1 | 4/2011 | Srinivasan et al. |
| 2011/0121021 A1 | 5/2011 | Dudenhoefer et al. |
| 2011/0267390 A1 | 11/2011 | Bulovic et al. |
| 2011/0279544 A1 | 11/2011 | Dovrat et al. |
| 2012/0056923 A1 | 3/2012 | Vronsky et al. |
| 2012/0058251 A1 | 3/2012 | Yamazaki |
| 2012/0069076 A1 | 3/2012 | Higuchi |
| 2012/0139984 A1 | 6/2012 | Lang |
| 2012/0274648 A1 | 11/2012 | Hwang et al. |
| 2012/0306951 A1 | 12/2012 | Somekh et al. |
| 2012/0309252 A1 | 12/2012 | Takeuchi |
| 2013/0026533 A1 | 1/2013 | Lee |
| 2013/0040061 A1 | 2/2013 | Lowrance et al. |
| 2013/0057879 A1 | 3/2013 | Takagi et al. |
| 2013/0120485 A1 | 5/2013 | Kodama et al. |
| 2013/0168664 A1 | 7/2013 | Crankshaw |
| 2013/0206058 A1 | 8/2013 | Mauck et al. |
| 2013/0286073 A1 | 10/2013 | Blessing et al. |
| 2013/0307898 A1 | 11/2013 | Somekh et al. |
| 2014/0117316 A1 | 5/2014 | Choi |
| 2014/0165864 A1 | 6/2014 | Oppenheim |
| 2014/0184683 A1 | 7/2014 | Harjee et al. |
| 2015/0273869 A1 | 10/2015 | Ide et al. |
| 2015/0298153 A1 | 10/2015 | Baker et al. |
| 2016/0311219 A1 | 10/2016 | Harjee et al. |
| 2017/0170435 A1 | 6/2017 | Harjee et al. |
| 2017/0210886 A1 | 7/2017 | Ikeda et al. |
| 2017/0259560 A1 | 9/2017 | Sreenivasan et al. |
| 2018/0008995 A1 | 1/2018 | Baker et al. |
| 2018/0083230 A1 | 3/2018 | Harjee et al. |
| 2018/0146162 A1 | 5/2018 | Hauf et al. |
| 2019/0074484 A1 | 3/2019 | Harjee et al. |

FOREIGN PATENT DOCUMENTS

| | | |
|---|---|---|
| CN | 1430554 A | 7/2003 |
| CN | 1473707 A | 2/2004 |
| CN | 1476973 A | 2/2004 |
| CN | 1503338 A | 6/2004 |
| CN | 1513214 A | 7/2004 |
| CN | 1572497 A | 2/2005 |
| CN | 1607378 A | 4/2005 |
| CN | 101020386 A | 8/2007 |
| CN | 101022893 A | 8/2007 |
| CN | 101024334 A | 8/2007 |
| CN | 101202328 A | 6/2008 |
| CN | 101222026 A | 7/2008 |
| CN | 101301814 A | 11/2008 |
| CN | 101544107 A | 9/2009 |
| CN | 101027186 B | 12/2010 |
| CN | 101256092 B | 2/2011 |
| CN | 1753600 B | 8/2011 |
| CN | 101648458 B | 2/2012 |
| CN | 101743125 B | 7/2013 |
| CN | 103241025 A | 8/2013 |
| CN | 102555467 B | 7/2015 |
| CN | 103026789 A | 1/2016 |
| EP | 0976567 A2 | 2/2000 |
| EP | 0880303 B1 | 1/2004 |
| EP | 1211916 B1 | 8/2006 |
| EP | 0863478 B1 | 9/2006 |
| EP | 0863004 B2 | 7/2011 |
| EP | 1874551 B1 | 11/2012 |
| EP | 1376716 B1 | 8/2013 |
| JP | H0578655 A | 3/1993 |
| JP | H07169567 A | 7/1995 |
| JP | H10012377 A1 | 6/1998 |
| JP | H10193587 A | 7/1998 |
| JP | 2991270 B2 | 12/1999 |
| JP | 3036436 B2 | 4/2000 |
| JP | 2001038892 A | 2/2001 |
| JP | 2001071476 A | 3/2001 |
| JP | 2001121722 A1 | 5/2001 |
| JP | 2001162840 A1 | 9/2001 |
| JP | 2002205429 A | 7/2002 |
| JP | 2002323615 A1 | 11/2002 |
| JP | 2003014442 A | 1/2003 |
| JP | 2003127430 A | 5/2003 |
| JP | 2003161824 A | 6/2003 |
| JP | 2003249355 A1 | 9/2003 |
| JP | 2003311943 A | 11/2003 |
| JP | 2003338370 A | 11/2003 |
| JP | 2004106511 A | 4/2004 |
| JP | 2004209412 A | 7/2004 |
| JP | 2004267874 A | 9/2004 |
| JP | 2004295092 A | 10/2004 |
| JP | 2004337709 A | 12/2004 |
| JP | 2005502987 A | 1/2005 |
| JP | 2005044613 A | 2/2005 |
| JP | 2005131606 A | 5/2005 |
| JP | 2005183184 A | 7/2005 |
| JP | 2005193104 A1 | 7/2005 |
| JP | 3679987 B2 | 8/2005 |
| JP | 2005296904 A | 10/2005 |
| JP | 2006021146 A | 1/2006 |
| JP | 2006212501 A | 8/2006 |
| JP | 2007117833 A | 5/2007 |
| JP | 2007207762 A | 8/2007 |
| JP | 2007299725 A | 11/2007 |
| JP | 4027552 B2 | 12/2007 |
| JP | 2003217840 B | 1/2008 |
| JP | 2008233833 A | 10/2008 |
| JP | 2009093189 A | 4/2009 |
| JP | 2009117141 A | 5/2009 |
| JP | 4273819 B2 | 6/2009 |
| JP | 2002225259 A1 | 8/2009 |
| JP | 2009189954 A | 8/2009 |
| JP | 2009291710 A | 12/2009 |
| JP | 2011508062 A | 3/2011 |
| JP | 2012173504 A | 9/2012 |
| JP | 2012218233 A | 11/2012 |
| JP | 2013225671 A | 10/2013 |

(56) References Cited

FOREIGN PATENT DOCUMENTS

| | | | |
|---|---|---|---|
| JP | 2014502931 A | 2/2014 |
| KR | 20080102829 A | 11/2008 |
| TW | 200426036 A | 12/2004 |
| TW | 200727994 A | 8/2007 |
| TW | 200950975 A | 12/2009 |
| TW | 201426566 B | 7/2014 |
| WO | 2008059276 A2 | 5/2008 |
| WO | 2008131383 A1 | 10/2008 |
| WO | 2010014061 A1 | 2/2010 |
| WO | 2012093086 A1 | 7/2012 |
| WO | 2012164628 A1 | 12/2012 |
| WO | 2013088430 A1 | 6/2013 |
| WO | 2013099276 A1 | 7/2013 |

OTHER PUBLICATIONS

OA.
Notice of Allowance dated Apr. 11, 2019, to U.S. Appl. No. 15/802,325.
Notice of Allowance dated Apr. 16, 2019, to U.S. Appl. No. 15/716,753.
Corrected Notice of Allowance dated Apr. 2, 2019, to U.S. Appl. No. 15/361,845.
Corrected Notice of Allowance dated Mar. 13, 2019, to U.S. Appl. No. 15/361,845.
Examiner Initiated Interview Summary dated Mar. 22, 2019, to U.S. Appl. No. 15/802,325.
Notice of Allowance dated Apr. 3, 2019, to U.S. Appl. No. 15/416,872.
Notice of Allowance dated Mar. 22, 2019, to U.S. Appl. No. 15/802,325.
Office action dated Dec. 27, 2018, to CN Patent Application No. 201711129372.4.
Office action dated Feb. 27, 2019, to JP Patent Application No. 2018-92037.
Office action dated Feb. 27, 2019, to JP Patent Application No. 2018-92039.
Office action dated Jan. 31, 2019, to CN Patent Application No. 201711259406.1.
General Guidelines on Drop Size measurement Techniques and Terminology (1997).
Office Action dated Apr. 15, 2019 for JP Application No. 2018-107021.
First Office Action dated Apr. 11, 2019 to CN No. 201711258771.0.
Official Letter dated Jul. 9, 2019 to TW Application No. 106140977.
Provisional Rejection dated Mar. 28, 19 KR Application No. 10-2018-7034202.
Informal Comments filed on Feb. 13, 2016, to the International Search Report and Written Opinion issued to PCT Application No. PCT/US2015/38693.
International Search Report and Written Opinion dated Nov. 14, 2014 for PCT Application No. PCT/US20141035193.
Applicant Initiated Interview Summary dated Oct. 15, 2015, to U.S. Appl. No. 13/340,403.
Applicant-Initiated Interview Summary dated Jul. 26, 2016, to U.S. Appl. No. 14/937,739.
CN First Office Action with Search Report dated Aug. 1, 2018, for CN Patent Application No. 201710770926.2.
Corrected Notice of Allowability dated Jun. 28, 2018, to U.S. Appl. No. 15/361,845.
EP Extended Search Report dated Dec. 21, 2018, EP18188398.4.
EP Extended Search Report dated May 7, 2018 to EP Patent Application No. 15815375.9.
EP Search Report dated Apr. 3, 2017 to EP Patent Application No. 14787652.8.
Examination Report dated Apr. 17, 2017 to TW Patent Application No. 105123219.
Examination Report dated Mar. 20, 2018, to TW Patent Application No. 106140977.
Examination Report dated Mar. 28, 2018, to TW Patent Application No. 104128982.
Extended European Search Report dated Jan. 3, 2018, to EP Patent Application No. 14870074.3.
Extended Search Report dated Feb. 29, 2016, to EP Patent Application 13866979.1.
Extended Search Report dated Mar. 17, 2017, to EP Patent Application 13866979.1.
Final Office Action dated Feb. 20, 2015, to U.S. Appl. No. 14/162,525.
Final Office Action dated Feb. 27, 2015 to U.S. Appl. No. 14/340,403.
Final Official Action dated Feb. 2, 2018, to JP Patent Application No. 2016-096406.
Informal Comments filed on Dec. 19, 2014 for the International Search and Written Opinion for PCT Application No. PCT/US2014/035193.
Informal Comments filed Feb. 13, 2016, to the International Search Report and Written Opinion issued to PCT Application No. PCT/US2015/38693.
International Search Report and Written Opinion dated Apr. 30, 2014 for PCT Application No. PCT/US2013/077720.
International Search Report and Written Opinion dated Dec. 11, 2015 for PCT Application PCT/US15/47687.
International Search Report and Written Opinion dated Nov. 14, 2014 for PCT Application No. PCT/US2014/035193.
International Search Report and Written Opinion dated Oct. 6, 2015 to PCT Application PCT/US15/38693.
Jabbour, Ghassan E., "Printing Techniques in Organic Based Optoelectronics," Semiconductor Device Research Symposium, 2001 International, Dec. 5-7, 2001.
Lee et al., "Fabrication of Organic Light Emitting Display Using Inkjet Printing Technology," Optomechatronic Technologies, 2009. ISOT 2009. International Symposium, Sep. 21-23, 2009, pp. 71-76.
Moon et al., "Fabrication of Functionality Graded Reaction infiltrated SIC-Si Composite by Three-Dimensional Printing (3DTM) process" Materials Science and Engineering, vol. 298, 2001, p. 110-119.
Non-Final Office Action dated Dec. 29, 2017, to U.S. Appl. No. 15/361,845.
Non-Final Office Action dated Oct. 9, 2015, to U.S. Appl. No. 14/680,960.
Non-Final Office Action dated Apr. 3, 2014 to U.S. Appl. No. 14/162,525.
Non-Final Office Action dated Dec. 17, 2014 to U.S. Appl. No. 14/340,403.
Non-Final Office Action dated Mar. 18, 2016, to U.S. Appl. No. 14/937,739.
Non-final office action dated Nov. 28, 2018, to U.S. Appl. No. 15/607,137.
Non-final Office action dated Nov. 28, 2018, to U.S. Appl. No. 15/802,325.
Non-Final Office Action dated Oct. 27, 2015, to U.S. Appl. No. 14/340,403.
Non-Final Office action dated Sep. 28, 2018, to U.S. Appl. No. 15/716,753.
Notice of Allowance dated Apr. 11, 2016, to U.S. Appl. No. 14/340,403.
Notice of Allowance dated Jan. 3, 2019, to U.S. Appl. No. 15/416,872.
Notice of Allowance dated Jul. 13, 2018, to U.S. Appl. No. 15/416,872.
Notice of Allowance dated Jun. 28, 2018, to U.S. Appl. No. 15/361,845.
Notice of Allowance dated Jun. 29, 2018 to U.S. Appl. No. 15/416,931.
Notice of Allowance dated Mar. 16, 2016, to U.S. Appl. No. 14/340,403.
Notice of Allowance dated Mar. 17, 2015 to U.S. Appl. No. 14/462,525.
Notice of Allowance dated May 11, 2018 to U.S. Appl. No. 15/607,137.
Notice of Allowance dated May 11, 2018 to U.S. Appl. No. 15/361,845.
Notice of Allowance dated Nov. 16, 2018 to U.S. Appl. No. 15/361,845.

(56) References Cited

OTHER PUBLICATIONS

Notice of Allowance dated Nov. 6, 2015 to U.S. Appl. No. 14/680,960.
Notice of Allowance dated Sep. 14, 2018, to U.S. Appl. No. 15/361,845.
Notice of Allowance dated Sep. 19, 2017, to U.S. Appl. No. 15/361,845.
Notice of Final Refusal dated Oct. 18, 2018, to KR Patent Application No. 10-2016-7018761.
Notification of a Second Provisional Rejection to KR Patent Application 10-2015-7020356 dated May 31, 2016.
Notification of First Refusal dated Jun. 22, 2018, to KR Patent Application No. 10-2016-7018761.
Examination Report dated Feb. 10, 2020 to TW Application 108109190.
Examination Report dated Oct. 16, 2019 to TW Application 108109190.
Non Final Office Action dated Feb. 12, 2020 for U.S. Appl. No. 15/804,015.
Notice of Allowance dated Feb. 12, 2020 for U.S. Appl. No. 15/716,753
Notice of Allowance dated Jul. 12, 2019 for U.S. Appl. No. 15/416,872.
Notice of Allowance dated Jun. 26, 2019 for U.S. Appl. No. 15/416,931.
Notice of Allowance dated Jul. 4, 2019 for U.S. Appl. No. 15/802,325.
Notice of Final Rejection dated Jul. 12, 2019 for KR Patent Application No. 10-2018-7034202.
Notice of Reasons for Refusal dated Jul. 31, 2019 for JP Patent Application No. 2018-160163.
Office Action dated Dec. 17, 2018 for CN Patent Application No. 201711129340.4.
Office Action dated Dec. 18, 2018 for CN Patent Application No. 201711129387.0.
Office Action dated Apr. 8, 2019 for CN Patent Application No. 201711129362.0.
Official Action dated Jan. 6, 2020 for JP Patent Application No. 2018-89271.
Penultimate Office Action dated Feb. 4, 2020 for JP Patent Application No. 2018-107021.
Provisional Refusal dated Feb. 13, 2019 for KR Patent Application No. 10-2017-7011557.
Third Office Action dated Jan. 16, 2020 for CN Patent Application No. 201711258756.6.
Notice of First Refusal dated Jul. 15, 2019 to KR Application No. 10-2018-7034202.
Notification of Provisional Rejection to KR Patent Application 10-2015-7020356 dated Dec. 14, 2015.
Office Action dated Apr. 6, 2016, to CN Patent Application No. 201380073929.0.
Office Action dated Dec. 17, 2015, to Japanese Patent Application No. 2015-550755.
Office action dated Dec. 3, 2018, to CN Patent Application No. 201711259332.1.
Office Action dated Dec. 4, 2017, to JP Patent Application No. 2016-510764.
Office action dated Jan. 11, 2018, to JP Patent Application No. 2016-526020.
Office action dated Jan. 16, 2019, to CN Patent Application No. 201711258756.6.
Office action dated Jun. 2, 2017, to JP Patent Application No. 2016-96406.
Office Action dated Jun. 21, 2018, to CN Patent Application No. 20150046878.1.
Office Action dated Jun. 22, 2016 to CN Patent Application 201480023530.6.
Office Action dated Oct. 23, 2015, to TW Patent Application 102148330.
Office action dated Sep. 3, 2018, to JP Patent Application No. 2017-160095.
Penultimate Office action dated Nov. 2, 2018, for JP Patent Application 2016-510764.
Provisional Rejection dated Nov. 30, 2018, to KR Patent Application No. 10-2018-7033028.
Provisional Rejection dated Oct. 26, 2018, to KR Patent Application No. 10-2017-7008701.
Second Office action dated Feb. 24, 2017, to CN Patent Application No. 201480023530.6.
Second Office Action dated Sep. 26, 2016, to CN Patent Application No. 201380073929.0.
Third Office Action issued to CN Patent Application No. 201380073929.0, dated Feb. 13, 2017.
TW Office Action Rejection dated Aug. 3, 2018, for TW Patent Application No. 106140977.
Final Office Action dated May 18, 2020 to U.S. Appl. No. 15/804,015.
Non Final Office Action dated Apr. 3, 2020 to U.S. Appl. No. 15/716,753.
Non Final Office Action dated May 28, 2020 to U.S. Appl. No. 16/356,430.
Notice of Allowance dated Mar. 13, 2020 to U.S. Appl. No. 15/795,664.
Notice of Allowance dated May 19, 2020 to U.S. Appl. No. 15/802,325.
Notice of First Refusal dated May 26, 2020 to KR Patent Application No. 10-2019-7031616.

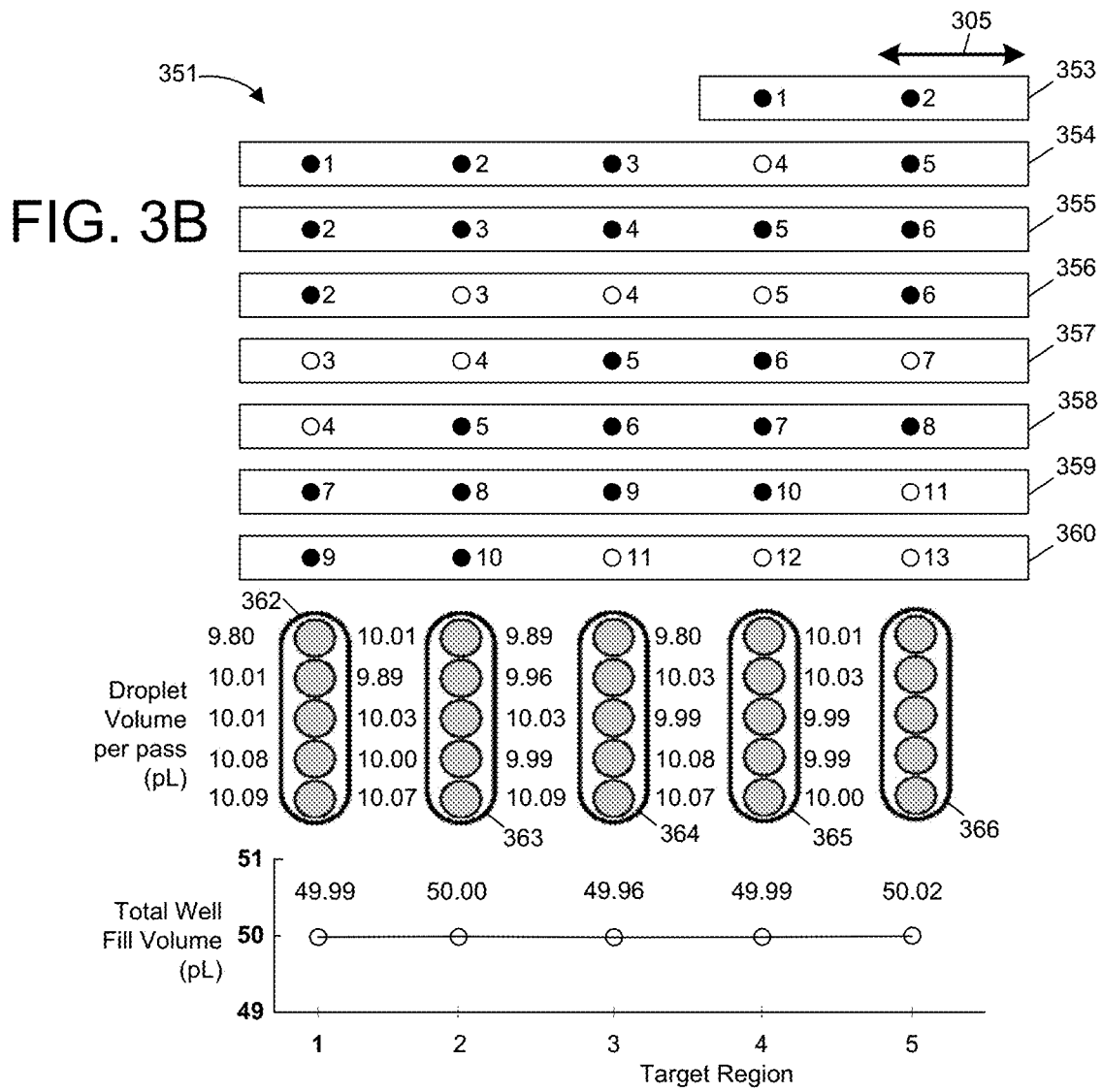
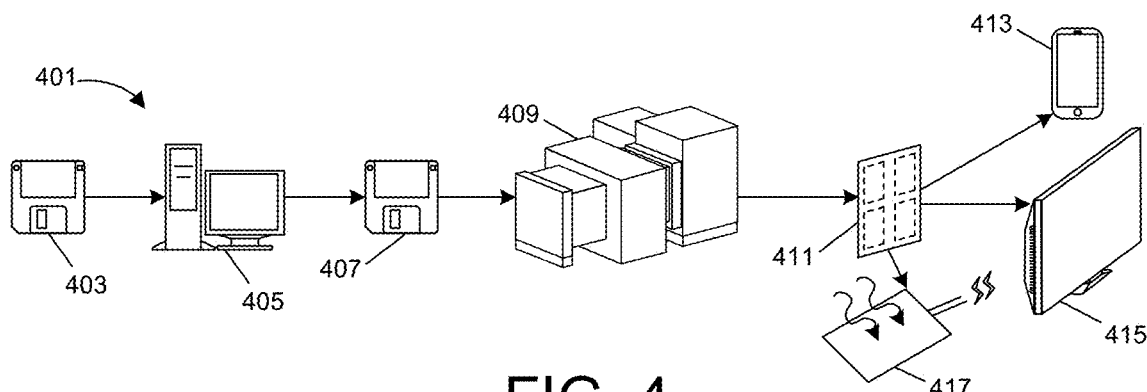

NOZZLE-DROPLET COMBINATION TECHNIQUES TO DEPOSIT FLUIDS IN SUBSTRATE LOCATIONS WITHIN PRECISE TOLERANCES

CROSS-REFERENCE TO RELATED APPLICATIONS

This application is a continuation of U.S. Utility patent application Ser. No. 15/361,845, filed Nov. 28, 2016 for "Nozzle-Droplet Combination Techniques to Deposit Fluids in Substrate Locations Within Precise Tolerances". U.S. Ser. No. 15/361,845 is a continuation of U.S. Utility patent application Ser. No. 14/937,739, filed Nov. 10, 2015, now U.S. Pat. No. 9,537,119, issued on Jan. 13, 2017 for "Nozzle-Droplet Combination Techniques To Deposit Fluids in Substrate Locations Within Precise Tolerances,". U.S. Ser. No. 14/937,739 is a continuation of U.S. Utility patent application Ser. No. 14/680,960, filed Apr. 7, 2015, now U.S. Pat. No. 9,224,952, issued on Dec. 29, 2015, for "Methods of Manufacturing Electronic Display Devices Employing Nozzle-Droplet Combination Techniques To Deposit Fluids In Substrate Locations Within Precise Tolerances". U.S. Ser. No. 14/680,960 is a continuation of U.S. Utility patent application Ser. No. 14/162,525, filed Jan. 23, 2014, now U.S. Pat. No. 9,010,899, issued on Apr. 21, 2015, for "Techniques For Print Ink Volume Control To Deposit Fluids Within Precise Tolerances". U.S. Ser. No. 14/162,525 is a continuation of PCT Patent Application No. PCT/US13/77720, filed Dec. 24, 2013, which claims priority to U.S. Provisional Patent Application No. 61/746,545, filed Dec. 27, 2012 for "Smart Mixing". PCT Patent Application No. PCT/US13/77720 claims priority to U.S. Provisional Patent Application No. 61/822,855 for "Systems and Methods Providing Uniform Printing of OLED Panels," filed on May 13, 2013. PCT Patent Application No. PCT/US13/77720 claims priority to U.S. Provisional Patent Application No. 61/842,351 for "Systems and Methods Providing Uniform Printing of OLED Panels," filed on Jul. 2, 2013. PCT Patent Application No. PCT/US13/77720 claims priority to U.S. Provisional Patent Application No. 61/857,298 for "Systems and Methods Providing Uniform Printing of OLED Panels," filed on Jul. 23, 2013. PCT Patent Application No. PCT/US13/77720 claims priority to U.S. Provisional Patent Application No. 61/898,769 for "Systems and Methods for Substrate Printing," filed on Nov. 1, 2013. PCT Patent Application No. PCT/US13/77720 claims priority to U.S. Provisional Patent Application No. 61/920,715 for "Techniques for Print Ink Volume Control To Deposit Fluids Within Precise Tolerances," filed on Dec. 24, 2013. PCT Patent Application No. PCT/US13/77720 claims priority to Taiwan Patent Application No. 102148330 for "Techniques for Print Ink Volume Control To Deposit Fluids Within Precise Tolerances," filed on behalf of first named inventor Nahid Harjee on Dec. 26, 2013. Each of the aforementioned patent applications is hereby incorporated by reference.

This disclosure relates to use of a printing process to transfer a fluid to target regions of a substrate. In one non-limiting application, techniques provided by this disclosure can be applied to a manufacturing process for large scale displays.

BACKGROUND

In a printing process where a print head has multiple nozzles, not every nozzle reacts to a standard drive waveform the same way, i.e., each nozzle can produce a droplet of slightly different volume. In situations where the nozzles are relied upon to deposit fluid droplets into respective fluid deposition areas ("target regions"), lack of consistency can lead to problems.

FIG. 1A is used to introduce this nozzle-droplet inconsistency issue, with an illustrative diagram generally referenced using numeral 101. In FIG. 1, a print head 103 is seen to have five ink nozzles, which are each depicted using small triangles at the bottom of the print head, each respectively numbered (1)-(5). It should be assumed that in an example application, it is desired to deposit fifty picoliters (50.00 pL) of a fluid into each of five specific target regions of an array of such regions, and further, that each of five nozzles of a print head is to eject ten picoliters (10.00 pl) of fluid with each relative movement ("pass" or "scan") between the print head and a substrate into each of the various target regions. The target regions can be any surface areas of the substrate, including adjoining unseparated areas (e.g., such that deposited fluid ink partially spreads to blend together between regions), or respective, fluidically-isolated regions. These regions are generally represented in FIG. 1 using ovals 104-108, respectively. Thus, it might be assumed that exactly five passes of the print head are necessary as depicted to fill each of the five specific target regions. However, print head nozzles will in practice have some minor variations in structure or actuation, such that a given drive waveform applied to respective nozzle transducers yields slightly different droplet volumes for each nozzle. As depicted in FIG. 1A, for example, the firing of nozzle (1) yields a droplet volume of 9.80 picoliters (pL) with each pass, with five 9.80 pL droplets being depicted within oval 104. Note that each of the droplets is represented in the figure by a distinct location within the target region 104, but in practice, the location of each of the droplets may be the same or may overlap. Nozzles (2)-(5), by contrast, yield slightly different, respective droplet volumes of 10.01 pL, 9.89 pL, 9.96 pL and 10.03 pL. With five passes between print head and substrate where each nozzle deposits fluid on a mutually-exclusive basis into the target regions 104-108, this deposition would result in a total deposited ink volume variation of 1.15 pL across the five target regions; this can be unacceptable for many applications. For example, in some applications, discrepancy of as little as one percent (or even much less) in deposited fluid can cause issues.

One example application where this issue arises is in a manufacturing process applied to the fabrication of displays, such as organic light-emitting diode ("OLED") displays. Where a printing process is used to deposit an ink carrying light-generating materials of such displays, the volume discrepancy across rows or columns of fluid receptacles or "wells" (e.g., with 3 such receptacles per pixel) can lead to visible color or lighting defects in a displayed image. Note that "ink" as used herein refers to any fluid applied to a substrate by nozzles of a print head irrespective of color characteristics; in the mentioned-manufacturing application, ink is typically deposited in place and then processed or cured in order to directly form a permanent material layer. Television and display manufacturers will therefore effectively specify precise volume ranges that must be observed with a high-degree of precision, e.g., 50.00 pL, ±0.25 pL in order for a resultant product to be considered acceptable; note that in this application, the specified tolerance must be within one-half percent of the target of 50.00 pL. In an application where each nozzle represented by FIG. 1 was to deposit into pixels in respective horizontal lines of a high-definition television ("HDTV") screen, the depicted variation of 49.02 pL-50.17 pL might therefore yield unacceptable quantity. While display technologies have been cited as an example, it should be understood that the nozzle-droplet inconsistency problem can arise in other contexts.

In FIG. 1A, nozzles are specifically aligned with target regions (e.g., wells) such that specific nozzles print into specific target regions. In FIG. 1B, an alternate case 151 is shown in which the nozzles are not specially aligned, but in which nozzle density is high relative to target region density; in such a case, whichever nozzles happen to traverse specific target regions during a scan or pass are used to print into those target regions, with potentially several nozzles traversing each target region in each pass. In the example shown, the print head 153 is seen to have five ink nozzles and the substrate is seen to have two target regions 154-155, each located such that nozzles (1) and (2) will traverse target region 154, nozzles (4) and (5) will traverse target region 155, and nozzle (3) will not traverse either target region. As shown, in each pass, one or two droplets are deposited into each well, as depicted. Note that once again, the droplets can be deposited in a manner that is overlapping or at discrete points within each target region, and that the particular illustration in FIG. 1B is illustrative only; as with the example presented in FIG. 1A, it is once again assumed that it is desired to deposit fifty picoliters (50.00 pL) of a fluid into each of target regions 154-155, and that each nozzle has a nominal droplet volume of approximately 10.00 pL. Utilizing the same per nozzle droplet volume variation as observed in connection with the example of FIG. 1A, and assuming that each nozzle that overlaps with a target region on a given pass will deliver a droplet into that target region up until a total of five droplets have been delivered, it is observed that the target regions are filled in three passes and there is a total deposited ink volume variation from the target of 50.00 pL of 0.58 pL across the two target regions; this, again, can be unacceptable for many applications.

While techniques have been proposed to address the consistency problem, generally speaking, these techniques either still do not reliably provide fill volumes that stay within the desired tolerance range or they dramatically increase manufacturing time and cost, i.e., they are inconsistent with a goal of having high quality with a low consumer price-point; such quality and low price-point can be key for applications where commodity products, such as HDTVs, are concerned.

What is therefore needed are techniques useful in depositing fluid into target regions of a substrate using a print head with nozzles. More specifically, what is needed are techniques for precisely controlling deposited fluid volumes in respective target regions of a substrate given variations in nozzle-droplet ejection volumes, ideally on a cost-effective basis that permits fast fluid deposition operations and thus improves the speed of device fabrication. The techniques described below satisfy these needs and provide further, related advantages.

BRIEF DESCRIPTION OF THE DRAWINGS

FIG. 3B is a diagram used to illustrate relative print head/substrate motion and the ejection of different droplet volume combinations into respective target regions of a substrate.

FIG. 4 provides an illustrative view showing a series of optional tiers, products or services that can each independently embody the techniques introduced earlier.

Figure 1A:
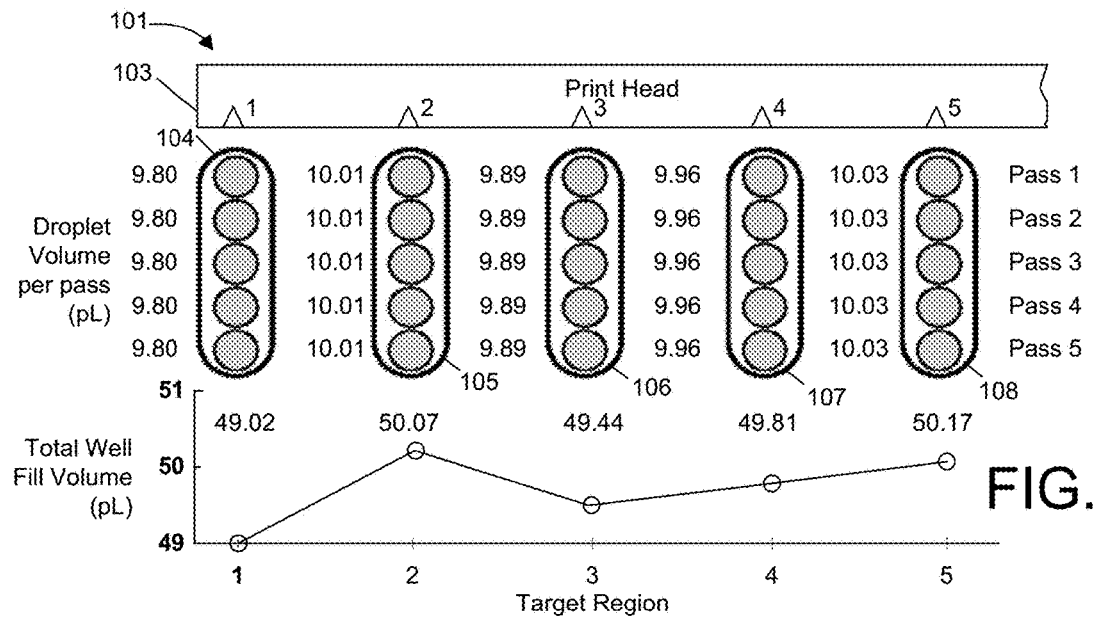
FIG. 1A is a diagram that presents a hypothetical problem of depositing ink in target regions of a substrate where a print head with five nozzles is used to deposit a target fill of 50.00 pL in each of five specific target regions.

The subject matter defined by the enumerated claims may be better understood by referring to the following detailed description, which should be read in conjunction with the accompanying drawings. This description of one or more particular embodiments, set out below to enable one to build and use various implementations of the technology set forth by the claims, is not intended to limit the enumerated claims, but to exemplify their application. Without limiting the foregoing, this disclosure provides several different examples of techniques used to fabricate a materials layer by planning print head movement so as to maintain deposited ink volume within predetermined allowances while not excessively increasing the number of print head passes (and thus the time needed to complete a deposited layer). These techniques can be embodied as software for performing these techniques, in the form of a computer, printer or other device running such software, in the form of control data (e.g., a print image) for forming a materials layer, as a deposition mechanism, or in the form of an electronic or other device (e.g., a flat panel device or other consumer end product) fabricated as a result of these techniques. While specific examples are presented, the principles described herein may also be applied to other methods, devices and systems as well.

DETAILED DESCRIPTION

This disclosure relates to use of a printing process to transfer layer material to a substrate. The nozzle consistency issue introduced above is addressed by measuring droplet volume per nozzle (or variation in droplet volume across nozzles) of a print head for a given nozzle firing waveform. This permits planning of print head firing patterns and/or motion to deposit precise aggregate fill volumes of ink in each target region. With an understanding of how droplet volume varies across nozzles, print head/substrate positional offsets and/or droplet firing patterns can be planned in a manner that accommodates differences in droplet volumes but that still concurrently deposits droplets in adjacent target regions with each pass or scan. Viewed from a different perspective, rather than normalizing or averaging out nozzle-to-nozzle variation in droplet volumes, the specific droplet volume characteristics of each nozzle are measured and used in a planned manner to concurrently achieve specific in-range aggregate volumes for multiple target regions of the substrate; in many embodiments, this task is performed using an optimization process that reduces the number of scans or print head passes in dependence on one or more optimization criteria.

In one optional embodiment, the print head and/or the substrate are "stepped" in variable amounts so as to change, as appropriate, the nozzle used for each target region in various passes to eject specifically desired droplet volumes. Multiple passes are planned so that each target region receives a specific aggregate fill. That is, each target region (for example, each well in a row of wells that will form pixelated components of a display) receives a planned combination of one or more droplet volumes to achieve an aggregate volume within a specified tolerance range using different geometric steps of print head relative to substrate. In more detailed features of this embodiment, given the nozzles' positional relationships to one another, a pareto optimal solution can be computed and applied, such that a tolerable amount of volume variation in each target region is permitted, within specification, but at the same time, the print head/substrate movement is planned to maximize average concurrent use of nozzles for respective target deposition regions. In one optional refinement, a function is applied to reduce and even minimize the number of print head/substrate passes needed for printing. Reflecting briefly upon these various features, fabrication cost is substantially reduced as the printing of layers of material on a substrate can be performed quickly and efficiently.

Note that in a typical application, the target regions that receive ink can be arrayed, that is, laid out in rows and columns, where a swath described by relative print head/substrate motion will deposit ink in a subset of all of the rows (of target regions of the array), but in a manner that covers all columns of the array in a single pass; also, the number of rows, columns and print head nozzles can be quite large, e.g., involving hundreds or thousands of rows, columns and/or print head nozzles.

A second optional embodiment addresses the nozzle consistency issue in a slightly different manner. A set of multiple, prearranged, alternate nozzle firing waveforms with known (and different) droplet volume characteristics is made available to each nozzle; for example, a set of four, eight or another number of alternate waveforms can be hard-wired or otherwise predefined to provide a corresponding set of selectable, slightly-different droplet volumes. Per-nozzle volume data (or difference data) is then used to plan for concurrent deposition of multiple target regions by determining sets of nozzle-waveform combinations for each target region of the substrate. Once again, the specific volume characteristics of each nozzle (and in this case, each nozzle-waveform combination) are relied upon to achieve specific fill volumes; that is, rather than attempting to correct per-nozzle volume variation, the variation is specifically used in combinations to obtain specific fill volumes. Note that there will typically be a large number of alternate combinations that could be used to deposit droplets in reach a desired range in each target region of the substrate. In a more detailed embodiment, a "common set" of nozzle waveforms can be shared across some (or even all) nozzles of a print head, with per-nozzle droplet volumes stored and available for mixing and matching different droplet volumes to achieve specific fills. As a further option, a calibration phase can be used to select different waveforms in an off-line process, with a set of specific nozzle firing waveforms being selected based on calibration to achieve a set of respective, specifically-desired volume characteristics. Once again, in further detailed embodiments, optimization can be performed to plan printing in a way that improves printing time, for example, by minimizing the number of scans or print head passes, by maximizing concurrent nozzle use, or by optimizing some other criteria.

An optional third embodiment relies on the use of multiple print heads each having nozzles that can be offset relative to one another (or equivalently, a print structure having multiple rows of nozzles that can be offset relative to one another). Using such deliberate offset, per-nozzle volume variations can be intelligently combined across print heads (or rows of nozzles) with each pass or scan. Again, there will typically be a large number of alternate combinations that could be used to deposit droplets to reach a desired range in each target region of the substrate and, in detailed embodiments, optimization is performed to plan the use of offsets in a way that improves printing time, for example, by minimizing the number of scans or print head passes, or by maximizing concurrent nozzle use, and so forth.

Note that one benefit of the techniques described above is that by living with droplet volume variations but combining them to achieve specific, predetermined target region fill volumes, one can achieve a high degree of control over not only the ability to satisfy a desired fill tolerance range, but also over precise volume amounts and deliberately controlled (or injected) variation in such amounts. For example, in one exemplary application of the mentioned techniques, i.e., the fabrication of display devices, the techniques mentioned above facilitate controlled, deliberate variation in fill volumes from pixel-to-pixel that will obscure any display artifacts in a finished display (i.e., to mitigate "line effect" that might otherwise be visible to the human eye in a finished, electrically-operable displays). That is, even a slight discrepancy in displays at low spatial frequency can introduce unintended artifacts which are visible to the human eye and which are therefore undesirable. It is therefore desired in some embodiments to deliberately vary the fill volume of each target region, albeit still within specification. Using an exemplary tolerance of 49.75 pL-50.25 pL, rather than simply arbitrarily ensuring that all target region fills are at a common, precise value within this tolerance range, it can be desired for such applications to deliberately introduce random variation within this range, such that any pattern of variation or difference is not observable to the human eye as a pattern in a finished, operating display. Applied to a color display, one exemplary embodiment deliberately adds such fill volume variation in a manner statistically independent for at least one of (a) an x dimension (e.g., along the direction of a row of target regions), (b) a y dimension (e.g., along the direction of a column of target regions), and/or (c) across one or more color dimensions (e.g., independently for red versus blue, blue versus green, red versus green target regions). In one embodiment, variation is statistically independent across each of these dimensions. Such variation is believed to render any fill volume variations imperceptible to the human eye and thus to contribute to high image quality of such displays.

An example will help introduce some concepts relating to intelligent planning of fill volumes per target region. Per-nozzle volume data (or difference data) for a given nozzle firing waveform can be used to plan for concurrent deposition of multiple target regions by determining possible nozzle-droplet volume sets for each target region. There will typically be a large number of possible combinations of nozzles that can deposit ink droplets in multiple passes to fill each target region to a desired fill volume within a narrow tolerance range that meets specification. Returning briefly to the hypothetical introduced using FIG. 1A, if acceptable fill volumes according to specification were between 49.75 pL and 50.25 pL (i.e., within a range of 0.5% of target), acceptable fill volumes could also be achieved using many different sets of nozzles/passes, including without limitation: (a) five passes of nozzle 2 (10.01 pL) for a total of 50.05 pL; (b) a single pass of nozzle 1 (9.80 pL) and four passes of nozzle 5 (10.03 pL), for a total of 49.92 pL; (c) a single pass of nozzle 3 (9.89 pL) and four passes of nozzle 5 (10.03 pL), for a total of 50.01 pL; (d) a single pass of nozzle 3 (9.89 pL), three passes of nozzle 4 (9.96 pL), and a single pass of nozzle 5 (10.03 pL) for a total of 49.80 pL; and (e) a single pass of nozzle 2 (10.01 pL), two passes of nozzle 4 (9.96 pL) and two passes of nozzle 5 (10.03 pL) for a total of 49.99 pL. Other combinations are clearly also possible. Thus, even if only one choice of nozzle drive waveform was available for each nozzle (or all nozzles), the first embodiment introduced above can be used to offset the print head relative to the substrate in a series of planned offsets or "geometric steps" that apply as many nozzles as possible during each scan to deposit droplets (e.g., in different target regions), but that combine deposited droplets for each target region in a specifically-intended manner. That is, many combinations of nozzle-droplet volumes in this hypothetical could be used to achieve desired fill volumes, and a specific embodiment effectively selects a particular one of the acceptable droplet combinations for each target region (i.e., a particular set for each region) through its selection of scanning motion and/or nozzle drive waveforms, so as to facilitate concurrent fills of different rows and/or columns of target regions using respective nozzles. By choosing the pattern of relative print head/substrate motion in a way that minimizes the time over which printing occurs, this first embodiment provides for substantially-enhanced manufacturing throughput. Note that this enhancement can optionally be embodied in the form of minimizing the number of print head/substrate scans or "passes," in a manner that minimizes the raw distance of relative print head/substrate movement or in a manner that otherwise minimizes overall printing time. That is to say, the print head/substrate movement (e.g., scans) can be pre-planned and used to fill target regions in a manner that meets predefined criteria, such as minimal print head/substrate passes or scans, minimal print head and/or substrate movement in a defined dimension or dimension(s), printing in a minimal amount of time, or other criteria.

Figure 1B:
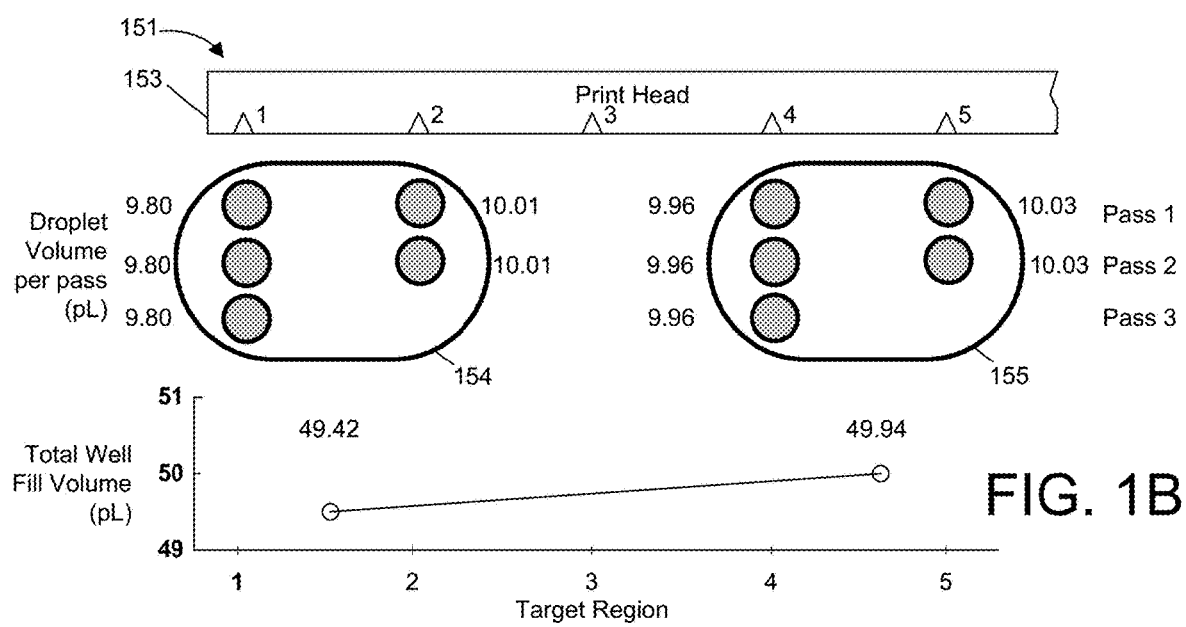
FIG. 1B is another diagram that presents a hypothetical problem of depositing ink in target regions of a substrate where a print head with five nozzles is used to deposit a target fill of 50.00 pL in each of two specific target regions.

The same approaches all apply equally to the hypothetical of FIG. 1B in which the nozzles are not specially aligned to respective target regions. Again, if acceptable fill volumes according to specification were between 49.75 pL and 50.25 pL (i.e., within a range of 0.5% of either side of target), acceptable fill volumes could also be achieved many different sets of nozzles/passes, including without limitation, all of the examples listed above for FIG. 1A as well as additional examples particular to the hypothetical of FIG. 1B in which two adjacent nozzles are used in a single pass to fill a particular target region, for example, two passes of nozzle (4) (9.96 pL) and of nozzle (5) (10.03 pL), and one pass of nozzle (2) (10.01 pL) for a total of 49.99 pL. Other combinations are clearly also possible.

These same principles also apply to the second embodiment introduced above. For example, in the hypothetical presented by FIG. 1A, each of the nozzles can be driven by five different firing waveforms, identified as firing waveforms A through E, such that the resulting volume characteristics of the different nozzles for the different firing waveforms are described by Table 1A, below. Considering only target region 104 and only nozzle (1), it would be possible to deposit the 50.00 pL target in five passes, for example, with a first print head pass using predefined firing waveform D (to generate from nozzle (1) a 9.96 pL droplet), and with four subsequent passes using predefined firing waveform E (to generate from nozzle (1) a 10.01 pL droplet), all without any offset in scan path. Similarly, different combinations of firing waveforms can be used concurrently in each pass for each nozzle to generate volumes in each of the target regions that is close to the target values without any offset in scan path. Therefore, using multiple passes in this manner would be advantageous for embodiments where it is desired to concurrently deposit droplets in different target regions (i.e., in different rows of pixels for example).

TABLE 1A

| Waveform | Nozzle | | | | |
| --- | --- | --- | --- | --- | --- |
| | (1) | (2) | (3) | (4) | (5) |
| A | 9.80 | 10.01 | 9.89 | 9.96 | 10.03 |
| B | 9.70 | 9.90 | 9.81 | 9.82 | 9.94 |
| C | 9.89 | 10.10 | 9.99 | 10.06 | 10.13 |
| D | 9.96 | 10.18 | 10.07 | 10.15 | 10.25 |
| E | 10.01 | 10.23 | 10.12 | 10.21 | 10.31 |

These same approaches all apply equally to the hypothetical of FIG. 1B. For example, considering only target region 104 and nozzles (1) and (2) (i.e. the two nozzles that overlap target region 154 during a scan), it is possible to achieve 50.00 pL in three passes, for example, with a first print head pass using nozzle (1) and predefined waveform B (for a droplet volume of 9.70 pL) and nozzle (2) and predefined waveform C (for a droplet volume of 10.10), a second print head pass using nozzle (1) and predefined waveform E (for a droplet volume of 10.01 pL) and nozzle (2) and predefined waveform D (for a droplet volume of 10.18 pL), and a third print head pass using nozzle (1) and predefined waveform E (for a droplet volume of 10.01 pL.)

Note that it would also likely be possible for both the hypothetical of FIG. 1A and the hypothetical of FIG. 1B to deposit each fill each target volume in a single row of target regions in this example in a single pass; for example, it would be possible to rotate the print head by ninety degrees and deposit exactly 50.00 pL with a single droplet from each nozzle for each target region in a row, for example, using waveform (E) for nozzle (1), waveform (A) for nozzles (2), (4) and (5) and waveform (C) for nozzle (3) (10.01 pL+10.01 pL+9.99 pL+9.96 pL+10.03 pL=50.00 pL).

These same principles also apply to the third embodiment introduced above. For example, for the hypothetical presented by FIG. 1A, the volume characteristics can reflect the nozzles for a first print head (e.g., "print head A"), with this first print head being integrated together with four additional print heads (e.g., print heads "B" through "E"), each being driven by a single firing waveform and having respective per-nozzle droplet volume characteristics. The print heads are collectively organized such that in executing a scan pass each of the nozzles identified as nozzle (1) for a print head is aligned to print into a target region (e.g., target region 104 from FIG. 1A), each of the nozzles identified as nozzle (2) from the various print heads are aligned to print into a second target region (e.g., target region 105 from FIG. 1A), and so on, with the volume characteristics of the different nozzles for the different print heads are described by Table 1B, below. Optionally, the respective print heads can be offset from one another using a motor that adjusts spacing, e.g., in between scans. Considering only target region 104 and the nozzle (1) on each print head, it would be possible to deposit the 50.00 pL in a four passes, for example, with a first print head pass in which print head D and print head E both fire a droplet into the target region, and three subsequent passes in which only print head E fires a droplet into the target region. Other combinations are possible using even fewer passes that can still generate volumes in the target region close to the 50.00 pL target, for example, within a range of 49.75 pL and 50.25 pL. Considering again only target region 104 and the nozzle (1) on each print head, it would be possible to deposit 49.83 pL in two passes, for example, with a first print head pass in which print heads C, D, and E all fire a droplet into the target region, and a second print head pass in which print heads D and E both fire a droplet into the target region. Similarly, different combinations of nozzles from different print heads can be used concurrently in each pass to generate volumes in each of the target regions that is close to the target values without any offset in scan path. Therefore, using multiple passes in this manner would be advantageous for embodiments where it is desired to concurrently deposit droplets in different target regions (i.e., in different rows of pixels for example).

TABLE 1B

| Print head | Nozzle | | | | |
| --- | --- | --- | --- | --- | --- |
| | (1) | (2) | (3) | (4) | (5) |
| A | 9.80 | 10.01 | 9.89 | 9.96 | 10.03 |
| B | 9.70 | 9.90 | 9.81 | 9.82 | 9.94 |
| C | 9.89 | 10.10 | 9.99 | 10.06 | 10.13 |
| D | 9.96 | 10.18 | 10.07 | 10.15 | 10.25 |
| E | 10.01 | 10.23 | 10.12 | 10.21 | 10.31 |

All of the same approaches apply equally to the hypothetical of FIG. 1B. Again considering only target region 154 and the nozzles (1) and (2) on each print head (i.e. the nozzles that overlap with target region 154 during a scan), it is possible to deposit 50.00 pL in two passes, for example, with a first print head pass in which print heads C and E fire nozzle (1) and print heads B and C fire nozzle (2), and a second print head pass in which print head C fires nozzle (2). It is also possible to deposit 49.99 pL (clearly within an example target range of 49.75 pL and 50.25 pL) in a single pass, for example, with a print head pass in which print heads C, D, and E fire nozzle (1) and print heads B and E fire nozzle (2).

It should also be apparent that, optionally combined with scan path offsets, the use of alternate nozzle firing waveforms dramatically increases the number of droplet volume combinations that can be achieved for a given print head, and these options are yet further increased by the use of multiple printheads (or equivalently, multiple rows of nozzles) as described above. For example, in the hypothetical example conveyed by the discussion of FIG. 1 above, a combination of five nozzles with respective inherent ejection characteristics (e.g., droplet volumes) and eight alternate waveforms could provide literally many thousands of different sets of possible droplet volume combinations. Optimizing sets of nozzle-waveform combinations, and selecting a particular set of nozzle-waveform combinations for each target region (or for each row of print wells in an array) enables further optimization of printing according to the desired criteria. In embodiments that use multiple print heads (or rows of print head nozzles), the ability to selectively offset those print heads/rows also further enhances the number of combinations that can be applied per print head/substrate scan. Once again, for these embodiments, given that multiple sets (of one or more) nozzle-waveform combinations can alternatively be used to achieve specified fill volumes, this second embodiment selects a particular one of the "acceptable" sets for each target region, with this selection of the particular one across target regions generally corresponding to the concurrent printing of multiple target regions using multiple nozzles. That is, by varying parameters to minimize the time over which printing occurs, these embodiments each enhance manufacturing throughput, and facilitate minimizing the number of required print head/substrate scans or "passes," the raw distance of relative print head/substrate movement along a particular dimension(s), overall printing time, or that help satisfy some other predetermined criteria.

Note that these techniques are optional relative to one another; that is, for example, it is possible to use multiple nozzle-firing waveforms to achieve desired droplet combinations without varying positional step of print head/substrate scans and without offsetting multiple print heads/nozzle rows, and it is possible to use print head/nozzle row offsets without varying positional steps or varying nozzle firing waveforms.

These various techniques can also optionally be combined in any desired manner with each other or with other techniques. For example, it is possible to "tune" the nozzle drive waveform on a per-nozzle basis to reduce variation in per-nozzle droplet volumes (e.g., shaping of the drive pulse, by changing drive voltage, rise or fall slopes, pulse width, decay time, number and respective levels of pulses used per droplet, and so forth).

While certain applications discussed in this document refer to fill volumes in discrete fluid receptacles or "wells," it is also possible to use the mentioned techniques to deposit a "blanket coating" having large geographies relative to other structures of the substrate (e.g., such as relative to transistors, pathways, diodes and other electronic components). In such a context, fluidic ink carrying layer materials (e.g., that will be cured, dried or hardened in situ to form a permanent device layer) will spread to a certain extent, but will (given ink viscosity and other factors) still retain specific characteristics relative to other target deposition regions of the substrate. It is possible to use the techniques herein in this context, for example, to deposit blanket layers such as encapsulation or other layers with specific, localized control over ink fill volumes for each target region. The techniques discussed herein are not limited by the specifically-presented applications or embodiments.

Other variations, advantages and applications from the techniques introduced above will be readily apparent to those skilled in the art. This is to say, these techniques can be applied to many different areas and are not limited to the fabrication of display devices or pixelated devices. A print "well" as used herein refers to any receptacle of a substrate that is to receive deposited ink, and thus has chemical or structural characteristics adapted to constrain the flow of that ink. As will be exemplified for OLED printing below, this can include situations were respective fluid receptacles are to each receive a respective volume of ink and/or a respective type of ink; for example, in a display application where the mentioned techniques are used to deposit light emitting materials of different colors, successive printing processes can be performed for each color, using respective print heads and respective inks—in this case, each process could deposit "every third well" in an array (e.g., for every "blue" color component), or equivalently, every well in a third array (which intersperses wells with overlapping arrays for other color components). Other variations are also possible. Note also that "rows" and "columns" are used in this disclosure without implying any absolute direction. For example, a "row" of print wells could extend the length of or width of a substrate, or in another manner (linear or non-linear); generally speaking, "rows" and "columns" will be used herein to refer to directions that each represent at least one independent dimension, but this need not be the case for all embodiments. Also, note that because modern printers can use relative substrate/print head motion that involves multiple dimensions, relative movement does not have to be linear in path or speed, which is to say, print head/substrate relative motion does not have to follow a straight or even a continuous path or constant velocity. Thus, a "pass" or "scan" of a print head relative to a substrate simply refers to an iteration of depositing droplets using multiple nozzles over multiple target regions that involves relative print head/substrate motion. In many embodiments described below for a OLED printing process, however, each pass or scan can be a substantially continuous, linear motion, with each ensuing pass or scan being parallel to the next, offset by a geometric step relative to one another. This offset, or geometric step can be a difference in pass or scan starting position, average position, finishing position, or some other type of positional offset, and does not imply necessarily parallel scan paths. It is also noted that various embodiments discussed herein speak of "concurrent" use of different nozzles to deposit in different target regions (e.g., different rows of target regions); this term "concurrent" does not require simultaneous droplet ejection, but rather, merely refers to the notion that during any scan or pass, different nozzles or groups of nozzles can be used to fire ink into respective target regions on a mutually-exclusive basis. For example, a first group of one or more nozzles can be fired during a given scan to deposit first droplets in a first row of fluid wells, while a second group of one or more nozzles can be fired during this same given scan to deposit second droplets into a second row of fluid wells.

With principal parts of several different embodiments thus laid out, this disclosure will be roughly organized as follows.

Figure 10:
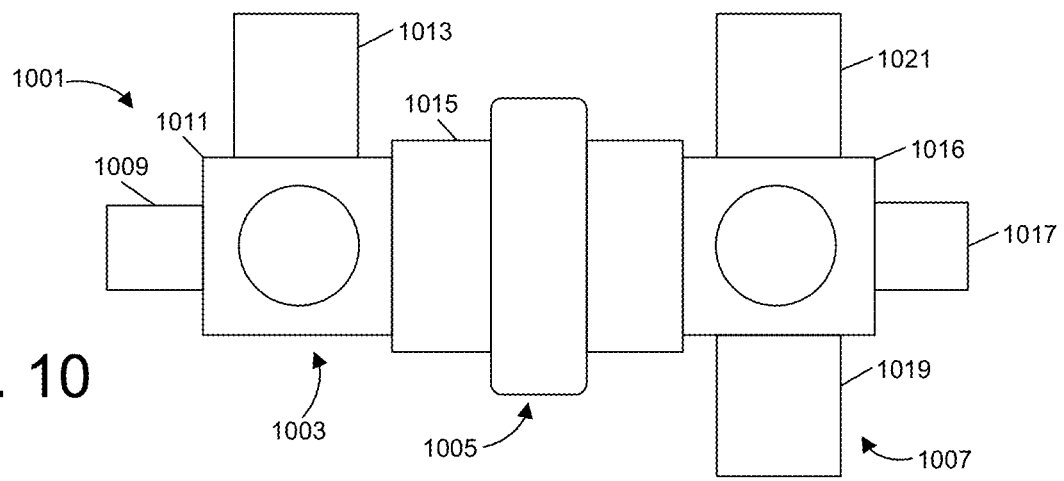
FIG. 10 shows a plan view of a printer used as part of a fabrication apparatus; the printer can be within a gas enclosure that permits printing to occur in a controlled atmosphere.
Figure 11:
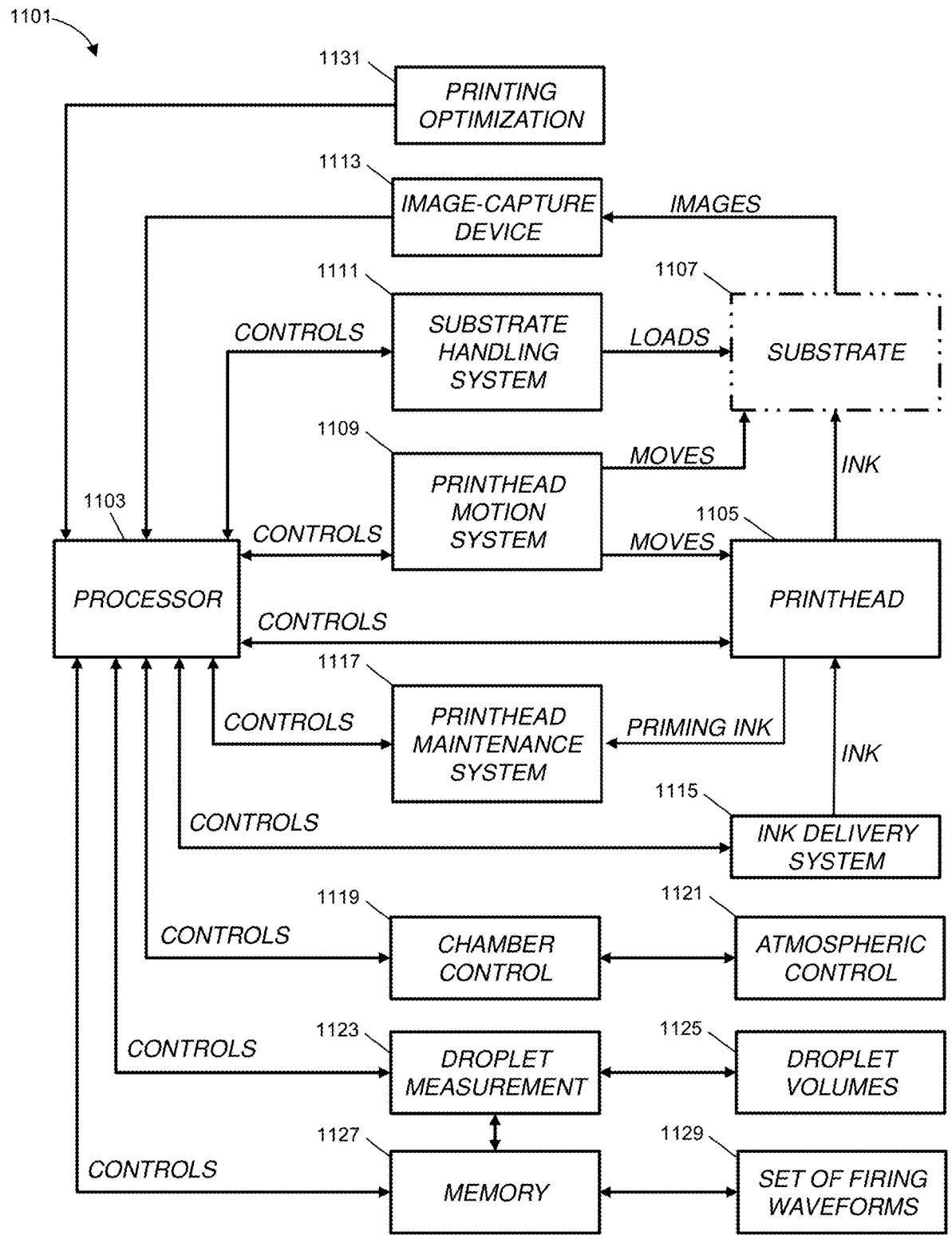
FIG. 11 provides a block diagram of a printer; such a printer can be optionally employed for example in the fabrication apparatus depicted in FIG. 10.
Figure 12A:
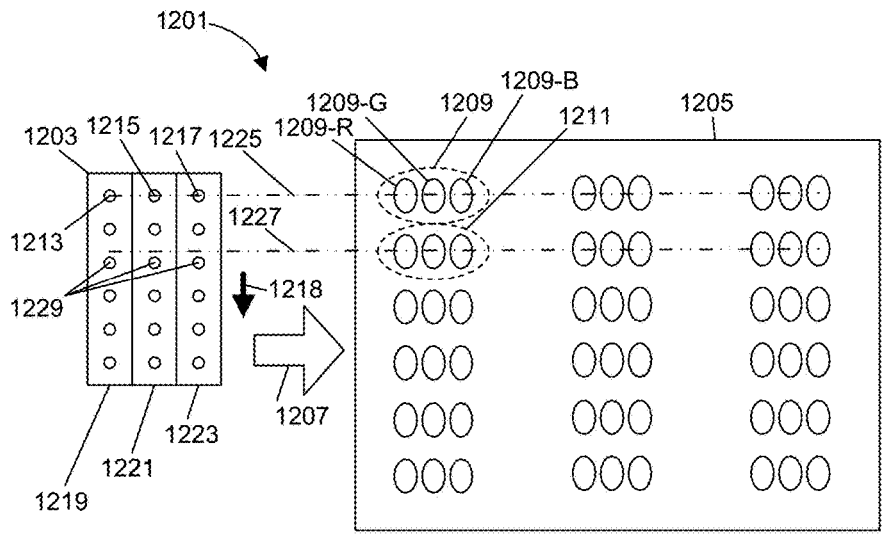
FIG. 12A shows an embodiment where multiple print heads (each with nozzles) are used to deposit ink on a substrate.
Figure 12B:
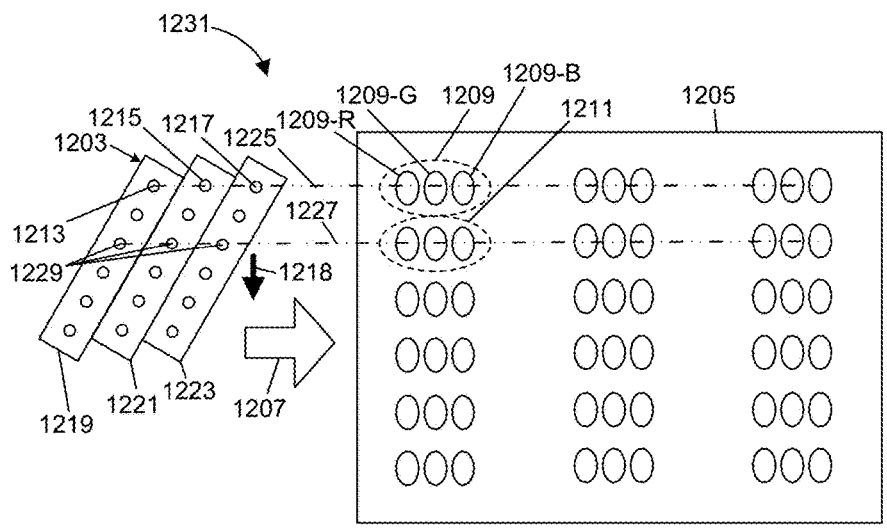
FIG. 12B shows rotation of the multiple print heads to better align nozzles of the respective print heads with the substrate.

FIGS. 2A-3C will be used to introduce some general principles relating to the nozzle consistency issue, OLED printing/fabrication, and how embodiments address the nozzle consistency issue. These FIGS. will also be used to introduce concepts relating to planning print head/substrate motion, for example, where offset variation is used to change which print head nozzles are used to deposit droplets in each row of an array of target regions of a substrate. FIGS. 4-7 will be used to exemplify software processes that can be used to plan droplet combinations for each target region of the substrate. FIGS. 8A-9C are used to present some empirical data, that is, which demonstrates effectiveness of the mentioned techniques in improving well fill consistency. FIGS. 10-11 will be used to discuss an exemplary application to OLED panel fabrication, and associated printing and control mechanisms. FIGS. 12A-12C are used to discuss print head offsets that can be used to vary droplet combinations that can be deposited with each scan. Finally, FIGS. 13A-14C are used to further discuss different, alternate nozzle firing waveforms, applied to provide for different droplet volumes.

Figure 2A:
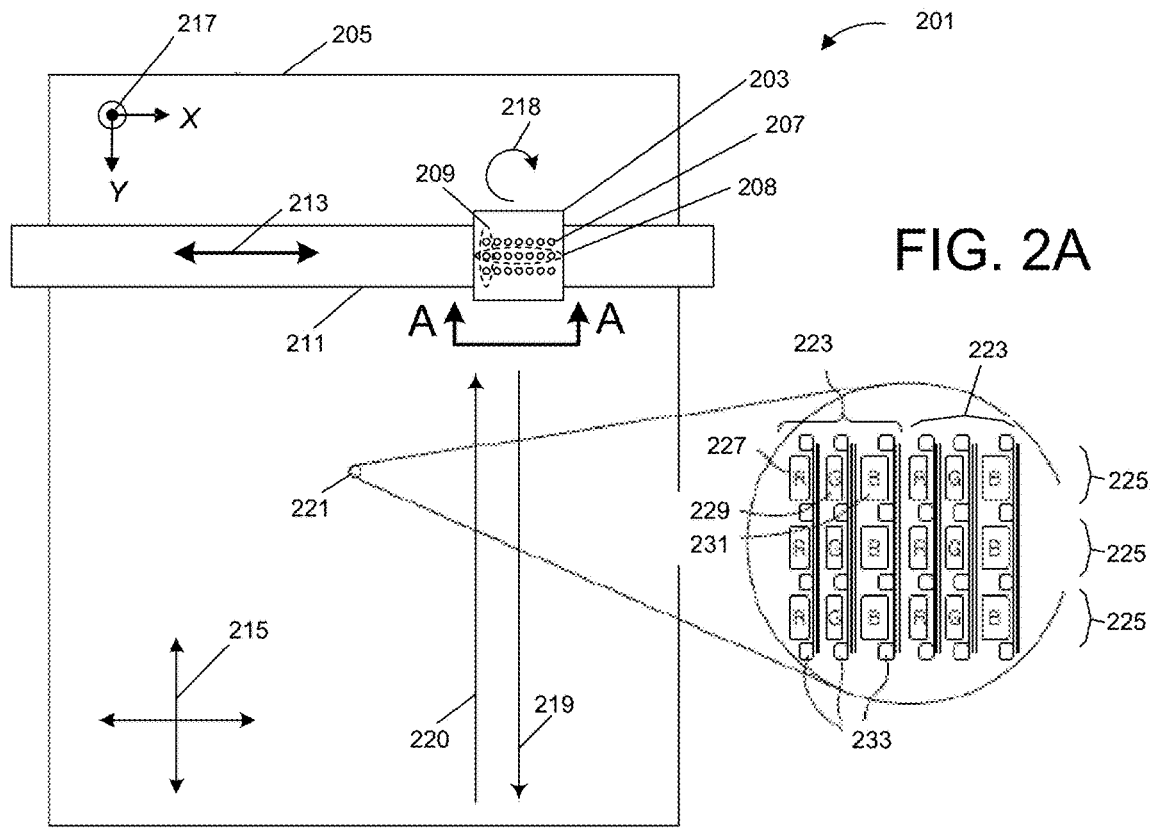
FIG. 2A is an illustrative diagram showing a hypothetical arrangement of a printer and substrate, in an application where the substrate is ultimately to form a display panel having pixels.

As represented by FIG. 2A, in one application, a printing process can be used to deposit one or more layers of material onto a substrate. The techniques discussed above can be used to generate printer control instructions (e.g., an electronic control file that can be transferred to a printer) for subsequent use in fabricating a device. In one specific application, these instructions can be geared for an inkjet printing process useful in printing a layer of a low-cost, scalable organic light-emitting diode ("OLED") display. More specifically, the mentioned techniques can be applied to deposit one or more light-emitting or other layers of such an OLED device, for example, "red" "green" and "blue" (or other) pixelated color components or other light-emitting layers or components of such a device. This exemplary application is non-limiting, and the mentioned techniques can be applied to fabrication of many other types of layers and/or devices, whether or not those layers are light-emitting and whether or not the devices are display devices. In this exemplary application, various conventional design constraints of inkjet print heads provide challenges to the process efficiency and film coating uniformity of various layers of an OLED stack that can be printed using various inkjet printing systems. Those challenges can be addressed through the teachings herein.

More specifically, FIG. 2A is a plan view of one embodiment of a printer 201. The printer includes a print head 203 that is used to deposit fluidic ink onto a substrate 205. Unlike printer applications that print text and graphics, the printer 201 in this example is used in a manufacturing process to deposit fluidic ink that will have a desired thickness. That is, in a typical manufacturing application, the ink carries a material that will be used to form a permanent layer of a finished device, where that layer has a specifically-desired thickness dependent on the volume of applied ink. The ink typically features one or more materials that will form part of the finished layer, formed as monomer, polymer, or a material carried by a solvent or other transport medium. In one embodiment, these materials are organic. Following deposition of the ink, the ink is dried, cured or hardened to form the permanent layer; for example, some applications use an ultraviolet (UV) cure process to convert a monomer or polymer into a hardened material, while other processes dry the ink to remove the solvent and leave the transported materials in a permanent location. Other processes are also possible. Note that there are many other variations that differentiate the depicted printing process from conventional graphics and text applications; for example, in some embodiments, deposition of the desired materials layers is performed in an environment controlled to either regulate the ambient atmosphere to be something other than air, or otherwise to exclude unwanted particulates. For example, as will be described further below, one contemplated application uses a fabrication mechanism that encloses the printer 201 within a gas chamber, such that printing can be performed in the presence of a controlled atmosphere such as an inert environment including, for example, but not limited by, nitrogen, any of the noble gases, and any combination thereof.

As further seen in FIG. 2A, the print head 203 includes a number of nozzles, such as nozzle 207. Note that in FIG. 2A, for ease of illustration, the print head 203 and nozzles are depicted as opening out of the top of the page, but in fact, these nozzles and print head face downward toward the substrate and are hidden from view from the perspective of FIG. 2A (i.e., FIG. 2A shows what in effect is a cut-away view of the print head 203). The nozzles are seen to be arranged in rows and columns (such as exemplary row 208 and column 209), although this is not required for all embodiments, i.e., some implementations use only a single row of nozzles (such as row 208). In addition, it is possible for rows of nozzles to be disposed on respective print heads, with each print head being (optionally) individually offsettable relative to one another, as introduced above. In an application where the printer is used to fabricate part of a display device, for example, materials for each of respective red, green and blue color components of a display device, the printer will typically use dedicated print head components for each different ink or material, and the techniques discussed herein can be separately applied to each corresponding print head.

FIG. 2A illustrates one print head 203. The printer 201 includes in this example two different motion mechanisms that can be used to position the print head 203 relative to the substrate 205. First, a traveler or carriage 211 can be used to mount the print head 203 and to permit relative motion as denoted by arrows 213. Second, however, a substrate transport mechanism can be used to move the substrate relative to the traveler, along one or more dimensions. For example, as denoted by arrows 215, the substrate transport mechanism can permit movement in each of two orthogonal directions, such as in accordance with x and y Cartesian dimensions (217), and can optionally support substrate rotation. In one embodiment, the substrate transport mechanism comprises a gas floatation table used to selectively secure and permit movement of the substrate on a gas bearing. Note further that the printer optionally permits rotation of the print head 203 relative to the traveler 211, as denoted by rotation graphic 218. Such rotation permits the apparent spacing and relative configuration of the nozzles 207 to be changed relative to the substrate; for example, where each target region of the substrate is defined to be a specific area, or to have a spacing relative to another target region, rotation of the print head and/or the substrate can change the relative separation of the nozzles in a direction along or perpendicular to a scan direction. In an embodiment, the height of the print head 203 relative to the substrate 205 can also be changed, for example, along a z Cartesian dimension that is into and out of the direction of view of FIG. 2A.

Two scan paths are respectively illustrated by directional arrows 219 and 220 in FIG. 2A. Briefly, the substrate motion mechanism moves the substrate back and forth in the direction of arrows 219 and 220 as the print head moves in geometric steps or offsets in the direction of arrows 213. Using these combinations of movements, the nozzles of the print head can reach any desired region of the substrate to deposit ink. As referenced earlier, the ink is deposited on a controlled basis into discrete target regions of the substrate. These target regions can be arrayed, that is, arranged in rows and columns such as optionally along the depicted y and x dimensions, respectively. Note that the rows of nozzles (such as row 208) are seen in this FIG. perpendicular to the rows and columns of target regions, i.e., such that a row of nozzles sweeps with each scan along the direction of rows of target regions, traversing each of the columns of target regions of the substrate (for example, along direction 219). This need not be the case for all embodiments. For efficiency of motion, the subsequent scan or pass then reverses this direction of motion, hitting the columns of target regions in reverse order, that is, along direction 220.

Arrangement of the target regions in this example is depicted by a highlighted region 221, which is seen in expanded view to the right side of the FIG. That is, two rows of pixels, each pixel having red, green and blue color components, are each represented by numeral 223, whereas columns of pixels orthogonal to the scan direction (219/220) are each represented by numeral 225. In the upper left-most pixel, the red, green and blue color components are seen to occupy distinct target regions 227, 229 and 231 as part of respective, overlapping arrays of regions. Each color component in each pixel can also have associated electronics, for example as represented by numeral 233. Where the device to be fabricated is a backlit display (for example, as part of a conventional-type LCD television), these electronics can control selective generation of light that is filtered by the red, green and blue regions. Where the device to be fabricated is a newer type display, that is where red, green and blue regions directly generate their own light having corresponding color characteristics, these electronics 233 can include patterned electrodes and other material layers that contribute to the desired light generation and light characteristics.

Figure 2B:
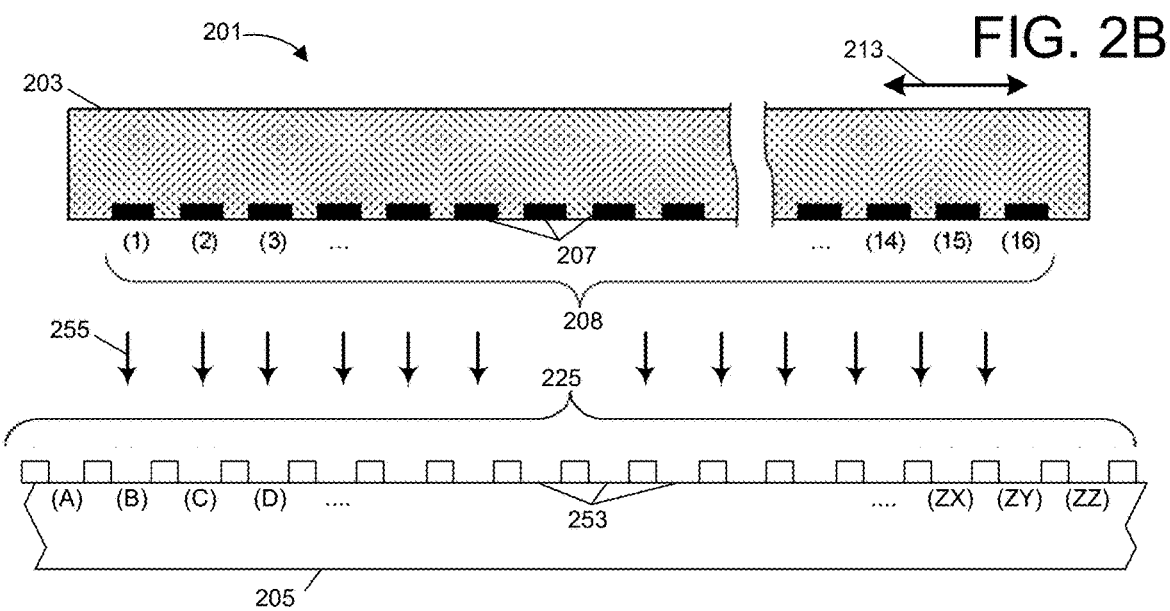
FIG. 2B is a cross-sectional close-up view of the print head and substrate of FIG. 2A, taken from the perspective of lines A-A from FIG. 2A.

FIG. 2B provides a close-up, cross-sectional view of the print head 203 and substrate 205, taken from the perspective of lines A-A in FIG. 2A. In FIG. 2B, numerals already introduced in reference to FIG. 2A represent the same features. More specifically, numeral 201 generally denotes the printer, while numeral 208 represents a row of print nozzles 207. Each nozzle is designated using a parenthetical number, e.g., (1), (2), (3), etc. A typical print head typically has plural such nozzles, for example, 64, 128 or another number; in one embodiment, there can be over 1,000 nozzles, arranged in one or more rows. As noted earlier, the print head in this embodiment is moved relative to the substrate to effectuate geometric steps or offsets between scans, in the direction referenced by arrows 213. Depending on the substrate motion mechanism, the substrate can be moved orthogonal to this direction (e.g., into and out of the page, relative to the view of FIG. 2B) and in some embodiments, also in the direction represented by arrows 213. Note that FIG. 2B also shows a column 225 of respective target regions 253 of the substrate, in this case, arranged as "wells" that will receive deposited ink and retain the deposited ink within structural confines of the respective well. It will be assumed for purposes of FIG. 2B that only one ink is represented (e.g., each depicted well 253 represents only one color of a display, such as the red color component, with other color components and associated wells not being shown). Note that the drawing is not true to scale, e.g., the nozzles are seen to be numbered from (1) to (16) while the wells are seen to be lettered from (A) to (ZZ), representing 702 wells. In some embodiments, the nozzles will align to respective wells, such that the depicted print head with 16 nozzles would deposit ink in the direction of arrows 255 in as many as 16 wells at the same time using scans of relative print head/substrate motion that are into and out of the page from the perspective of FIG. 2B. In other embodiments, as mentioned (e.g., with reference to FIG. 1B), nozzle density will be much greater than target region density, and with any scan or pass, a subset of nozzles (e.g., a group of one to many, dependent on which nozzles traverse each target region) will be used for deposition. For example, again using an illustrative example of sixteen nozzles, it could be that nozzles (1)-(3) can be used to deposit ink in a first target region and nozzles (7-10) can be concurrently used to deposit ink in a second target region, on a mutually-exclusive basis for the given pass.

Conventionally, a printer might be operated to use sixteen nozzles to concurrently deposit ink in as many as sixteen rows of wells, moving back and forth with ensuing scans as necessary, until e.g. five droplets were deposited in each well, with the print head being advanced as necessary using a fixed step that is an integer multiple of a width of the swath traversed by the scan. The techniques provided by this disclosure, however, make use of the inherent variation in droplet volumes produced by different nozzles, in combinations calculated to produce a specific fill volume for each well. Different embodiments rely on different techniques to achieve these combinations. In one embodiment, the geometric step is varied to achieve the different combinations, and is free to be something other than an integer multiple of the width described by the print head swath. For example, if appropriate to depositing selected sets of droplet combinations in the respective wells 253 of FIG. 2A, the geometric step could be $1/160^{th}$ of the swath of the print head, in effect, representing a relative displacement between print head and substrate of a spacing of one tenth of a one row of wells in this example. The next offset or geometric step could be different, as appropriate to the particular combination of droplets desired in each well, for example, a hypothetical offset of $5/16^{ths}$ of the print head swath, corresponding to an integer spacing of wells; this variation could continue with both positive and negative steps as necessary to deposit ink to obtain the desired fill volumes. Note that many different types or sizes of offsets are possible and that step size need not be fixed from scan-to-scan or be a specific fraction of well spacing. In many manufacturing applications, however, it is desired to minimize printing time, in order to maximize rate of production and minimize per-unit manufacturing costs as much as possible; to this end, in specific embodiments, print head motion is planned and sequenced in a manner to minimize the total number of scans, the total number of geometric steps, the size of offsets or geometric steps, and the cumulative distance traversed by the geometric steps. These or other measures can be used individually, together, or in any desired combination to minimize total printing time. In embodiments where independently offsettable rows of nozzles are used (e.g., multiple print heads), the geometric step can be expressed in part by the offset between print heads or nozzle rows; such offset, combined with overall offset of the print head component (e.g., a fixed step for a print head assembly) can be used to effectuate variable-size geometric steps and thus deposit droplet combinations into each well. In embodiments where variation in nozzle drive waveform is used alone, conventional, fixed steps can be used, with droplet volume variation effectuated using multiple print heads and/or multiple print head passes. As will be noted below, in one embodiment, nozzle drive waveforms can be programmed for each nozzle in between droplets, thus permitting each nozzle to produce and contribute respective droplet volumes per well within a row of wells.

Figure 3A:
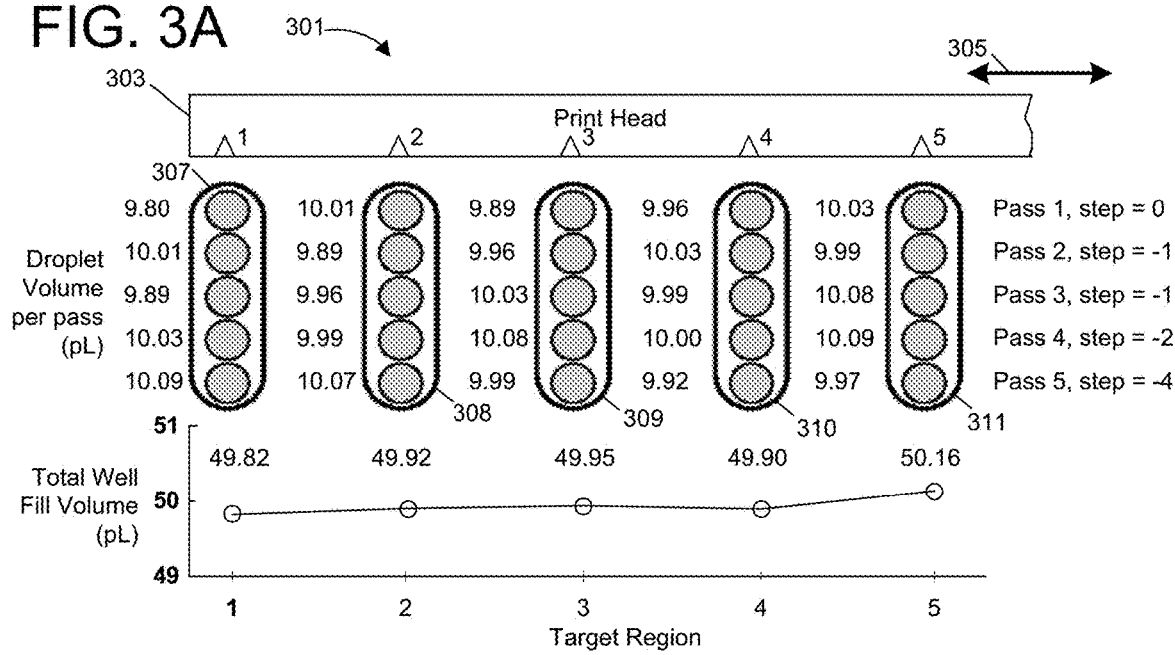
FIG. 3A is a diagram similar to FIG. 1A, but illustrates the use of combinations of droplet volumes to reliably produce ink fill volumes for each target region within a predetermined tolerance range; in one optional embodiment, different droplet volume combinations are produced from a set of predetermined nozzle firing waveforms, and in another optional embodiment, different droplet volume combinations are produced from respective nozzles of the print head using relative motion (305) between print head and substrate.
Figure 3C:
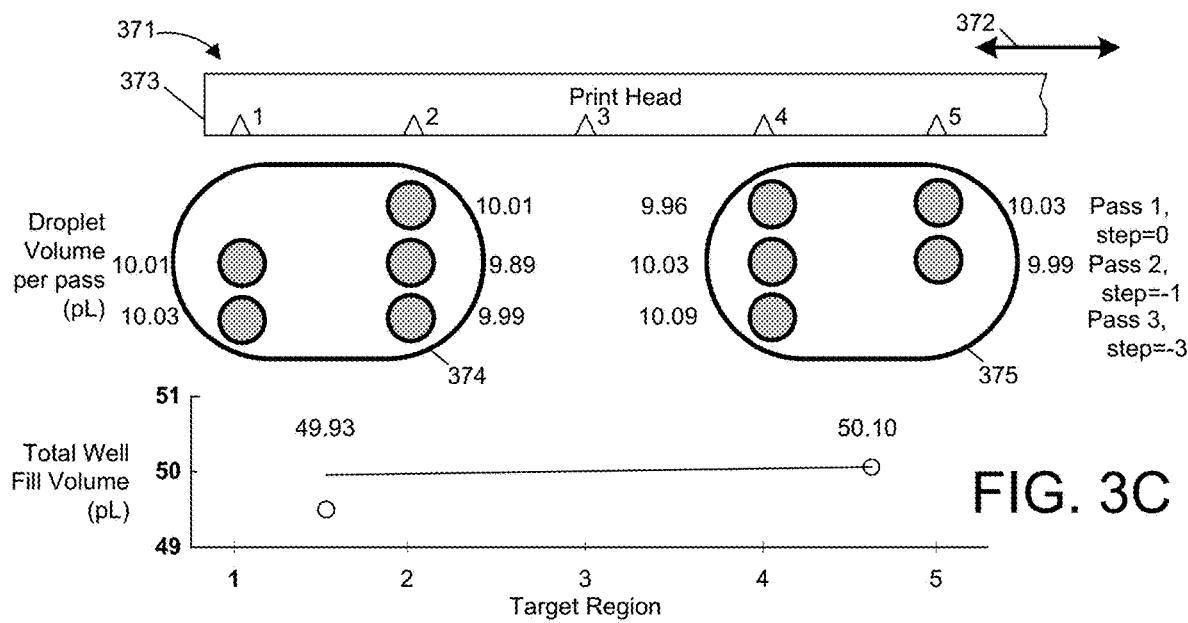
FIG. 3C is a diagram similar to FIG. 1B, but illustrates the use of combinations of droplet volumes to reliably produce ink fill volumes for each target region within a predetermined tolerance range; in one optional embodiment, different droplet volume combinations are produced from a set of predetermined nozzle firing waveforms, and in another optional embodiment, different droplet volume combinations are produced from respective nozzles of the print head using relative motion (372) between print head and substrate.

FIGS. 3A, 3B, and 3C are used to provide additional detail regarding reliance on specific droplet volumes in achieving desired fill volumes.

FIG. 3A presents an illustrative view 301 of a print head 303 and two related diagrams seen below the print head 303. The print head is optionally used in an embodiment that provides non-fixed geometric steps of print head relative to substrate, and so numeral 305 is used to denote offsets that align specific print head nozzles (e.g., 16 total nozzles with nozzles (1)-(5) depicted in the FIG.) with different target regions (five in this example, 307, 308, 309, 310 and 311). Harkening back to the example of FIG. 1A, if nozzles (1)-(16) respectively produce droplet volumes of 9.80, 10.01, 9.89, 9.96, 10.03, 9.99, 10.08, 10.00, 10.09, 10.07, 9.99, 9.92, 9.97, 9.81, 10.04 and 9.95 pL of fluidic ink, and if it is desired to deposit 50.00 pL per target region, ±0.5 percent of this value, the print head could be used to deposit droplets in five passes or scans, respectively using geometric steps of 0, −1, −1, −2 and −4, resulting in total fill values per region of 49.82, 49.92, 49.95, 49.90 and 50.16 pL, as depicted in the FIG.; this is clearly within the desired tolerance range of 49.75-50.25 pL for each of the depicted target regions. Every step in this example is expressed on an incremental basis relative to previous position, although it is possible to use other measures as well. Thus, as seen, the combining of droplets in a deliberate manner that depends on respective droplet volumes and the desired fill for each target region can be used to achieve precise, regulated fills, with a high degree of reliability.

Note that this same FIG. can be used to represent nozzle drive waveform variation and/or the use of multiple print heads. For example, if the nozzle references (1)-(16) refer to droplet volumes for a single nozzle produced by sixteen different drive waveforms (i.e., using waveforms 1-16), the per-region fill volumes can in theory be obtained simply by using different drive waveforms, for example, waveform nos. 1, 2, 3, 5 and 9 for target region 307. In practice, since process variations can result in different per-nozzle characteristics, the system would measure droplet volumes for each nozzle for each waveform, and would intelligently plan droplet combinations on this basis. In an embodiment where the nozzle references (1)-(15) refer to multiple print heads (e.g., references (1)-(5) referring to a first print head, references (6)-(10) referring to a second print head and references (11)-(15) referring to a third print head), offsets between print heads can be used to reduce the number of passes or scans; for example, the right-most target region 311 could have three droplets deposited in one pass, including droplet volumes of 10.03, 10.09 and 9.97 pL (print head (1), 0 offset; print head (2), +1 offset; and print head (3), +2 offset). It should be apparent that the combination of these various techniques facilitates many possible combinations of specific volume droplets to achieve specific fill volumes within a tolerance range. Note in FIG. 3A that the variance in the aggregate ink fill volumes amongst target regions is small and within tolerance, i.e., within a range of 49.82 pL to 50.16 pL.

FIG. 3B shows another illustrative view 351, with each scan represented by a different rectangle or bar, such as referenced by numerals 353-360. In connection with this FIG., it should be assumed print head/substrate relative motion is advanced in a sequence of variable-size geometric steps. Note again that, typically, each step will designate a scan that sweeps multiple columns of target regions (e.g., pixels) beyond a single column of five regions represented on the plane of the drawing page (and represented by numerals 362-366). Scans are shown in order from top-to-bottom, including a first scan 353 where the print head is seen displaced to the right relative to the substrate, such that only nozzles (1) and (2) are aligned with target regions 365 and 366, respectively. Within each print scan depiction (such as box 353), circles represent each nozzle either with a solid black fill, to denote that the nozzle is to be fired when that nozzle is over the specifically-depicted target region during the scan, or "hollow," that is, with a white fill, to denote that the nozzle is not to be fired at the pertinent time (but may be for other target regions encountered on the scan). Note that, in this embodiment, each nozzle is fired on a binary basis, i.e., each nozzle is either fired or not according to any adjustable parameters, e.g., to deposit for each target region encountered during the scan a predetermined droplet volume. This "binary" firing scheme can optionally be employed for any of the embodiments described herein (that is, e.g., in embodiments where multiple firing waveforms are used, with waveform parameters being adjusted in between droplets). In the first pass 353, it is seen that nozzle (1) is fired to deposit a 9.80 pL droplet into the second-to-right-most target region while nozzle (2) is fired to deposit a 10.01 pL droplet into right-most target region 366. The scan continues to sweep other columns of target regions (e.g., other rows of pixel wells), depositing ink droplets as appropriate. After the first pass 353 is completed, the print head is advanced by a geometric step of −3, which moves the print head left relative to the substrate, such that nozzle (1) will now traverse target region 362 during a second scan 354 in a direction opposite to the first scan. During this second scan 354, nozzles (2), (3), (4) and (5) will also respectively traverse regions 363, 364, 365 and 366. It is seen by the black-filled circles that, at the appropriate time, nozzles (1), (2), (3) and (5) will be fired to respectively deposit droplet volumes of 9.80 pL, 10.01 pL, 9.89 pL and 10.03 pL, corresponding to inherent characteristics of nozzles (1), (2), (3) and (5). Note also that in any one pass, the nozzles in a row of nozzles used to deposit ink will do so on a mutually-exclusive basis into respective target regions, e.g., for pass 354, nozzle (1) is used to deposit ink into target region 362 (but none of target regions 363-366), nozzle (2) is used to deposit ink in target region 363 (but none of regions 362 or 364-366), nozzle (3) is used to deposit ink in target region 364 (but none of regions 362-363 or 365-366) and nozzle (5) is used to deposit ink in target region 366 (but none of regions 362-365). A third scan, denoted using numeral 355, advances the print head effectively by one row of target regions (−1 geometric step), such that nozzles (2), (3), (4), (5) and (6) will traverse regions 362, 363, 364, 365 and 366, respectively during the scan; solid-fill nozzle graphics denote that during this pass, each of nozzles (2)-(6) will be actuated to fire droplets, respectively producing volumes of 10.01, 9.89, 9.96, 10.03 and 9.99 pL.

If the print process was stopped at this point in time, region 366 would for example have a fill of 30.03 pL (10.01 pL+10.03 pL+9.96 pL) corresponding to three droplets, whereas region 362 would have a fill of 19.81 pL (9.80 pL+10.01 pL), corresponding to two droplets. Note that the scan pattern in one embodiment follows the back and forth pattern represented by arrows 219 and 220 of FIG. 2A. Ensuing passes 356, 357, 358, 359, 360 and 361 of these target regions (or scans of multiple columns of multiple such regions) respectively deposit: (a) 10.01 pL, 0.00 pL, 0.00 pL, 10.08 pL and 10.09 pL droplets in region 362, corresponding to passes by nozzles (2), (3), (4), (7) and (9) in successive scans; (b) 0.00 pL, 0.00 pL, 10.03 pL, 10.00 pL and 10.07 pL droplets in region 363, corresponding to respective passes by nozzles (3), (4), (5), (8) and (10) in successive scans; (c) 9.89 pL, 9.96 pL, 10.03 pL, 9.99 pL, 10.09 pL and 0.00 pL droplets in region 364, corresponding to passes by nozzles (4), (5), (6), (9) and (11) in successive scans; (d) 0.00 pL, 9.99 pL, 10.08 pL, 10.07 pL and 0.00 pL droplets in region 365, corresponding to passes by nozzles (5), (6), (7), (10) and (12) in successive scans; and (e) 9.99 pL, 0.00 pL, 10.00 pL, 0.00 pL and 0.00 pL droplets in region 366, corresponding to passes by nozzles (6), (7), (8), (11) and (13) in successive scans. Again, note that nozzles in this example are used with only a single firing waveform (i.e., such that their droplet volume characteristics do not change from scan to scan) and on a binary basis, e.g., in the fifth scan 357, nozzle (7) is not fired, producing no droplet (0.00 pL) for region 366, while on the ensuing scan, it is fired, producing a 10.08 pL droplet for region 365.

As seen in a graph at the bottom most portion of the page, this hypothetical scanning process produces aggregate fills of 49.99 pL, 50.00 pL, 49.96 pL, 49.99 pL and 50.02 pL, easily within the desired range of a target value (50.00 pL) plus or minus ½ percent (49.75 pL-50.25 pL). Note that in this example, nozzles were used to deposit ink into multiple target regions on a generally concurrent basis for each scan, with particular combinations of droplet volumes for each depicted region (i.e., as identified by the graphics at numerals 362, 363, 364, 365 and 366) planned so that multiple droplets could be deposited in each target region with many of the passes. The eight depicted passes together correlate with particular sets (or a particular combination) of droplet volumes that produce a fill volume within the specified tolerance range (for example, combinations of droplets from nozzles (1), (2), (2), (7) and (9) in the case of region 362), but other sets of possible droplets could have been also possibly used. For example, for region 362, it would have alternatively been possible to use five droplets from nozzle (2) (5×10.01 pL=50.05 pL); this alternative would have been inefficient, however, as additional scans would have been required because (for example) nozzle (3) (9.89 pL) could not have been extensively used on a concurrent basis during this time (i.e., the result from five droplets from this nozzle would have been 5×9.89=49.45 pL, outside the desired tolerance range). In the example relayed by FIG. 3B, the particular scans and their sequence were chosen so as to use less print time, a smaller number of passes, smaller geometric steps and potentially small aggregate geometric step distance, or according to some other criteria. Note that the depicted example is used for narrative discussion only, and that it might be possible to further reduce the number of scans using the presented droplet volumes to fewer than eight scans to obtain target fill. In some embodiments, the scan process is planned in a manner that avoids a worst-case scenario with the number of scans required (e.g., one scan per row of target regions with the print head rotated by ninety degrees). In other embodiments, this optimization is applied to a degree based on one or more maximums or minimums, for example, planning scans in a manner that results in the fewest number of scans possible given all possible droplet combinations for each target region for a given ink.

FIG. 3C presents an illustrative view 301 of a print head 303 and two related diagrams seen below the print head 303, in analogy to FIG. 3A, but here having nozzles that are not specially aligned to specific wells. The print head is optionally used in an embodiment that provides non-fixed geometric steps of print head relative to substrate, and so numeral 305 is used to denote offsets that align specific print head nozzles (e.g., 16 total nozzles with nozzles (1)-(5) depicted in the FIG.) with different target regions (two in this example, 374 and 375). Following again the hypothetical of FIG. 3A, if nozzles (1)-(16) respectively produce droplet volumes of 9.80, 10.01, 9.89, 9.96, 10.03, 9.99, 10.08, 10.00, 10.09, 10.07, 9.99, 9.92, 9.97, 9.81, 10.04 and 9.95 pL of fluidic ink, and if it is desired to deposit 50.00 pL per target region, ±0.5 percent of this value, the print head could be used to deposit droplets in three passes or scans, respectively using geometric steps of 0, −1, and −3, and firing one or two drops into each target region per scan. This would result in total fill values per region of 49.93 and 50.10, as depicted in the FIG., which is again clearly within the desired tolerance range of 49.75-50.25 pL for each of the depicted target regions. Thus, as seen, the same approach applies equally to the case of nozzles that are not aligned to the wells, and combining of droplets in a deliberate manner that depends on respective droplet volumes and the desired fill for each target region can be used to achieve precise, regulated fills. Furthermore, just as described above for the hypothetical of FIG. 3A, this same FIG. can be used to represent nozzle drive waveform variation and/or the use of multiple print heads. For example, if the nozzle references (1)-(16) refer to droplet volumes for a single nozzle produced by sixteen different drive waveforms (i.e., using waveforms 1-16), the per-region fill volumes can in theory be obtained simply by using different drive waveforms. One of ordinary skill in the art can see that the same approaches as described above with reference to FIG. 3B also applies equally to the case of nozzles that are not specially aligned to the wells, i.e., with groups of one or more nozzles being used for concurrent droplet deposition into respective wells. Note finally that FIGS. 3A, 3B, and 3C also represent relatively simple examples; in a typical application, there may be hundreds to thousands of nozzles, and millions of target regions. For example, in an application where the disclosed techniques are applied in the fabrication of each pixel color component of a current-resolution high-definition television screen (e.g., pixels each having red, green and blue wells, with pixels arranged in 1080 horizontal lines of vertical resolution and 1920 vertical lines of horizontal resolution), there are approximately six million wells that might receive ink (i.e., three overlapping arrays each of two million wells). Next generation televisions are expected to increase this resolution by a factor of four or more. In such a process, to improve the speed of printing, print heads may use thousands of nozzles for printing, e.g., there will typically be a staggering number of possible print process permutations. The simplified examples presented above are used to introduce concepts but it should be noted that, given the staggering numbers presented in a typical combination, permutations represented by a real-life television application are quite complex, with print optimization typically being applied by software and using complex mathematical operations. FIGS. 4-7 are used to provide non-limiting examples of how these operations can be applied.

Note that the techniques introduced in this disclosure can be manifested in a number of different ways. For example, FIG. 4 represents a number of different implementation tiers, collectively designated by reference numeral 401; each one of these tiers represents a possible discrete implementation of the techniques introduced above. First, the techniques introduced above can be embodied as instructions stored on non-transitory machine-readable media, as represented by graphic 403 (e.g., software for controlling a computer or a printer). Second, per computer icon 405, these techniques can be implemented as part of a computer or network, for example, within a company that designs or manufactures components for sale or use in other products. For example, the techniques introduced above can be implemented as design software by a company that consults to, or performs design for, a high definition television (HDTV) manufacturer; alternatively, these techniques could be used directly by such a manufacturer to make televisions (or display screens). Third, as introduced earlier and exemplified using a storage media graphic 407, the techniques introduced earlier can take the form of printer instruction, e.g., as stored instructions or data that, when acted upon, will cause a printer to fabricate one or more layers of a component dependent on the use of planned droplet aggregation techniques, per the discussion above. Fourth, as represented by a fabrication device icon 409, the techniques introduced above can be implemented as part of a fabrication apparatus or machine, or in the form of a printer within such an apparatus or machine. For example, a fabrication machine could be sold or customized in a manner where droplet measurement, and conversion of externally-supplied "layer data" is automatically converted by the machine (e.g., through the use of software) into printer instructions that will print using the techniques described here to transparently optimize/speed-up the printing process. Such data can also be computed off-line, and then reapplied on a reproducible basis in a scalable, pipelined manufacturing process that manufactures many units. It is noted that the particular depiction of the fabrication device icon 409 represents one exemplary printer device that will be discussed below (e.g., in reference to FIGS. 8-9). The techniques introduced above can also be embodied as an assembly such as an array 411 of multiple components that will be separately sold; in FIG. 4 for example, several such components are depicted in the form of an array of semi-finished flat panel devices, which will later be separated and sold for incorporation into end consumer products. The depicted devices may have, for example, one or more layers (e.g., color component layers, semiconductor layers, encapsulation layers or other materials) deposited in dependence on the methods introduced above. The techniques introduced above can also be embodied in the form of end-consumer products as referenced, e.g., in the form of display screens for portable digital devices 413 (e.g., such as electronic pads or smart phones), as television display screens 415 (e.g., HDTVs), or other types of devices. For example, FIG. 4 uses a solar panel graphic 417 to denote that the processes introduced above can be applied to other forms of electronic devices, e.g., to deposit per-target region structures (such as one or more layers of individual cells that make up an aggregate device) or blanket layers (e.g., an encapsulation layer for a TV or solar panel). Clearly, many examples are possible.

The techniques introduced above, without limitation, can be applied to any of the tiers or components illustrated in FIG. 4. For example, one embodiment of the techniques disclosed herein is an end consumer device; a second embodiment of the techniques disclosed herein is an apparatus comprising data to control the fabrication of a layer using combinations of specific nozzle volumes to obtain specific per-target region fills; nozzle volumes can be determined in advance, or measured and applied in situ. Yet another embodiment is a deposition machine, for example, that uses a printer to print one or more inks using techniques introduced above. These techniques can be implemented on one machine or more than one machine, e.g., a network or series of machines where different steps are applied at different machines. All such embodiments, and others, can independently make use of techniques introduced by this disclosure.

Figure 5:
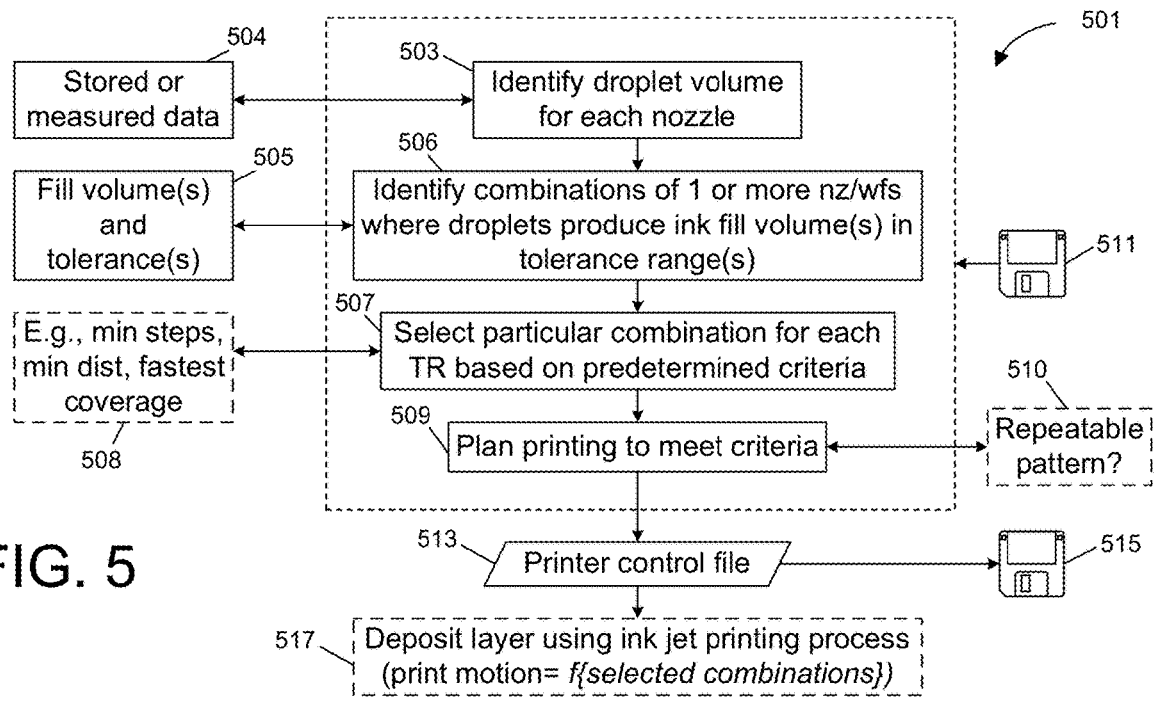
FIG. 5 provides a block diagram showing a method of planning combinations of droplets for each target region of a substrate; this method can be applied to either optional embodiment introduced by FIG. 3A.

An exemplary process for planning printing is introduced by FIG. 5. This process and associated methods and devices are generally referenced using the numeral 501.

More specifically, the droplet volume for each nozzle (and for each nozzle for each waveform if multiple drive waveforms are applied) is specifically determined (503). Such measurement can be performed for example using a variety of techniques, including without limitation an optical-imaging or laser-imaging device built into a printer (or a factory-resident machine) that images droplets during flight (e.g., during a calibration printing operation or a live printing operation) and that calculates volume with precision based on droplet shape, velocity, trajectory and/or other factors. Other techniques can also be used including printing ink and then using post-printing imaging or other techniques to calculate individual droplet volumes based on pattern recognition. Alternatively, identification can be based on data supplied by a printer or print head manufacturer, for example, based on measurements taken at a factory well prior to the fabrication process and supplied with a machine (or on-line). In some applications, droplet volume characteristics can change over time, for example, dependent on ink viscosity or type, temperature, nozzle clogging or other degradation, or because of other factors; therefore, in one embodiment, droplet volume measurement can be dynamically performed in situ, for example, upon power up (or at occurrence of other types of power cycle events), with each new printing of a substrate, upon expiration of a predetermined time or on another calendared or uncalendared basis. As denoted by numeral 504, this data (measured or provided) is stored for use in an optimization process.

In addition to per-nozzle (and optionally, per-drive-waveform) droplet volume data, information (505) is also received concerning desired fill volume for each target region. This data can be a single target fill value to be applied to all target regions, respective target fill values to be applied to individual target regions, rows of target regions or columns of target regions, or values broken down in some other manner. For example, as applied to fabricating a single "blanket" layer of material that is large relative to individual electronic device structures (such as transistors or pathways), such data could consist of a single thickness to be applied to an entire layer (e.g., which software then converts to a desired ink fill volume per target region based upon predetermined conversion data specific to the pertinent ink); in such a case, the data could be translated to a common value for each "print cell" (which in this case might be equivalent to each target region or consist of multiple target regions). In another example, the data could represent a specific value (e.g., 50.00 pL) for one or more wells, with range data either being provided or understood based on context. As should be understood from these examples, the desired fill can be specified in many different forms including, without limitation, as thickness data or volume data. Additional filtering or processing criteria can also optionally be provided to or performed by a receiving device; for example, as referenced earlier, random variation in fill volumes could be injected by a receiving device into one or more provided thickness or volume parameters to render line effect invisible to the human eye in a finished display. Such variation could be performed in advance (and provided as respective, per-target region fills that vary from region to region) or could be independently and transparently derived from a recipient device (e.g., by a downstream computer or printer).

Based on the target fill volumes for each region and individual droplet volume measurements (i.e., per-print head nozzle and per nozzle drive waveform), the process then optionally proceeds to calculate combinations of various droplets that sum to a fill volume within the desired tolerance range (i.e., per process block 506). As mentioned, this range can be provided with target fill data or can be "understood" based on context. In one embodiment, the range is understood to be ±one percent of a provided fill value. In another embodiment, the range is understood to be ±one-half percent of a provided fill value. Clearly, many other possibilities exist for tolerance ranges, whether larger or smaller than these exemplary ranges.

At this point, an example would help convey one possible method for calculating sets of possible droplet combinations. Returning to simplified examples described earlier, it should be assumed that there are five nozzles, each having respective hypothetical droplet volumes of 9.80 pL, 10.01 pL, 9.89 pL, 9.96 pL, and 10.03 pL, and that it is desired to deposit a target volume of 50.00 pL, ±½ percent (49.75 pL-50.25 pL) in five wells. This method begins by determining the number of droplets that can be combined to reach but not exceed the tolerance range and, for each nozzle, the minimum and maximum number of droplets from that nozzle that can be used in any acceptable permutation. For example, in this hypothetical, no more than a single droplet from nozzle (1), two droplets from nozzle (3) and four droplets from nozzle (4) could be used in any combination, given the minimum and maximum droplet volumes of the nozzles under consideration. This step limits the number of combinations that need be considered. Armed with such constraints on set consideration, the method then considers combinations of the required number of droplets (five in this example), taking each nozzle in turn. For example, the method first starts with nozzle (1) with an understanding that the only acceptable combinations involving this nozzle feature one drop or fewer from this nozzle. Considering combinations involving a single droplet from this nozzle, the method then considers minimum and maximum drop volumes of the other nozzle-waveform combinations under consideration; for example, given that nozzle (1) is determined to produce a droplet volume of 9.80 pL for a given drive waveform, no more than one droplet from nozzle (3) or two droplets from nozzle (4) can be used in combination with a droplet from nozzle (1) to reach the desired tolerance range. The method proceeds to consider combinations of the droplet from nozzle (1) and a combination of four droplets from other nozzles, for example, four from nozzles (2) or (5), three droplets from nozzle (2) and one droplet from nozzle (4), and so on. Considering combinations involving nozzle (1) only, to simplify discussion, any of the following different combinations involving the first nozzle could potentially be used within the tolerance range:
{1(1),4(2)}, {1(1),3(2),1(4)}, {1(1),3(2),1(5)}, {1(1),2(2),1(4),1(5)}, {1(1),1(2),1(3),2(5)}, {1(1),1(2),1(4),2(5)}, {1(1),1(2),3(5)}, {1(1),1(3),3(5)}, {1(1),2(4),2(5)}, {1(1),1(4),3(5)} and {1(1),4(5)}.

In the mathematical expression set forth above, the use of brackets denotes a set of five droplets representing droplet volume combinations from one or more nozzles, with each parenthetical within these brackets identifying the specific nozzle; for example, the expression {1(1),4(2)} represents one droplet from nozzle (1) and four droplets from nozzle (2), 9.80 pL+(4×10.01 pL)=49.84 pL, which is within the specified tolerance range. In effect, the method in this example considers the highest number of droplets from the nozzle (1) that can be used to produce the desired tolerance, evaluates combinations involving this highest number, reduces the number by one, and repeats the process of consideration. In one embodiment, this process is repeated to determine all possible sets of non-redundant droplet combinations that can be used. When combinations involving nozzle (1) have been fully explored, the method proceeds to combinations involving nozzle (2) but not nozzle (1) and repeats the process, and so forth, testing each possible nozzle combination to determine whether it can achieve the desired tolerance range. In this embodiment for example, the method has determined that combinations of two or more droplets from nozzle (1) cannot be used, so it begins with consideration of combinations involving one droplet from nozzle (1) and four droplets from other nozzles in various combination. The method in effect evaluates whether four droplets of nozzle (2) can be used, determines that it can {1(1),4(2)}, then drops this number by one (three droplets from nozzle 2), and determines that this number can be used in combination with a single droplet from nozzles (4) or (5), yielding acceptable sets of {1(1),3(2),1(4)}, {1(1),3(2),1(5)}. The method then further reduces the number of acceptable droplets from nozzle (2) by one, and evaluates combinations of {1(1),2(2) . . . }, and then {1(1),1(2) . . . }, and so forth. Once combinations involving nozzle (2) have been considered in combination with a droplet from nozzle (1), the method then takes the next nozzle, nozzle (3), and considers combinations of nozzle (1) involving this nozzle but not nozzle (2) and determines that the only acceptable combination is given by {1(1),1(3),3(5)}. Once all combinations involving a droplet from nozzle (1) have been considered, the method then considers 5-droplet combinations involving droplets from nozzle (2) but not nozzle (1), e.g., {5(2)}, {4(2),1(3)}, {4(2),1(4)}, {4(2),1(5)}, {3(2),2(3)}, {3(2),1(3),1(4)} and so on.

It is also noted that the same approach applies equally in the case that the nozzles can be driven by multiple firing waveforms (each generating different droplet volumes). These additional nozzle-waveform combinations simply provide additional droplet volumes for use in selecting the set of droplet combinations that are within the target volume tolerance range. The use of multiple firing waveforms can also improve the efficiency of the printing process by making available a larger number of acceptable droplet combinations and thereby increasing the likelihood of concurrently firing droplets from a large fraction of the nozzles on each pass. In the case that nozzles have multiple driving waveforms and geometric steps are also used, the selection of a set of droplet combinations will incorporate both the geometric offset to be used in a given scan and the nozzle waveform that will be used for each nozzle.

Note that, for purposes of narration, a brute force approach has been described and that a staggering number of possible combinations will typically be presented in practice, e.g., where the number of nozzles and target regions are large (e.g., more than 128 each). However, such computation is well within the capabilities of a high-speed processor having appropriate software. Also, note that there exist various mathematical shortcuts that can be applied to reduce computation. For example, in a given embodiment, the method can exclude from consideration any combination that would correspond to use of less than half of the available nozzles in any one pass (or alternatively, can limit consideration to combinations that minimize volume variance across target regions (TR) in any single pass). In one embodiment, the method determines only certain sets of droplet combinations that will produce acceptable aggregate fill values; in a second embodiment, the method exhaustively calculates every possible set of droplet combinations that will produce acceptable aggregate fill values. It is also possible to use an iterative approach where, in multiple repetitions, a print scan is performed, and volumes of ink still remaining to be deposited to reach the desired tolerance range(s) are considered for purposes of optimizing a next, succeeding scan. Other processes are also possible.

Note also that as an initial operation, if the same fill value (and tolerance) applies to each target region, it suffices to compute the combinations once (e.g. for one target region) and to store these possible droplet combinations for initial use with each target region. This is not necessarily the case for all set computation methods and for all applications (e.g., in some embodiments, the acceptable fill range can vary for every target region).

In yet another embodiment, the method uses mathematical shortcuts, such as approximations, matrix math, random selection or other techniques, to determine sets of acceptable droplet combinations for each target region.

As denoted by process block 507, once sets of acceptable combinations have been determined for each target region, the method then effectively plans scanning in a way that correlates with a particular set (or droplet combination) for each target region. This particular set selection is performed in a manner where the particular set (one for each target region) represents process savings through the use of at least one scan to deposit droplet volumes concurrently in multiple target regions. That is to say, in an ideal case, the method selects one particular set for each target region, where the particular set represents particular droplet volume combinations in a manner where a print head can simultaneously print into multiple rows of target regions at once. The particular droplet choices in the selected combinations represent a print process matching a predetermined criterion, such as minimal printing time, minimal number of scans, minimal sizes of geometric steps, minimal aggregate geometric step distance, or other criteria. These criteria are represented by numeral 508 in FIG. 5. In one embodiment, optimization is pareto optimal, with the particular sets selected in a manner that minimizes each of number of scans, aggregate geometric step distance and sizes of geometric steps, in that order. Again, this selection of particular sets can be performed in any desired manner, with several non-limiting examples further discussed below.

In one example, the method selects a droplet from each set for each target region corresponding to a particular geometric step or waveform applied to all regions being considered, and it then subtracts this droplet from available sets and determines a remainder. For example, if choices of available sets is initially {1(1),4(2)}, {1(1),3(2),1(4), {1(1),3(2),1(5)}, {1(1),2(2),1(4),1(5)}, {1(1),1(2),1(3),2(5)}, {1(1),1(2),1(4), 2(5)}, {1(1),1(2),3(5)}, {1(1),1(3),3(5)}, {1(1),2(4),2(5)}, {1(1),1(4),3(5)} and {1(1),4(5)} for each of five target regions, this embodiment would subtract one droplet (1) from this initial set to obtain a remainder specific to a first of the five target regions, one droplet (2) from the initial set to obtain a remainder specific to a second of the five target regions, one droplet (3) from the initial set to obtain a remainder specific to the third of the target regions, and so on. This evaluation would represent a geometric step of "0." The method would then evaluate the remainders and repeat the process for other possible geometric steps. For example, if a geometric step of "−1" was then applied, the method would subtract one droplet (2) from the initial set for the first of the five target regions, one droplet (3) from the initial set from the second of the target regions and so forth, and evaluate the remainders.

In selecting a particular geometric step (and nozzle firing) as part of print planning, the method analyzes the various remainders according to a scoring or priority function, and selects the geometric step with the best score. In one embodiment, scoring is applied to more heavily weight a step that (a) maximizes the number of nozzles used simultaneously and (b) maximizes the minimum number of combinations remaining for affected target regions. For example, a scan that used droplets from four nozzles during a scan would be more heavily favored than one that used droplets from just two nozzles. Similarly, if using the subtraction process discussed above in considering different steps resulted in 1, 2, 2, 4 and 5 remaining combinations for respective target regions for one possible step, and 2, 2, 2, 3 and 4 remaining combinations for respective target regions for a second possible step, the method would more heavily weight the latter (i.e., the largest minimum number is "2"). In practice, suitable weighting coefficients can be empirically developed. Clearly, other algorithms can be applied, and other forms of analysis or algorithmic shortcuts can be applied. For example, matrix math can be used (e.g., using an eigenvector analysis) to determine particular droplet combinations and associated scanning parameters that satisfy predetermined criteria. In another variation, other formulae can used, for example, that factor in use of planned random fill variation to mitigate line effect.

Once the particular sets and/or scan paths have been selected per numeral 507, printer actions are sequenced, per numeral 509. For example, it is noted that a set of droplets can typically be deposited in arbitrary order if aggregate fill volumes were the only consideration. If the printing is planned to minimize the number of scans or passes, the order of geometric steps can also be selected to minimize print head/substrate motion; for example, if acceptable scans in a hypothetical example involve geometric steps of {0,+3,−2,+6 and −4}, these scans can be reordered to minimize print head/substrate motion and thus further improve printing speed, for example, ordering the scans as a sequence of steps of {0,+1,+1,+2 and +4}. Compared to the first sequence of geometric steps {0,+3,−2,+6 and −4}, involving an aggregate step increment distance of 15, the second sequence of geometric steps {0,+1,+1,+2 and +4} involves an aggregate step increment distance of 8, facilitating faster printer response.

As denoted by numeral 510, for applications involving large numbers of rows of target regions which are to receive the same target fill, a particular solution can also be expressed as a repeatable pattern which is then reproduced over subset areas of the substrate. For example, if in one application there were 128 nozzles arranged in a single row and 1024 rows of target regions, it is expected than an optimal scan pattern could be determined for a subset area of 255 rows of target regions or fewer; thus, the same print pattern could be applied to four or more subset areas of the substrate in this example. Some embodiments therefore take advantage of repeatable patterns as expressed by optional process block 510.

Note the use of non-transitory machine-readable media icon 511; this icon denotes that the method described above is optionally implemented as instructions for controlling one or more machines (e.g., software or firmware for controlling one or more processors). The non-transitory media can include any machine-readable physical medium, for example, a flash drive, floppy disk, tape, server storage or mass storage, dynamic random access memory (DRAM), compact disk (CD) or other local or remote storage. This storage can be embodied as part of a larger machine (e.g., resident memory in a desktop computer or printer) or on an isolated basis (e.g., flash drive or standalone storage that will later transfer a file to another computer or printer). Each function mentioned in reference to FIG. 5 can be implemented as part of a combined program or as a standalone module, either stored together on a single media expression (e.g., single floppy disk) or on multiple, separate storage devices.

As represented by numeral 513 in FIG. 5, once the planning process is completed, data will have been generated that effectively represent a set of printer instructions, comprising nozzle firing data for the print head and instructions for relative movement between print head and substrate to support the firing pattern. This data, effectively representing the scan path, scan order and other data, is an electronic file (513) that can either be stored for later use (e.g., as depicted by non-transitory machine-readable media icon 515), or immediately applied to control a printer (517) to deposit ink representing the selected combinations (particular sets of nozzles per target region). For example, the method can be applied on a standalone computer, with the instruction data being stored in RAM for later use, or for download to another machine. Alternatively, the method could be implemented and dynamically applied by a printer to "inbound" data, to automatically plan scanning dependent on printer parameters (such as nozzle-droplet-volume data). Many other alternatives are possible.

Figure 6A:
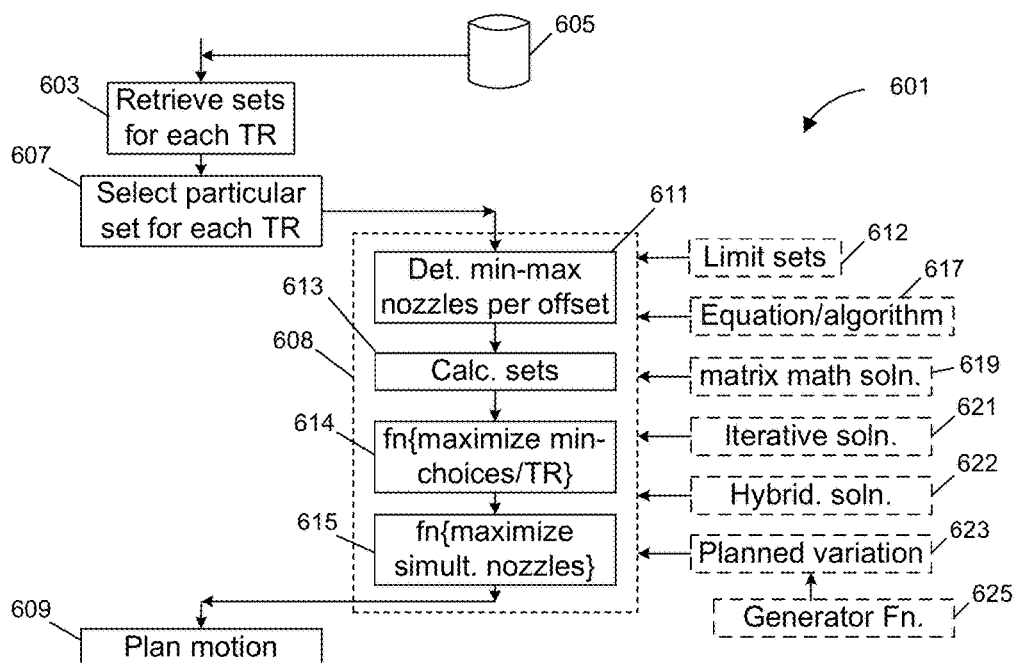
FIG. 6A provides a block diagram for choosing particular sets of acceptable droplet combinations for each target region of the substrate, usable for example with any of the embodiments introduced earlier.
Figure 6B:
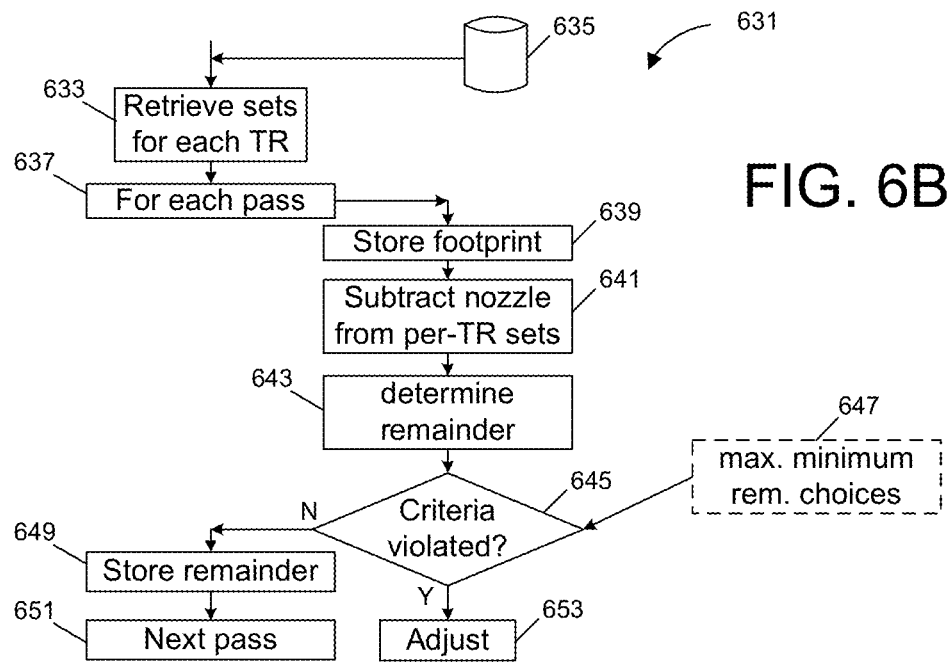
FIG. 6B provides a block diagram for iteratively planning print head/substrate motion and using of nozzles based on combinations of droplets for each print region.
Figure 6C:
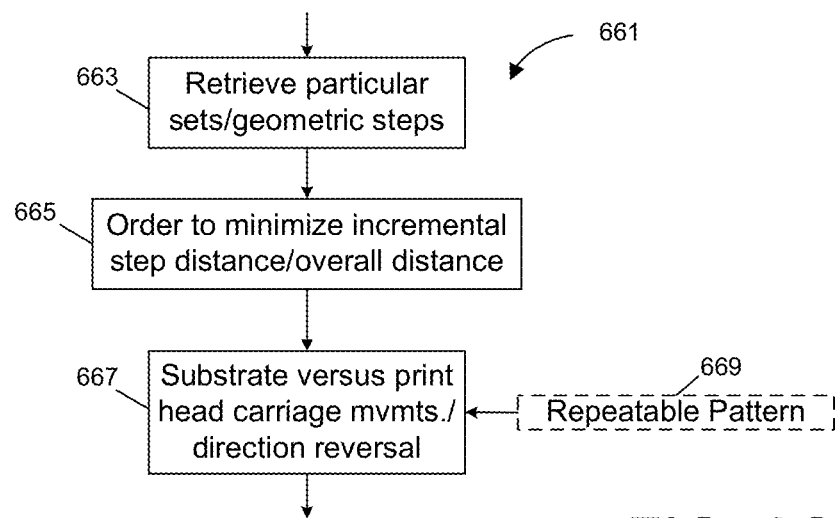
FIG. 6C provides a block diagram that illustrates further optimization of print head/substrate motion and the use of nozzles, specifically, to order scans in a manner that printing can be performed as efficiently as possible.

FIGS. 6A-6C provide flowcharts that generally relate to the nozzle selection and scan planning process. Note again that scans do not have to be continuous or linear in direction or speed of movement and do not have to proceed all the way from one side of a substrate to another.

A first block diagram is denoted by numeral 601 in FIG. 6A; this FIG. represents many of the exemplary processes discussed in the previous narration. The method first begins by retrieving from memory sets of acceptable droplet volume combinations for each target region, per numeral 603. These sets can be dynamically computed or could have been computed in advance, for example, using software on a different machine. Note the use of a database icon, 605, representing either a local-stored database (for example, stored in local RAM) or a remote database. The method then effectively selects a particular one of the acceptable sets for each target region (607). This selection in many embodiments is indirect, that is, the method processes the acceptable combinations to select particular scans (for example, using the techniques referenced above), and it is these scans that in effect define the particular sets. Nevertheless, by planning scanning, the method selects particular sets of combinations for each respective target region. This data is then used to order scans and finalize motion and firing patterns (609) as referenced above.

The middle and right of FIG. 6A illustrate a few process options for planning scan paths and nozzle firing patterns and, in effect, selecting a particular droplet combination for each target region in a manner that represents printing optimization. As denoted by numeral 608, the illustrated techniques represent but one possible methodology for performing this task. Per numeral 611, analysis can involve determining minimum and maximum use of each nozzle (or nozzle-waveform combination, in those instances in which a nozzle is driven by more than one firing waveform) in acceptable combinations. If a particular nozzle is bad (e.g., does not fire, or fires at an unacceptable trajectory), that nozzle can be ruled out for use (and for consideration). Second, if a nozzle has either a very small or very large droplet volume, this may limit the number of droplets that can be used from that nozzle in acceptable combinations; numeral 611 represents advance processing that reduces the number of combinations that will be considered. As represented by numeral 612, processes/shortcuts can be used to limit the number of sets of droplet combinations that will be evaluated; for example, instead of considering "all" possible droplet combinations for each nozzle, the method can be configured to optionally rule out combinations involving fewer than half of the nozzles (or another quantity of the nozzles, such as ¼), combinations where more than one-half of the droplets come from any particular nozzle-waveform, or combinations representing a high variance in droplet volume or representing a large variance in simultaneous droplet volumes applied across target regions. Other metrics can also be used.

Subject to any limitations to the number of sets to be computed/considered, the method then proceeds to calculate and consider acceptable droplet combinations, per numeral 613. As referenced by numerals 614 and 615, various processes can be used to plan scanning and/or otherwise effectively select a particular set of droplet volumes per target region (TR). For example, as introduced above, one method assumes a scan path (e.g., particular geometric step selection) and then considers the maximum of the fewest remaining set choices across all TRs being considered; the method can favorably weight those scan paths (alternative geometric steps) that maximize ability of ensuing scans to cover multiple target regions at-once. Alternatively or in addition, the method can favorably weight geometric steps that maximize the number of nozzles used at once; returning to the simplified five-nozzle discussion above, a scan that would apply five nozzles to a target region can be weighted more favorably that a scan or pass that would fire only three nozzles in a pass. Thus, in one embodiment, the following algorithm can be applied by software:

$$S_i = [w_1 f\{\max\{\# \text{ RemCombs}_{TR,i}\} + w_2 f\{\max\{\# \text{ Simult.Nozzles}_i\}\}].$$

In this exemplary equation, "i" represents the particular choice of geometric step or scan path, $w_1$ represents one empirically-determined weighting, $w_2$ represents a second empirically-determined weighting, # RemCombs$_{TR,i}$ represents the number of remaining combinations per target region assuming scan path i, and # Simult.Nozzles$_i$ represents a measure of the number of nozzles used for scan path i; note that this latter value need not be an integer, e.g., if fill values per TR are varied (for example, to hide potentially visible artifacts in a display device), a given scan path could feature varying numbers of nozzles used per column of target region, e.g., an average or some other measure can be used. Note also that these factors and the weightings are illustrative only, i.e., it is possible to use different weighting and/or considerations than these, use only one variable but not the other, or to use a completely different algorithm.

FIG. 6A also shows a number of further options. For example, consideration of droplet sets in one implementation is performed according to an equation/algorithm, per numeral 617. A comparative metric can be expressed as a score that can be calculated for each possible alternative geometric step in order to select a particular step or offset. For example, another possible algorithmic approach involves an equation with three terms, as shown below:

$$S_i = W_v(S_{v,min}/S_v) + W_e(S_e/S_{e,max}) + W_d(S_{d,min}/S_d),$$

where the terms based on $S_v$, $S_e$ and $S_d$ are scores respectively computed for variance in deposited droplet volumes, efficiency (maximum nozzles used per-pass) and variation in geometric step. In one formulation, the term "$(S_{v,min}/S_v)$" seeks to minimize variation in fill volume from a per-pass target value in a manner dependent on the total number of droplets.

Numeral 619 in FIG. 6A represents that, in one embodiment, droplet combination selection can be performed using matrix math, for example, through the use of mathematical techniques that simultaneously consider all droplet volume combinations and that use a form of eigenvector analysis to select scan paths.

As represented by numeral 621, an iterative process can be applied to reduce the number of considered droplet combinations. That is, for example, as represented by the earlier narration of one possible processing technique, geometric steps can be computed one at a time. Each time a particular scan path is planned, the method determines the incremental volume still needed in each target region under consideration, and then proceeds to determine a scan or geometric offset best suited to producing aggregate volumes or fill volumes per target region that are within desired tolerances. This process can then be repeated as respective iterations until all scan paths and nozzle firing patterns have been planned.

Per numeral 622, use of a hybrid process is also possible. For example, in one embodiment, a first set of one or more scans or geometric steps can be selected and used, for example, based on minimized deviation in per-nozzle droplet volume and maximum efficiency (e.g., nozzles used per scan). Once a certain number of scans have been applied, e.g., 1, 2, 3 or more, a different algorithm can be invoked, for example, that maximizes nozzles used per scan (e.g., irrespective of deviation in applied droplet volumes). Any of the specific equations or techniques discussed above (or other techniques) can optionally be applied one of the algorithms in such a hybrid process, and other variations will no doubt occur to those skilled in the art.

Note that as referenced earlier, in an exemplary display-manufacturing process, per-target region fill volumes can have planned randomization deliberately injected (623) to mitigate line effect. In one embodiment, a generator function (625) is optionally applied to deliberately vary target fill volumes (or to skew aggregate volumes produced for the droplet combination for each target region) in a manner that achieves this planned randomization or other effect. As noted earlier, in a different embodiment, it is also possible for such variation to be factored into target fill volumes and tolerances, i.e., before droplet combinations are even analyzed, and to apply, for example, algorithmic approaches as indicated earlier to meet per-target-region fill requirements.

FIG. 6B and numeral 631 refer to a more detailed block diagram related to the iterative solution referenced above. As represented by numerals 633 and 635, possible droplet combinations are once again first identified, stored, and retrieved as appropriate, for evaluation by software. For each possible scan path (or geometric step), per numeral 637, the method stores a footprint identifying the scan path (639) and nozzles applied, and it subtracts per nozzle firings from the per-target region sets (641) to determine remainder combinations for each target region (643). These are also stored. Then, per numeral 645, the method evaluates the stored data according to predefined criteria. For example, as indicated by optional (dashed-line) block 647, a method that seeks to maximize the minimum number of droplet combinations across all pertinent target regions can assign a score indicating whether the just-stored combination is better than, or worse than, previously considered alternatives. If the specified criteria are met (645), the particular scan or geometric step can be selected, with the remainder combinations being stored or otherwise flagged for use in consideration of another print head/substrate scan or pass, as represented by numerals 649 and 651. If the criteria are not met (or consideration is incomplete), another step can be considered and/or the method can adjust consideration of the geometric step under consideration (or a previously selected step), per numeral 653. Again, many variations are possible.

It was noted earlier that the order in which scans are performed or droplets are deposited is unimportant to ultimate fill values for the target region. While this is true, to maximize printing speed and throughput, scans are preferably ordered so as to result in the fastest or most efficient printing possible. Thus, if not previously factored into geometric step analysis, the sorting and/or ordering of scans or steps can then be performed. This process is represented by FIG. 6C.

In particular, numeral 661 is used to generally designate the method of FIG. 6C. Software, for example, running on a suitable machine, causes a processor to retrieve (663) the selected geometric steps, particular sets, or other data that identifies the selected scan paths (and as appropriate, nozzle firing patterns, which can further include data specifying which of a plurality of firing waveforms is to be used for each droplet, in those embodiments in which certain nozzles can be driven by more than one firing waveforms). These steps or scans are then sorted or ordered in a manner that minimizes incremental step distance. For example, again referring to the hypothetical example introduced earlier, if the selected steps/scan paths were {0,+3,−2,+6 and −4}, these might be reordered greatest to minimize each incremental step and to minimize overall (aggregate) distance traversed by a motion system in between scans. Without reordering for example, the incremental distances between these offsets would be equivalent to 3, 2, 6 and 4 (such that the aggregate distances traversed would be "15" in this example). If the scans (e.g., scans "a," "b," "c," "d" and "e") were reordered in the manner described (e.g., in order of "a," "c," "b," "e" and "d"), the incremental distances would be +1,+1, +2 and +4 (such that the aggregate distances traversed would be "8"). As denoted by numeral 667, at this point, the method can assign motion to a print head motion system and/or a substrate motion system, and can reverse the order of nozzle firing (e.g., if alternating, reciprocal scan path directions are used, per numerals 219 and 220 of FIG. 2A). As noted earlier and represented by optional process block 669, in some embodiments, planning and/or optimization can be performed for a subset of the target regions, with a solution then applied on a spatially-repeating basis over a large substrate.

Figure 6D:
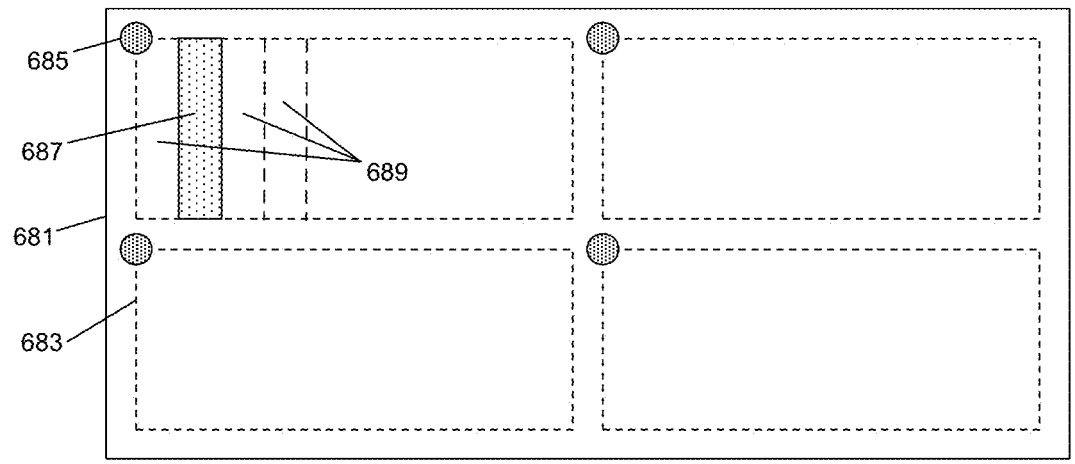
FIG. 6D is a hypothetical plan view of a substrate that will ultimately produce multiple flat panel display devices (e.g., 683); as denoted by region 687, print head/substrate motion can be optimized for a particular region of a single flat panel display device, with optimizations being used on a repeatable or periodic basis across each display device (such as the four depicted flat panel display devices).

This repetition is represented in part by FIG. 6D. As implied by FIG. 6D, it should be assumed for this narration that it is desired to fabricate an array of flat panel devices. A common substrate is represented by numeral 681, and a set of dashed-line boxes, such as box 683, represents geometry for each flat panel device. A fiducial 685, preferably with two-dimensional characteristics, is formed on the substrate and used to locate and align the various fabrication processes. Following eventual completion of these processes, each panel 683 will be separated from the common substrate using a cutting or similar process. Where the arrays of panels represent respective OLED displays, the common substrate 681 will typically be glass, with structures deposited atop the glass, followed by one or more encapsulation layers; each panel will then be inverted such that the glass substrate forms the light emitting surface of the display. For some applications, other substrate materials can be used, for example, a flexible material, transparent or opaque. As noted, many other types of devices can be manufactured according to the described techniques. A solution can be computed for a specific subset 687 of a flat panel 683. This solution can then be repeated for other, similarly-sized subsets 689 of the flat panel 683, and the entire solution set can then also be repeated for each panel to be formed from a given substrate.

Reflecting on the various techniques and considerations introduced above, a manufacturing process can be performed to mass produce products quickly and at low per-unit cost. Applied to display device manufacture, e.g., flat panel displays, these techniques enable fast, per-panel printing processes, with multiple panels produced from a common substrate. By providing for fast, repeatable printing techniques (e.g., using common inks and print heads from panel-to-panel), it is believed that printing can be substantially improved, for example, reducing per-layer printing time to a small fraction of the time that would be required without the techniques above, all while guaranteeing per-target region fill volumes are within specification. Again returning to the example of large HD television displays, it is believed that each color component layer can be accurately and reliably printed for large substrates (e.g., generation 8.5 substrates, which are approximately 220 cm×250 cm) in one hundred and eighty seconds or less, or even ninety seconds or less, representing substantial process improvement. Improving the efficiency and quality of printing paves the way for significant reductions in cost of producing large HD television displays, and thus lower end-consumer cost. As noted earlier, while display manufacture (and OLED manufacture in particular) is one application of the techniques introduced herein, these techniques can be applied to a wide variety of processes, computer, printers, software, manufacturing equipment and end-devices, and are not limited to display panels.

Figure 7:
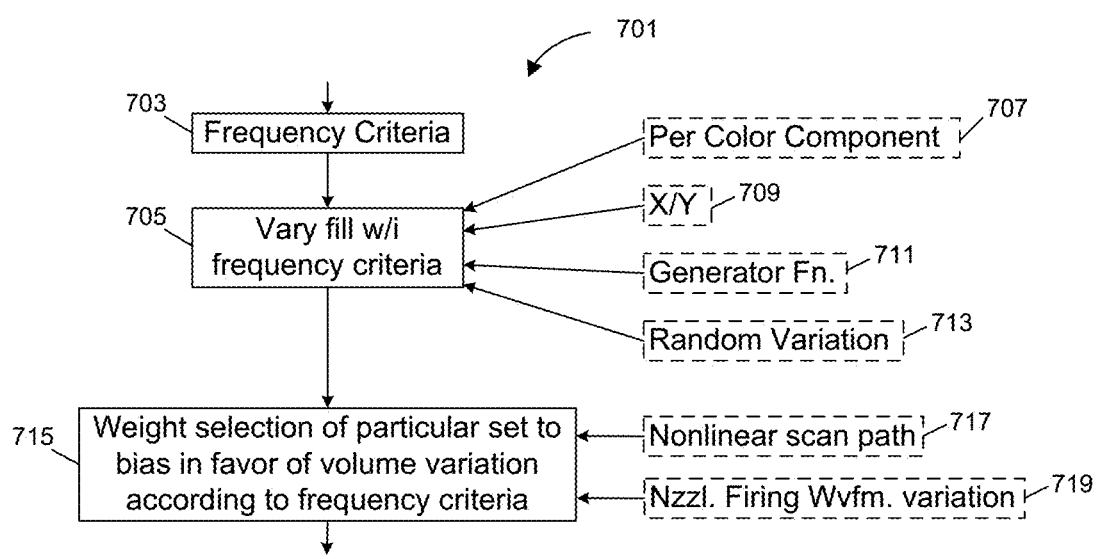
FIG. 7 provides a block diagram for deliberately varying fill volumes within acceptable tolerances in order to reduce visual artifacts in a display device.

One benefit of the ability to deposit precise target region volumes (e.g., well volumes) within tolerance is the ability to inject deliberate variation within tolerance, as mentioned. These techniques facilitate substantial quality improvements in displays, because they provide the ability to hide pixelated artifacts of the display, rendering such "line effect" imperceptible to the human eye. FIG. 7 provides a block diagram 701, associated with one method for injecting this variation. As with the various methods and block diagrams discussed above, the block diagram 701 and related method can optionally be implemented as software, either on standalone media, or as part of a larger machine.

As denoted by numeral 703, variation can be made to depend on specific frequency criteria. For example, it is generally understood that sensitivity of the human eye to contrast variation is a function of brightness, expected viewing distance, display resolution, color and other factors. As part of the frequency criteria, a measure is used to ensure that, given typical human-eye sensitivity to spatial variation in contrast between colors at different brightness levels, such variation will be smoothed in a manner not perceptible to the human eye, e.g., varied in a manner that does not contribute human-observable patterns in (a) any direction or directions, or (b) between color components given expected viewing conditions. This can be achieved optionally using a planned randomization function, as referenced earlier. With minimum criteria specified, the target fill volumes for each color component and each pixel can be deliberately varied in a manner calculated to hide any visible artifacts from the human eye, as represented by numeral 705. Note that the right side of FIG. 7 represents various process options, for example, that variation can be made independent across color components (707), with tests for perceptible patterns applied on an algorithmic basis to ensure that fill variations do not give rise to perceptible patterns. As noted by numeral 707, for any given color component (e.g., any given ink), variation can also be made independent in each of multiple spatial dimensions, for example, x and y dimensions (709). Again, in one embodiment, not only is the variation smoothed for each dimension/color component so as to not be perceptible, but any pattern of differences between each of these dimensions is also suppressed so as to not be visible. Per numeral 711, a generator function or functions can be applied to ensure that these criteria are met, for example, by optionally assigning minor target fill variations to each target region's fill prior to droplet volume analysis, using any desired criteria. As denoted by numeral 713, in one embodiment, the variation can optionally be made to be random.

Per numeral 715, selection of the particular droplet combinations for each target region are thus weighted in favor of the selected variation criteria. This can be performed, as mentioned, via target fill variation, or at the time of droplet (e.g., scan path, nozzle-waveform combination, or both) selection. Other methods for imparting this variation also exist. For example, in one contemplated implementation, per numeral 717, the scan path is varied in a nonlinear manner, effectively varying droplet volumes across mean scan path direction. Per numeral 719, nozzle firing patterns can also be varied, for example by adjusting firing pulse rise time, fall time, voltage, pulse width or using multiple signal levels per pulse (or other forms of pulse shaping techniques) to provide minor droplet volume variations; in one embodiment, these variations can be calculated in advance, and in a different embodiment, only waveform variations that create very minor volume variations are used, with other measures employed to ensure that aggregate fills stay within specified tolerance ranges. In one embodiment, for each target region, a plurality of droplet combinations that fall within specified tolerance ranges are computed and for each target region, the selection of which droplet combination is used in that target region is varied (e.g. randomly or based on a mathematical function), thereby effectively varying the droplet volumes across the target regions and mitigating line effects. Such variation can be implemented along the scan path direction over a row of target regions, over a column of target regions, or over both.

Figure 8A:
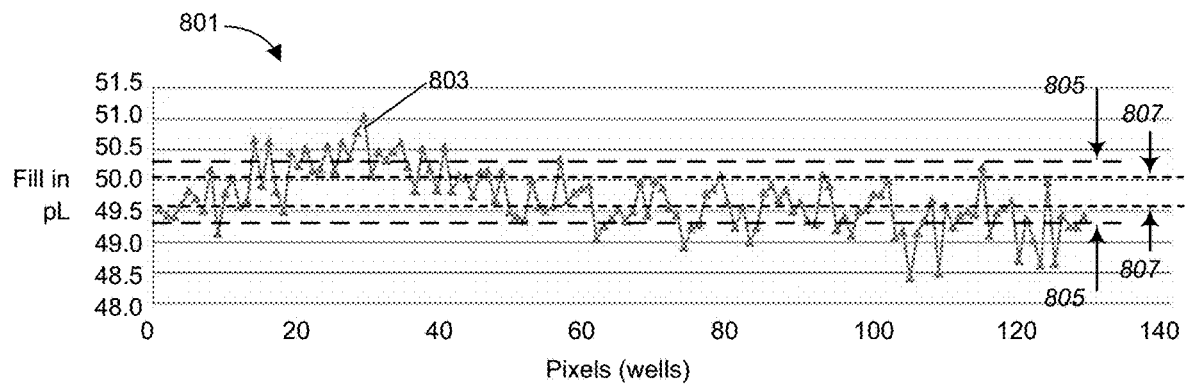
FIG. 8A provides a graph that shows variation in target region fill volume without adjustments for nozzle-to-nozzle droplet volume variation of a print head.
Figure 8B:
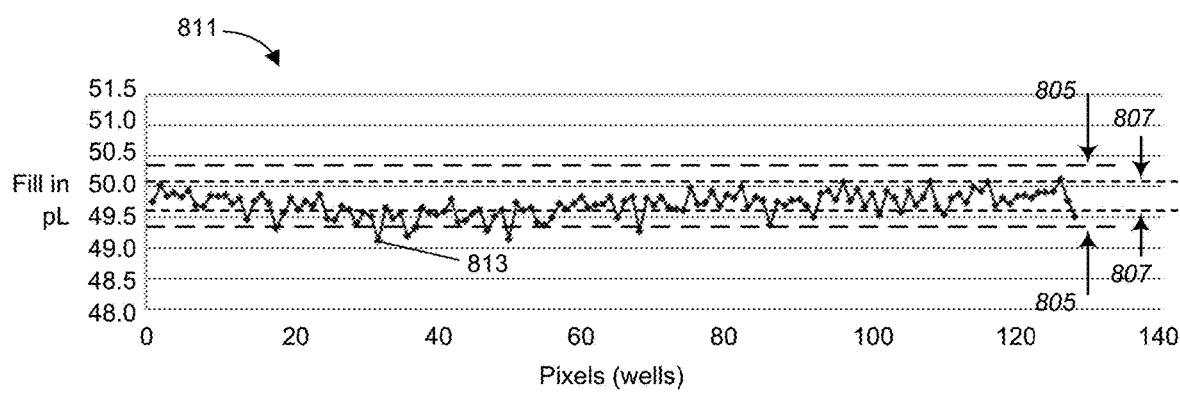
FIG. 8B provides a graph that shows variation in target region fill volume where different nozzles are randomly used to statistically compensate for nozzle-to-nozzle droplet volume variation of a print head.
Figure 8C:
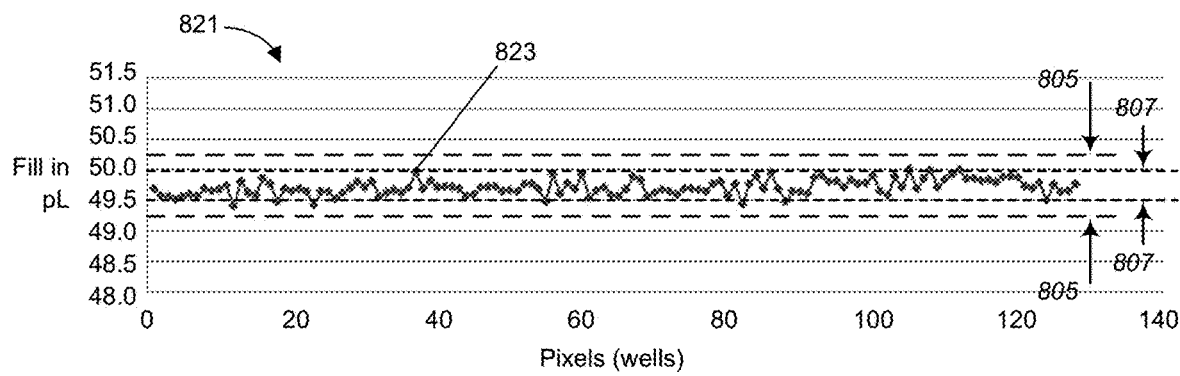
FIG. 8C provides a graph that shows variation in target region fill volume where one or more droplets of different volumes are used to achieve target region fill volume within precise tolerances on a planned basis.
Figure 9A:
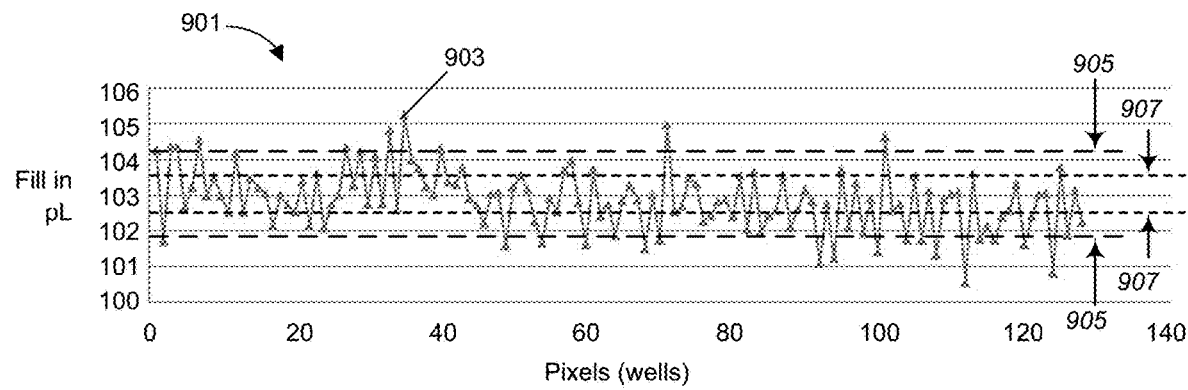
FIG. 9A provides a graph that shows variation in target region fill volume without adjustments for nozzle-to-nozzle droplet volume variation of a print head.
Figure 9B:
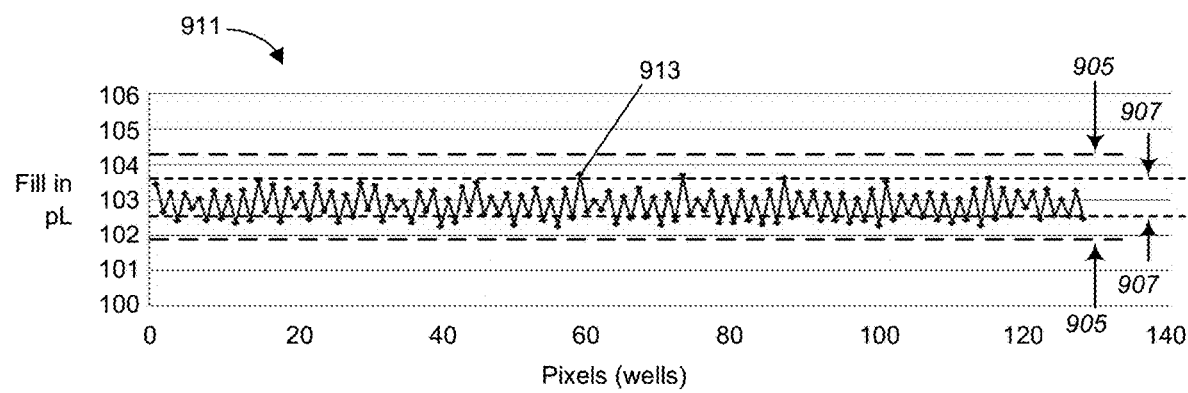
FIG. 9B provides a graph that shows variation in target region fill volume where different nozzles are randomly used to statistically compensate for nozzle-to-nozzle droplet volume variation of a print head.
Figure 9C:
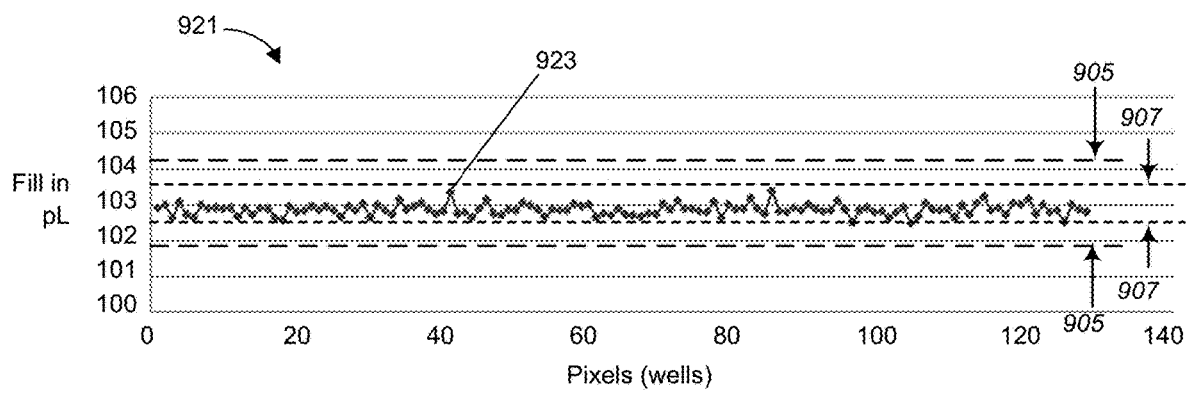
FIG. 9C provides a graph that shows variation in target region fill volume where one or more droplets of different volumes are used to achieve target region fill volume within precise tolerances on a planned basis.

FIGS. 8A-9C are used to provide simulation data for techniques discussed here. FIGS. 8A-8C represent fill volumes based on five droplets, whereas FIGS. 9A-9C represent fill volumes based on ten droplets. For each of these figures, the letter designation "A" (e.g., FIGS. 8A and 9A) represents a situation where nozzles are used to deposit droplets without consideration as to volume differences. By contrast, the letter designation "B" (e.g., FIGS. 8B and 9B) represents situations where a random combination of (5 or 10) droplets are selected to "average out" expected volume differences between nozzles. Finally, the letter designation "C" (e.g., FIGS. 8C and 9C) represents situations where scans and nozzle firings are dependent on specific aggregate ink volumes per target region that seek to minimize aggregate fill variance across target regions. In these various FIGS., the variation per nozzle is assumed to be consistent with variation observed in actual devices, each vertical axis represents aggregate fill volumes in pL, and each horizontal axis represents the number of target regions, for example, pixel wells or pixel color components. Note that the emphasis of these FIGS. is to show variation in aggregate fill volumes, assuming randomly distributed droplet variations about an assumed average. For FIGS. 8A-8C, the average volume is per nozzle is assumed to be slightly below 10.00 pL per nozzle, and for FIGS. 9A-9C, the average droplet volume per nozzle is assumed to be slightly above 10.00 pL per nozzle.

A first graph 801 represented in FIG. 8A shows per-well volume variations assuming differences in nozzle droplet volumes with no attempt to mitigate these differences. Note that these variations can be extreme (e.g., per peak 803), with a range of aggregate fill volumes of about ±2.61%. As mentioned, the average of five droplets is slightly below 50.00 pL; FIG. 8A shows two sets of sample tolerance ranges centered about this average, including a first range 805 representing a range of ±1.00% centered about this value, and a second range 807 representing a range of ±0.50% centered about this value. As is seen by the numerous peaks and troughs that exceed either range (e.g., peak 803), such a printing process results in numerous wells that would fail to meet specification (e.g., either one or the other of these ranges).

A second graph 811 represented in FIG. 8B shows per-well volume variations using a randomized set of five nozzles per well, in an effort to statistically average out the effects of droplet volume variation. Note that such a technique does not permit precise production of a specific volume of ink in any particular well, nor does such a process guarantee aggregate volumes within range. For example, although the percentage of fill volumes falling outside of specification represents a much better case than represented by FIG. 8A, there are still situations where individual wells (such as identified by trough 813) fall outside of specification, for example the ±1.00% and ±0.50% variation represented by numerals 805 and 807, respectively. In such a case, the min/max error is ±1.01%, reflecting the improvement with random mixing relative to the data presented in FIG. 8A.

FIG. 8C represents a third case, using specific combinations of per-nozzle droplets according to techniques above. In particular, a graph 821 shows that variation is entirely within a ±1.00% range and quite close to meeting a ±0.50% range for all represented target regions; once again, these ranges are represented by numerals 805 and 807, respectively. In this example, five specifically elected droplet volumes are used to fill the wells in each scan line, with the print head/substrate shifts as appropriate for each pass or scan. The min/max error is ±0.595%, reflecting further improvement with this form of "smart mixing." Note that the improvements and data observations will be consistent for any form of intelligent, droplet volume combinations to achieve specific fills or tolerance ranges, e.g., where offsets between nozzle rows (or multiple print heads) are used, or where multiple preselected drive waveforms are used to permit combination of specifically selected droplet volumes.

As mentioned, FIGS. 9A-9C present similar data, but assuming combinations of 10 droplets per well, with an average droplet volume of about 10.30 pL per nozzle. In particular, graph 901 in FIG. 9A represents a case where no attention is given to mitigating droplet volume differences, graph 911 in FIG. 9B represents a case where droplets are applied randomly in an effort to statistically "average out" volume differences, and graph 921 in FIG. 9C represents a case of planned mixing of specific droplets (to achieve the average fill volumes of FIGS. 9A/9B, i.e., approximately 103.10 pL). These various FIGS. show tolerance ranges of ±1.00% and ±0.50% variation about this average, respectively denoted using range arrows 905 and 907. Each of the FIGS. further shows respective peaks 903, 913 and 923 represented by variation. Note however, that FIG. 9A represents a variation of ±2.27% about target, FIG. 9B represents a variation of ±0.707% about target and FIG. 9C represents a variation of ±0.447% about target. With the averaging of a larger number of droplets, the "random droplet" solution of FIG. 9B is seen to achieve a ±1.00% tolerance range about the average but not a ±0.50% range. By contrast, the solution depicted by FIG. 9C is seen to meet both tolerance ranges, demonstrating that variation can be constrained to lie within specification while still permitting variation in droplet combinations from well-to-well.

One optional embodiment of the techniques described in this disclosure is described in exactly these terms. That is, for a printing process where nozzles having a maximum droplet volume variation of x % are used to deposit aggregate fill volumes having a maximum expected volume variation of y %, conventionally, there exist few means of guaranteeing that aggregate fill volumes will vary by less than x %. For applications where x % is greater than y %, this presents a potential problem. A droplet averaging technique (e.g., as represented by the data seen in FIGS. 8B and 9B) statistically reduces volume variation across target regions to an expected variance of $x\%/(n)^{1/2}$, where n is the average number of droplets needed per target region to achieve desired fill volumes. Note that even with such a statistical approach, there is no mechanism for reliably ensuring that actual target region fill volumes will sit within a tolerance of y %. The techniques discussed herein provide a mechanism for providing such reliability. One optional embodiment therefore provides a method of generating control data, or controlling a printer, and related apparatuses, systems, software and improvements where statistical volume variance across target regions is better than $x\%/(n)^{1/2}$ (e.g., substantially better than $x\%/(n)^{1/2}$). In a specific implementation, this condition is met under circumstances where print head nozzles are concurrently used to deposit droplets in respective rows of target regions (e.g., respective pixel well) with each scan. Perhaps otherwise stated, in such a specific implementation, nozzles representing a droplet variation of ±x % of a target droplet volume have their droplets combined to achieve target region fill volumes where target region aggregate fill volumes have a statistical variance of less than $x\%/(n)^{1/2}$ and feature concurrent use of different nozzles for different, respective rows of target regions for each print head/substrate scan.

With a set of basic techniques for combining droplets such that the sum of their volumes is specifically chosen to meet specific targets thus described, this document will now turn to a more detailed discussion of specific devices and applications that can benefit from these principles. This discussion is intended to be non-limiting, i.e., to describe a handful of specifically contemplated implementations for practicing the methods introduced above.

As seen in FIG. 10, a multi-chambered fabrication apparatus 1001 includes several general modules or subsystems including a transfer module 1003, a printing module 1005 and a processing module 1007. Each module maintains a controlled environment, such that printing for example can be performed by the printing module 1005 in a first controlled atmosphere and other processing, for example, another deposition process such an inorganic encapsulation layer deposition or a curing process (e.g., for printed materials), can be performed in a second controlled atmosphere. The apparatus 1001 uses one or more mechanical handlers to move a substrate between modules without exposing the substrate to an uncontrolled atmosphere. Within any given module, it is possible to use other substrate handling systems and/or specific devices and control systems adapted to the processing to be performed for that module.

Various embodiments of the transfer module 1003 can include an input loadlock 1009 (i.e., a chamber that provides buffering between different environments while maintaining a controlled atmosphere), a transfer chamber 1011 (also having a handler for transporting a substrate), and an atmospheric buffer chamber 1013. Within the printing module 1005, it is possible to use other substrate handling mechanisms such as a flotation table for stable support of a substrate during a printing process. Additionally, an xyz-motion system, such as a split axis or gantry motion system, can be used for precise positioning of at least one print head relative to the substrate, as well as providing a y-axis conveyance system for the transport of the substrate through the printing module 1005. It is also possible within the printing chamber to use multiple inks for printing, e.g., using respective print head assemblies such that, for example, two different types of deposition processes can be performed within the printing module in a controlled atmosphere. The printing module 1005 can comprise a gas enclosure 1015 housing an inkjet printing system, with means for introducing an inert atmosphere (e.g., nitrogen, a noble gas, another similar gas, or a combination thereof) and otherwise controlling the atmosphere for environmental regulation (e.g., temperature and pressure), gas constituency and particulate presence.

A processing module 1007 can include, for example, a transfer chamber 1016; this transfer chamber also has a handler for transporting a substrate. In addition, the processing module can also include an output loadlock 1017, a nitrogen stack buffer 1019, and a curing chamber 1021. In some applications, the curing chamber can be used to cure a monomer film into a uniform polymer film, for example, using a heat or UV radiation cure process.

In one application, the apparatus 1001 is adapted for bulk production of liquid crystal display screens or OLED display screens in bulk, for example, the fabrication of an array of eight screens at once on a single large substrate. These screens can be used for televisions and as display screens for other forms of electronic devices. In a second application, the apparatus can be used for bulk production of solar panels in much the same manner.

Applied to the droplet-volume combination techniques described above, the printing module 1005 can advantageously be used in display panel manufacture to deposit one or more layers, such as light filtering layers, light emissive layers, barrier layers, conductive layers, organic or inorganic layers, encapsulation layers and other types of materials. For example, the depicted apparatus 1001 can be loaded with a substrate and can be controlled to move the substrate back and forth between the various chambers to deposit and/or cure or harden one or more printed layers, all in a manner uninterrupted by intervening exposure to an uncontrolled atmosphere. The substrate can be loaded via the input loadlock 1009. A handler positioned in the transfer module 1003 can move the substrate from the input loadlock 1009 to the printing module 1005, and following completion of a printing process, moved to the processing module 1007 for cure. By repeated deposition of subsequent layers, each of controlled volume per target region, aggregate layer properties can be built up to suit any desired application. Note once again that the techniques described above are not limited to display panel manufacturing processes, and that many different types of tools can be used. For example, the configuration of the apparatus 1001 can be varied to place the various modules 1003, 1005 and 1007 in different juxtaposition; also, additional modules or fewer modules can also be used.

While FIG. 10 provides one example of a set of linked chambers or fabrication components, clearly many other possibilities exist. The ink droplet deposition techniques introduced above can be used with the device depicted in FIG. 10, or indeed, to control a fabrication process performed by any other type of deposition equipment.

FIG. 11 provides a block diagram showing various subsystems of one apparatus that can be used to fabricate devices having one or more layers as specified herein. Coordination over the various subsystems is provided by a processor 1103, acting under instructions provided by software (not shown in FIG. 11). During a fabrication process, the processor feeds data to a print head 1105 to cause the print head to eject various volumes of ink depending on firing instructions provided by, e.g., a halftone print image. The print head 1105 typically has multiple ink jet nozzles, arranged in a row (or rows of an array), and associated reservoirs that permit jetting of ink responsive to activation of a piezoelectric or other transducer per nozzle; such a transducer causes a nozzle to eject a controlled amount of ink in an amount governed by an electronic nozzle drive waveform signal applied to the corresponding piezoelectric transducer. Other firing mechanisms can also be used. The print head applies the ink to a substrate 1107 at various x-y positions corresponding to the grid coordinates within various print cells, as represented by the halftone print image. Variation in position is effected both by a print head motion system 1109 and substrate handling system 1111 (e.g., that cause the printing to describe one or more swaths across the substrate). In one embodiment, the print head motion system 1109 moves the print head back-and-forth along a traveler, while the substrate handling system provides stable substrate support and "y" dimension transport of the substrate to enable "split-axis" printing of any portion of the substrate; the substrate handling system provides relatively fast y-dimension transport, while the print head motion system 1009 provides relatively slow x-dimension transport. In another embodiment, the substrate handling system 1111 can provide both x- and y-dimension transport. In yet another embodiment, primary transport can be provided entirely by the substrate handling system 1111. An image capture device 1113 can be used to locate any fiducials and assist with alignment and/or error detection.

The apparatus also comprises an ink delivery system 1115 and a print head maintenance system 1117 to assist with the printing operation. The print head can be periodically calibrated or subjected to a maintenance process; to this end, during a maintenance sequence, the print head maintenance system 1117 is used to perform appropriate priming, purge of ink or gas, testing and calibration, and other operations, as appropriate to the particular process.

As was introduced previously, the printing process can be performed in a controlled environment, that is, in a manner that presents a reduced risk of contaminants that might degrade effectiveness of a deposited layer. To this effect, the apparatus includes a chamber control subsystem 1119 that controls atmosphere within the chamber, as denoted by function block 1121. Optional process variations, as mentioned, can include performing jetting of deposition material in presence of an ambient nitrogen gas atmosphere.

As previously mentioned, in embodiments disclosed herein, individual droplet volumes are combined to achieve specific fill volumes per target region, selected in dependence on a target fill volume. A specific fill volume can be planned for each target region, with fill value varying about a target value within an acceptable tolerance range. For such embodiments, droplet volumes are specifically measured, in a manner dependent on ink, nozzle, drive waveform, and other factors. To this end, reference numeral 1123 denotes an optional droplet volume measurement system, where droplet volumes 1125 are measured for each nozzle and for each drive waveform and are then stored in memory 1127. Such a droplet measurement system, as mentioned earlier, can be an optical strobe camera or laser scanning device (or other volume measurement tool) incorporated into a commercial printing device. In one embodiment, such a device operates in real-time (or near real time) to measure individual droplet volumes, deposition trajectory, droplet velocity, and similar data. This data is provided to processor 1103 either during printing, or during a one-time, intermittent or periodic calibration operation. As indicated by numeral 1129, a prearranged set of firing waveforms can also optionally be associated with each nozzle, for later use in producing specific per-target region droplet combinations; if such a set of waveforms is used for the embodiment, droplet volume measurements are advantageously computed during calibration using the droplet measurement system 1127 for each nozzle, for each waveform. Providing a real-time or near-real-time droplet volume measurement system greatly enhances reliability in providing target region volume fills within the desired tolerance range, as measurements can be taken as needed and processed (e.g., averaged) to minimize statistical volume measurement error.

Numeral 1131 refers to the use of print optimization software running on processor 1103. More specifically, this software, based on droplet volumes 1125 (measured in situ or otherwise provided), uses this information to plan printing in a way that combines droplet volumes as appropriate to obtain per target region specific fill volumes. In one embodiment, per the examples above, the aggregate volume can be planned down to the resolution of 0.01 pL or better, within a certain error tolerance. Once printing has been planned, the processor calculates printing parameters such as number and sequence of scans, droplet sizes, relative droplet firing times, and similar information, and builds a print image used to determine nozzle firing for each scan. In one embodiment, the print image is a halftone image. In another embodiment, a print head has multiple nozzles, as many as 10,000. As will be described below, each droplet can be described according to a time value and a firing value (e.g., data describing a firing waveform or data indicating whether a droplet will be "digitally" fired). In an embodiment where geometric steps and binary nozzle firing decisions are relied upon to vary droplet volumes per well, each droplet can be defined by a bit of data, a step value (or scan number) and a positional value indicating where the droplet is to be placed. In an implementation where scans represent continuous motion, a time value can be used as the equivalent of a positional value. Whether rooted in time/distance or absolute position, the value describes a position relative to a reference (e.g., a synchronization mark, position or pulse) that specifies with precision where and when a nozzle should be fired. In some embodiments, multiple values can be used. For example, in one specifically contemplated embodiment, a sync pulse is generated for each nozzle in a manner that corresponds to each micron of relative print head/substrate motion during a scan; relative to each sync pulse, each nozzle is programmed with (a) an offset value describing an integer clock cycle delay before the nozzle is fired, (b) a 4-bit waveform selection signal, to describe one of fifteen waveform selections preprogrammed into memory dedicated to the particular nozzle driver (i.e., with one of the sixteen possible values specifying an "off" or non-firing state of the nozzle), and (c) a repeatability value specifying whether the nozzle should be fired once only, once for every sync pulse or once for every n sync pulses. In such a case, the waveform selection and an address for each nozzle are associated by the processor 1103 with specific droplet volume data stored in memory 1127, with firing of a specific waveform from a specific nozzle representing a planned decision that a specific, corresponding droplet volume is to be used to supply aggregate ink to a specific target region of the substrate.

FIGS. 12A-14C will be used to introduce other techniques that can be used to combine different droplet volumes to obtain precision within-tolerance fill volumes for each target region. In a first technique, rows of nozzles can be selectively offset relative to one another during printing (e.g., in between scans). This technique is introduced with reference to FIGS. 12A-12B. In a second technique, nozzle drive waveforms can be used to adjust piezoelectric transducer firing and thus properties of each ejected droplet (including volume). FIGS. 13A-13B are used to discuss several options. Finally, in one embodiment, a set of multiple, alternative droplet firing waveforms are computed in advance and made available for use with each print nozzle. This technique and related circuitry is discussed with reference to FIGS. 14A-C.

FIG. 12A provides a plan diagram 1201 of a print head 1203 traversing a substrate 1205 in a scanning direction indicated by arrow 1207. The substrate is seen here to consist of a number of pixels 1209 with each pixel having wells 1209-R, 1209-G and 1209-B associated with respective color components. Note again that this depiction is an example only, i.e., techniques as used herein can be applied to any layer of a display (e.g., not limited to individual color components, and not limited to color imparting layers); these techniques can also be used to make things other than display devices. In this case, it is intended that the print head deposit one ink at a time, and assuming that the inks are color component-specific, separate printing processes will be performed, each for one of the color components, for respective wells of the display. Thus, if a first process is being used to deposit an ink specific to red light generation, only a first well of each pixel, such as well 1209-R of pixel 1209 and a similar well of pixel 1211, will receive ink in the first printing process. In a second printing process, only the second well (1209-G) of pixel 1209 and a similar well of pixel 1211 will receive a second ink, and so forth. The various wells are thus seen as three different overlapping arrays of target regions (in this case, fluid receptacles or wells).

The print head 1203 includes a number of nozzles, such as denoted using numbers 1213, 1215 and 1217. In this case, each of numbers refers to a separate row of nozzles, with the rows extending along a column axis 1218 of the substrate. Nozzles 1213, 1215 and 1217 are seen to form a first column of nozzles, relative to the substrate 1205, and nozzles 1229 represent a second column of nozzles. As depicted by FIG. 12A, the nozzles do not align with the pixels and, as the print head traverses the substrate in a scan, some nozzles will pass over target regions while other nozzles will not. Furthermore, in the FIG., while print nozzles 1213, 1215 and 1217 precisely align to the center of a row of pixels beginning with pixels 1209, while the print nozzles 1229 of the second column will also pass over the row of pixels beginning with pixel 1211, the alignment is not precise to the center of the pixels. However, in many applications, the precise location at which the droplet is deposited within a target region is not important, and such misalignments are acceptable. Note that this FIG. is illustrative only, e.g., in practice, the nozzles can be spaced closely enough in some embodiments that more than one nozzle of a single print head can be used to deposit ink in a given well in any pass (e.g. as shown in the hypotheticals of FIGS. 1B and 3C.) The alignment/misalignment of the columns of nozzles with the rows of wells is respectively depicted by lines 1225 and 1227, which denote centers of print wells that are to receive ink.

FIG. 12B provides a second view 1231, in which it is seen that all three rows of nozzles (or individual print heads) have been rotated by approximately thirty degrees relative to axis 1218. This optional capability was referenced earlier by numeral 218 in FIG. 2A. More specifically, because of the rotation, the spacing of the nozzles along the column axis 1218 has now changed, with each column of nozzles aligning with well centers 1225 and 1227. Note however, that because of scanning motion 1207, nozzles from each column of nozzles will cross a column of pixels (e.g., 1209 and 1211) at different relative times, and thus potentially have different positional firing data (e.g., different timing for firing droplets). In some embodiments, such a specifically-aligned arrangement is preferred, particularly in cases where it is necessary to precisely locate the deposited droplets within the target regions. In other embodiments, an arrangement in which the nozzles are not specially or precisely aligned to the target regions is preferred, due to the reduced system complexity, particularly in cases where it is not necessary to locate each droplet in a precise location within the target region.

As represented in FIG. 12C, in one embodiment, a print head optionally endowed with multiple rows of nozzles can have such rows selectively offset from one another. That is, FIG. 12C provides another plan view, where each of print heads (or nozzle rows) 1219, 1221 and 1223 are offset relative to one another, as represented by offset arrows 1253 and 1255. These arrows represent use of an optional motion mechanism, one for each row of nozzles, to permit selective offset of the corresponding row, relative to the print head assembly. This provides for different combinations of nozzles (and associated specific droplet volumes) with each scan, and thus for different specific droplet combinations (e.g., per numeral 1207). For example, in such an embodiment, and as depicted by FIG. 12C, such an offset permits both of nozzles 1213 and 1257 to align with center line 1225 and thus have their respective droplet volumes combined in a single pass. Note that this embodiment is considered a specific instance of embodiments which vary geometric steps, e.g., even if the geometric step size between successive scans of a print head assembly 1203 relative to the substrate 1205 is fixed, each such scan motion of a given row of nozzles is effectively positioned at a variable offset or step using the motion mechanism relative to a given row's position in other scans. It should be appreciated, however, that consistent with the principles introduced earlier, such an embodiment permits individual-per-nozzle droplet volumes to be aggregated in particular combinations (or droplet sets) for each well, but with a reduced number of scans or passes. For example, with the embodiment depicted in 12C, three droplets could be deposited in each target region (e.g., wells for red color component) with each scan, and further, the offsets permit planned variation of droplet volume combinations.

Figure 12D:
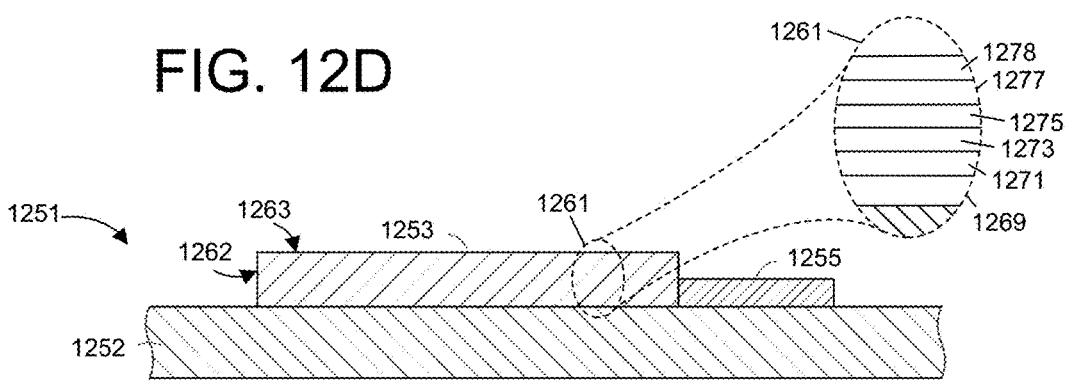
FIG. 12D shows a cross-section of a substrate, including layers that can be used in an organic light-emitting diode (OLED) display.
Figure 12C:
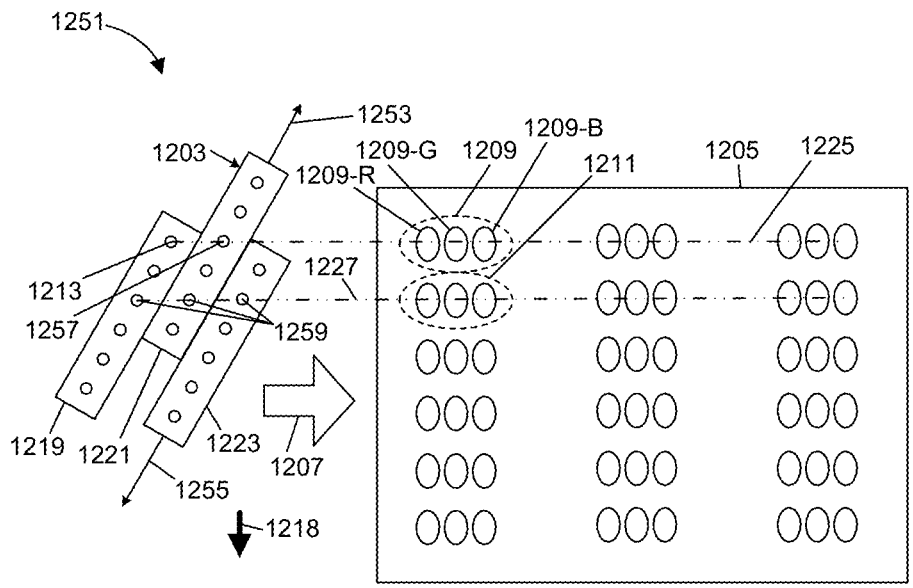
FIG. 12C shows offset of individual ones of the multiple print heads in association with intelligent scanning, to deliberately produce specific droplet volume combinations.

FIG. 12D illustrates a cross-section of a finished display for one well (e.g., well 1209-R from FIG. 12A), taken in the direction of scanning. In particular, this view shows the substrate 1252 of a flat panel display, in particular, an OLED device. The depicted cross-section shows an active region 1253 and conductive terminals 1255 to receive electrical signals to control the display (including color of each pixel). A small elliptical region 1261 of the view is seen magnified at the right side of the FIG. to illustrate layers in the active region above the substrate 1252. These layers respectively include an anode layer 1269, a hole injection layer ("HIL") 1271, a hole transport layer ("HTL") 1273, an emissive or light emitting layer ("EML") 1275, an electron transport layer ("ETL") 1277 and a cathode layer 1278. Additional layers, such as polarizers, barrier layers, primers and other materials can also be included. In some cases, the OLED device can include only a subset of these layers. When the depicted stack is eventually operated following manufacture, current flow causes the recombination of electrons and "holes" in the EML, resulting in the emission of light. The anode layer 1269 can comprise one or more transparent electrodes common to several color components and/or pixels; for example, the anode can be formed from indium tin oxide (ITO). The anode layer 1269 can also be reflective or opaque, and other materials can be used. The cathode layer 1278 typically consists of patterned electrodes to provide selective control to each color component for each pixel. The cathode layer can comprise a reflective metal layer, such as aluminum. The cathode layer can also comprise an opaque layer or a transparent layer, such as a thin layer of metal combined with a layer of ITO. Together, the cathode and anode serve to supply and collect the electrons and holes that pass into and/or through the OLED stack. The HIL 1271 typically functions to transport holes from the anode into the HTL. The HTL 1273 typically functions to transport holes from the HIL into the EML while also impeding the transport of electrons from the EML into the HTL. The ETL 1277 typically functions to transport electrons from the cathode into the EML while also impeding the transport of electrons from the EML into the ETL. Together these layers thereby serve to supply electrons and holes into the EML 1275 and confine those electrons and holes in that layer, so that they can recombine to generate light. Typically, the EML consists of separately-controlled, active materials for each of three primary colors, red, green and blue, for each pixel of the display, and as mentioned, is represented in this case by a red light producing material.

Layers in the active region can be degraded through exposure to oxygen and/or moisture. It is therefore desired to enhance OLED lifetime by encapsulating these layers, both on faces and sides (1262/1263) of those layers opposite the substrate, as well as lateral edges. The purpose of encapsulation is to provide an oxygen and/or moisture resistant barrier. Such encapsulation can be formed, in whole or in part, via the deposition of one or more thin film layers.

The techniques discussed herein can be used to deposit any of these layers, as well as combinations of such layers. Thus, in one contemplated application, the techniques discussed herein provide the ink volume for the EML layer for each of the three primary colors. In another application, the techniques discussed herein are used to provide ink volume for the HIL layer, and so on. In yet another application, the techniques discussed herein are used to provide ink volume for one or more OLED encapsulation layers. The printing techniques discussed herein can be used to deposit organic or inorganic layers, as appropriate to the process technology, and layers for other types of displays and non-display devices.

Figure 13A:
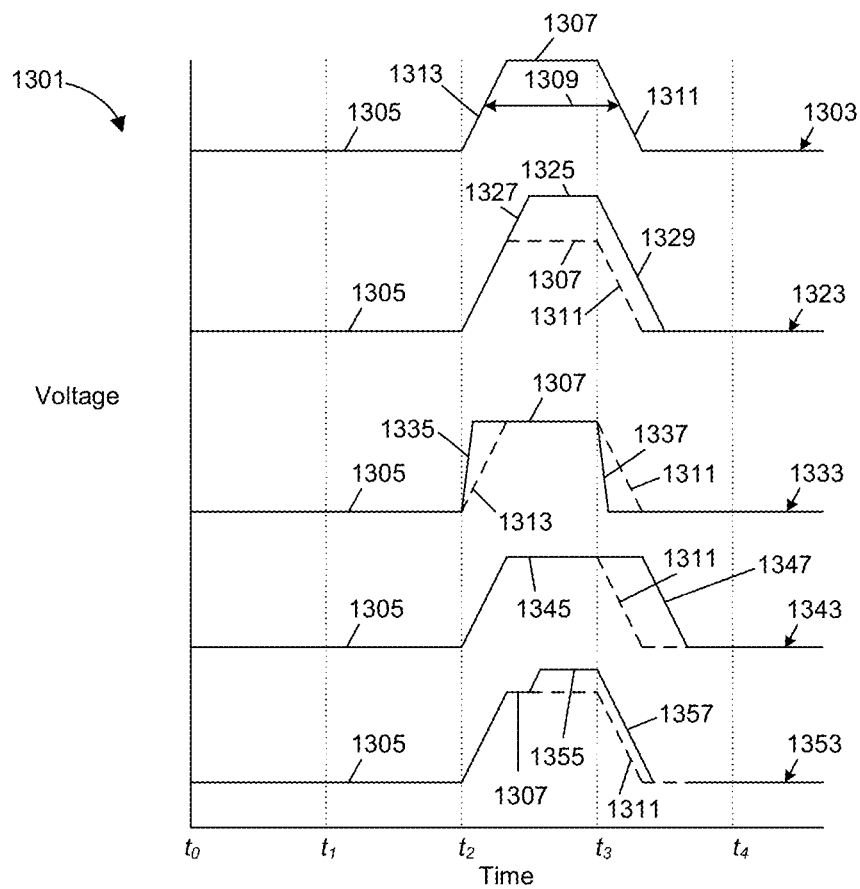
FIG. 13A shows a number of different ways of customizing or varying a nozzle firing waveform.
Figure 13B:
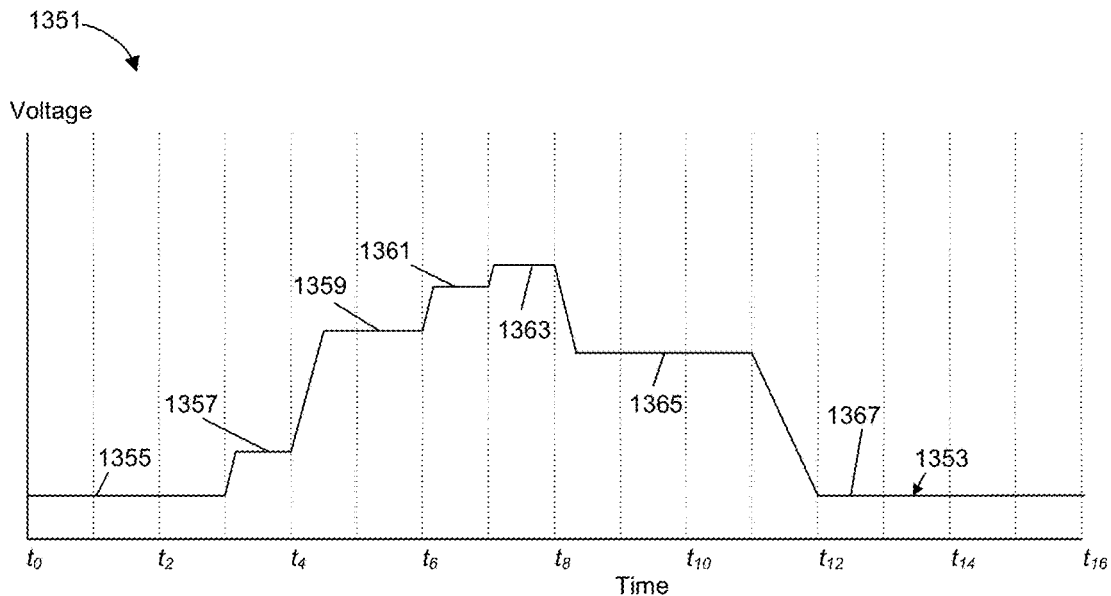
FIG. 13B shows a way of defining a waveform according to discrete waveform segments.

FIG. 13A is used to introduce nozzle drive waveform adjustment and the use of alternate nozzle drive waveforms to provide different ejected droplet volumes from each nozzle of a print head. A first waveform 1303 is seen as a single pulse, consisting of a quiet interval 1305 (0 Volts), a rising slope 1313 associated with a decision to fire a nozzle at time $t_2$, a voltage pulse or signal level 1307, and a falling slope 1311 at time $t_3$. Effective pulse width, represented by numeral 1309, is of duration approximately equal to $t_3-t_2$, depending on differences between the rising and falling slopes of the pulse. In one embodiment, any of these parameters (e.g., rising slope, voltage, falling slope, pulse duration) can be varied to potentially change droplet volume ejection characteristics for a given nozzle. A second waveform 1323 is similar to the first waveform 1303, except it represents a larger driving voltage 1325 relative to the signal level 1307 of the first waveform 1303. Because of a larger pulse voltage and finite rising slope 1327, it takes longer to reach this higher voltage, and similarly, a falling slope 1329 typically lags relative to a similar slope 1311 from the first waveform. A third waveform 1333 is also similar to the first waveform 1303 except, in this case, a different rising slope 1335 and or a different falling slope 1337 can be used instead of slopes 1313 and 1311 (e.g., through adjustment of nozzle impedances). The different slopes can be made either steeper or shallower (in the depicted case, steeper). With a fourth waveform 1343, by contrast, the pulse is made longer, for example using delay circuits (e.g., a voltage-controlled delay line) to increase both time of pulse at a given signal level (as denoted by numeral 1345) and to delay the falling edge of the pulse, as represented by numeral 1347. Finally, a fifth waveform 1353 represents the use of multiple, discrete signal levels as also providing a means of pulse shaping. For example, this waveform is seen to include time at the first-mentioned signal level 1307, but then a slope that rises to a second signal level 1355, applied halfway between times $t_3$ and $t_2$. Because of the larger voltage, a trailing edge of this waveform 1357 is seen to lag behind falling edge 1311.

Any of these techniques can be used in combination with any of the embodiments discussed herein. For example, drive waveform adjustment techniques can optionally be used to vary droplet volumes within a small range after scan motion and nozzle firing has already been planned, to mitigate line effect. The design of the waveform variation in a manner such that the second tolerance conforms to specification facilitates the deposition of high-quality layers with planned non-random or planned random variation. For example, returning to the hypothetical introduced earlier where a television maker specifies fill volumes of 50.00 pL±0.50%, per-region fill volumes can be calculated within a first range of 50.00 pL±0.25% (49.785 pL-50.125 pL), with non-random or random techniques applied to waveform variation where the variation statistically contributes no more than ±0.025 pL volume variation per droplet (given 5 droplets required to reach the aggregate fill volume). Clearly, many variations exist.

As noted above, in one embodiment, represented by the fifth waveform 1353 from FIG. 13A, multiple signal levels can be used to shape a pulse. This technique is further discussed in reference to FIG. 13B.

That is, in one embodiment, waveforms can be predefined as a sequence of discrete signal levels, e.g., defined by digital data, with a drive waveform being generated by a digital-to-analog converter (DAC). Numeral 1351 in FIG. 13B refers to a waveform 1353 having discrete signal levels, 1355, 1357, 1359, 1361, 1363, 1365 and 1367. In this embodiment, each nozzle driver includes circuitry that receives and stores up to sixteen different signal waveforms, with each waveform being defined a series of up to sixteen signal levels, each expressed as a multi-bit voltage and a duration. That is to say, in such an embodiment, pulse width can effectively be varied by defining different durations for one or more signal levels, and drive voltage can be waveform-shaped in a manner chosen to provide subtle droplet size variation, e.g., with droplet volumes gauged to provide specific volume gradations increments such as in units of 0.10 pL. Thus, with such an embodiment, waveform shaping provides ability to tailor droplet volumes to be close to a target droplet volume value; when combined with other specific droplet volumes, such as using the techniques exemplified above, these techniques facilitate precise fill volumes per target region. In addition, however, these waveform shaping techniques also facilitate a strategy for reducing or eliminating line effect; for example, in one optional embodiment, droplets of specific volumes are combined, as discussed above, but the last droplet (or droplets) is selected in a manner that provides variation relative to the boundaries of the desired tolerance range. In another embodiment, predetermined waveforms can be applied with optional, further waveform shaping applied as appropriate to adjust volume. In yet another example, the use of nozzle drive waveform alternatives provides a mechanism to plan volumes such that no further waveform shaping is necessary.

Typically, the effects of different drive waveforms and resultant droplet volumes are measured in advance. For each nozzle, up to sixteen different drive waveforms are then stored in a per-nozzle, 1k synchronous random access memory (SRAM) for later, elective use in providing discrete volume variations, as selected by software. With the different drive waveforms on hand, each nozzle is then instructed droplet-by-droplet as to which waveform to apply via the programming of data that effectuates the specific drive waveform.

Figure 14A:
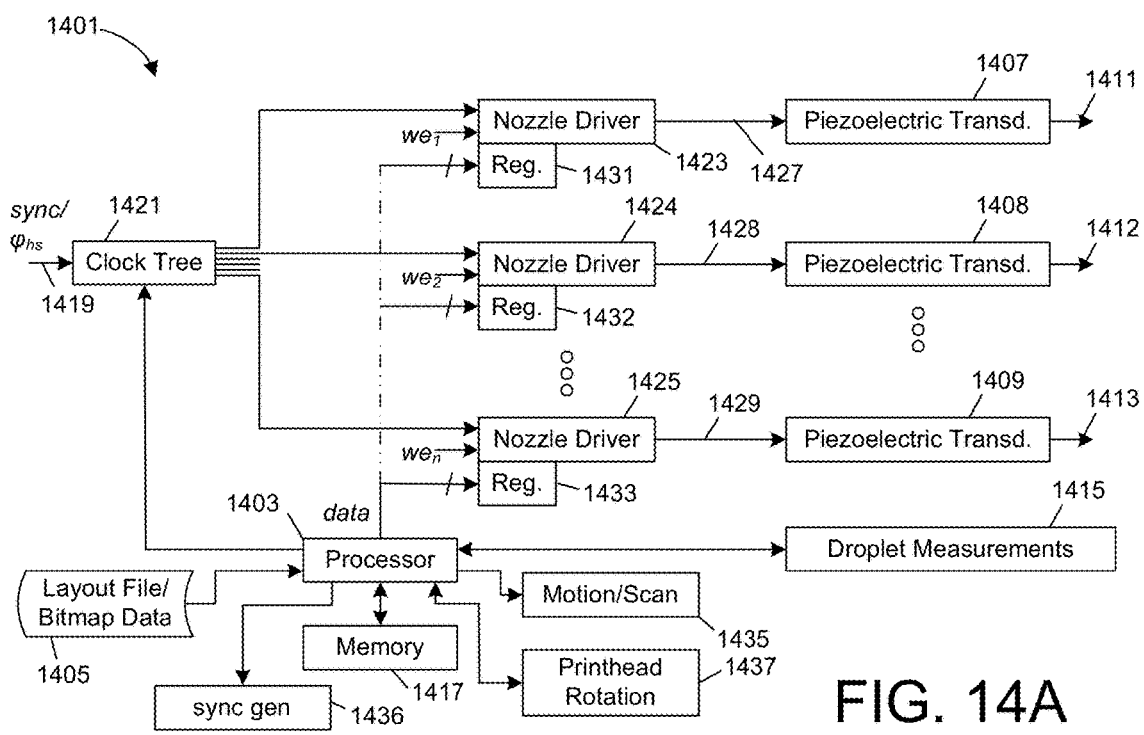
FIG. 14A shows an embodiment where different droplet volume combinations can be achieved using different combinations of predetermined nozzle firing waveforms.

FIG. 14A illustrates such an embodiment, generally designated by numeral 1401. In particular, a processor 1403 is used to receive data defining intended fill volumes per target region. As represented by numeral 1405, this data can be a layout file or bitmap file that defines droplet volumes per grid point or positional address. A series of piezoelectric transducers 1407, 1408 and 1409 generate associated ejected droplet volumes 1411, 1412 and 1413, that are respectively dependent on many factors, including nozzle drive waveform and print-head-to-print-head manufacturing variations. During a calibration operation, each one of a set of variables is tested for its effects on droplet volume, including nozzle-to-nozzle variation and the use of different drive waveforms, given the particular ink that will be used; if desired, this calibration operation can be made dynamic, for example, to respond to changes in temperature, nozzle clogging, or other parameters. This calibration is represented by a droplet measurement device 1415, which provides measured data to the processor 1403 for use in managing print planning and ensuing printing. In one embodiment, this measurement data is calculated during an operation that takes literally minutes, e.g., no more than thirty minutes and preferably much less (e.g., for thousands of print head nozzles and potentially dozens of possible nozzle firing waveforms). This data can be stored in memory 1417 for use in processing the layout or bitmap data 1405 when it is received. In one implementation, processor 1403 is part of a computer that is remote from the actual printer, whereas in a second implementation, processor 1403 is either integrated with a fabrication mechanism for products (e.g., a system for fabricating displays) or with a printer.

To perform the firing of droplets, a set of one or more timing or synchronization signals 1419 are received for use as references, and these are passed through a clock tree 1421 for distribution to each nozzle driver 1423, 1424 and 1425 to generate the drive waveform for the particular nozzle (1427, 1428 and 1429, respectively). Each nozzle driver has one or more registers 1431, 1432 and 1433, respectively, which receive multi-bit programming data and timing information from the processor 1403. Each nozzle driver and its associated registers receive one or more dedicated write enable signals ($we_n$) for purposes of programming the registers 1431, 1432 and 1433, respectively. In one embodiment, each of the registers comprises a fair amount of memory, including a 1k SRAM to store multiple, predetermined waveforms, and programmable registers to select between those waveforms and otherwise control waveform generation. The data and timing information from the processor is depicted as multi-bit information, and although this information can be provided either via a serial or parallel bit connection to each nozzle (as will be seen in FIG. 14B, discussed below, in one embodiment, this connection is serial as opposed to the parallel signal representation seen in FIG. 14A).

For a given deposition, print head or ink, the processor chooses for each nozzle a set of sixteen drive waveforms that can be electively applied to generate a droplet; note that this number is arbitrary, e.g., in one design, four waveforms could be used, while in another, four thousand could be used. These waveforms are advantageously selected to provide desired variation in output droplet volume for each nozzle, e.g., to cause each nozzle to have at least one waveform choice that produces a near-ideal droplet volume (e.g., 10.00 pL) and to provide a range of deliberate volume variation for each nozzle. In various embodiments, the same set of sixteen drive waveforms are used for all of the nozzles, though in the depicted embodiment, sixteen, possibly-unique waveforms are each separate defined in advance for each nozzle, each waveform conferring respective droplet volume characteristics.

During printing, to control deposition of each droplet, data selecting one of the predefined waveforms is then programmed into each nozzle's respective registers 1431, 1432 or 1433 on a nozzle-by-nozzle basis. For example, given a target volume of 10.00 pL, nozzle driver 1423 can be configured through writing of data into registers 1431 to set one of sixteen waveforms corresponding to one of sixteen different droplet volumes. The volume produced by each nozzle would have been measured by the droplet measurement device 1415, with nozzle-by-nozzle (and waveform-by-waveform) droplet volumes registered by the processor 1403 and stored in memory in aid of producing desired target fills. The processor can, by programming the register 1431, define whether or not it wants the specific nozzle driver 1423 to output a processor-selected one of the sixteen waveforms. In addition, the processor can program the register to have a per-nozzle delay or offset to the firing of the nozzle for a given scan line (e.g., to align each nozzle with a grid traversed by the print head, to correct for error, and for other purposes); this offset is effectuated by counters which skew the particular nozzle by a programmable number of timing pulses for each scan. In one embodiment, a sync signal distributed to all nozzles occurs at a defined interval of time (e.g., one microsecond) and in another embodiment, the sync signal is adjusted relative to printer motion and substrate geography, e.g., to fire every micron of incremental relative motion between print head and substrate. The high speed clock ($\varphi_{hs}$) is run thousands of times faster than the sync signal, e.g., at 100 megahertz, 33 megahertz, etc.; in one embodiment, multiple different clocks or other timing signals (e.g., strobe signals) can be used in combination. The processor also programs values defining a grid spacing; in one implementation, the grid spacing is common to the entire pool of available nozzles, though this need not be the case for each implementation. For example, in some cases, a regular grid can be defined where every nozzle is to fire "every five microns." In one contemplated embodiment, a memory is shared across all nozzles that permits the processor to pre-store a number of different grid spacings (e.g., 16), shared across all nozzles, such that the processor can (on demand) select a new grid spacing which is then read out to all nozzles (e.g., to define an irregular grid). For example, in an implementation where nozzles are to fire for every color component well of an OLED (e.g. to deposit a non-color-specific layer), the three or more different grid spacings can be continuously applied in round robin fashion by the processor. Clearly, many design alternatives are possible. Note that the processor 1403 can also dynamically reprogram the register of each nozzle during operation, i.e., the sync pulse is applied as a trigger to launch any programmed waveform pulse set in its registers, and if new data is asynchronously received before the next sync pulse, then the new data will be applied with the next sync pulse. The processor 1403 also controls initiation and speed of scanning (1435) in addition to setting parameters for the sync pulse generation (1436). In addition, the processor controls rotation of the print head (1437), for the various purposes described above. In this way, each nozzle can concurrently (or simultaneously) fire using any one of sixteen different waveforms for each nozzle at any time (i.e., with any "next" sync pulse), and the selected firing waveform can be switched with any other of the sixteen different waveforms dynamically, in between fires, during a single scan.

Figure 14B:
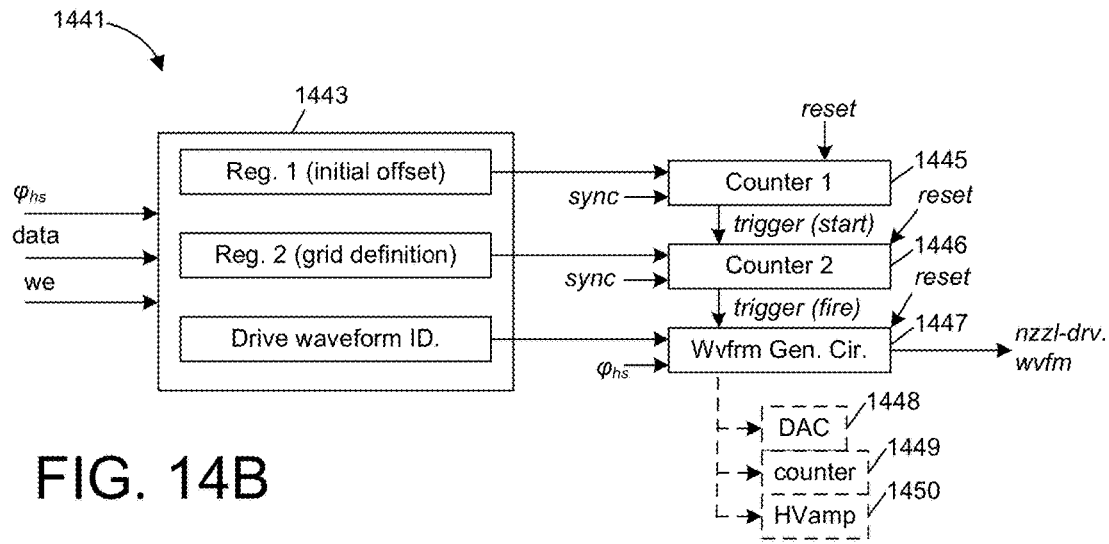
FIG. 14B shows circuitry associated with generating and applying a programmed waveform at a programmed time (or position) to a nozzle of a print head; this circuitry provides one possible implementation of each of circuits 1423/1431, 1424/1432 and 1425/1433 from FIG. 14A, for example.

FIG. 14B shows additional detail of the circuitry (1441) used in such an embodiment to generate output nozzle drive waveforms for each nozzle; the output waveform is represented as "nzzl-drv. wvfm" in FIG. 14B. More specifically, the circuitry 1441 receives inputs of the sync signal, a single bit line carrying serial data ("data"), a dedicated write enable signal (we) and the high speed clock ($\varphi_{hs}$). A register file 1443 provides data for at least three registers, respectively conveying an initial offset, a grid definition value and a drive waveform ID. The initial offset is a programmable value that adjusts each nozzle to align with the start of a grid, as mentioned. For example, given implementation variables such as multiple print heads, multiple rows of nozzles, different print head rotations, nozzle firing velocity and patterns and other factors, the initial offset can be used to align each nozzle's droplet pattern with the start of the grid, to account for delays and other factors. The grid definition value is a number that represents the number of sync pulses "counted" before the programmed waveform is triggered; in the case of an implementation that prints flat panel displays (e.g., OLED panels), the target regions to be printed in presumably have one or more regular spacings relative to the different print head nozzles, corresponding to a regular (constant spacing) or irregular (multiple spacing) grid. As mentioned earlier, in one implementation, the processor keeps its own sixteen-entry SRAM to define up to sixteen different grid spacings that can be read out on demand to the register circuitry for all nozzles. Thus, if the grid spacing value was set to two (e.g., every two microns), then each nozzle would be fired at this interval. The drive waveform ID represents a selection of one of the pre-stored drive waveforms for each nozzle, and can be programmed and stored in many manners, depending on embodiment. In one embodiment, the drive waveform ID is a four bit selection value, and each nozzle has its own, dedicated 1k-byte SRAM to store up to sixteen predetermined nozzle drive waveforms, stored as 16×16×4B entries. Briefly, each of sixteen entries for each waveform contains four bytes representing a programmable signal level, with these four bytes representing a two-byte resolution voltage level and a two-byte programmable duration, used to count a number of pulses of the high-speed clock. Each programmable waveform can thus consist of (zero to one) discrete pulses to up to sixteen discrete pulses each of programmable voltage and duration (e.g., of duration equal to 1-255 pulses of a 33 megahertz clock).

Numerals 1445, 1446 and 1447 designate one embodiment of circuitry that shows how a specified waveform can be generated. A first counter 1445 receives the sync pulse, to initiate a countdown of the initial offset, triggered by start of a new line scan; the first counter 1445 counts down in micron increments and, when zero is reached, a trigger signal is output from the first counter 1445 to a second counter 1446; this trigger signal essentially starts the firing process for each nozzle for each scan line. The second counter 1446 then implements a programmable grid spacing in increments of microns. The first counter 1445 is reset in conjunction with a new scan line, whereas the second counter 1446 is reset using the next edge of the high-speed clock following its output trigger. The second counter 1446, when triggered, and activates a waveform circuit generator 1447 which generates the selected drive waveform shape for the particular nozzle. As denoted by dashed line boxes 1448-1450, seen beneath the generator circuit, this latter circuit is based on a high speed digital-to-analog converter 1448, a counter 1449, and a high-voltage amplifier 1450, timed according to the high-speed clock ($\varphi_{hs}$). As the trigger from the second counter 1446 is received, the waveform generator circuit retrieves the number pairs (signal level and duration) represented by the drive waveform ID value and generates a given analog output voltage according to the signal level value, with the counter 1449 effective to hold DAC output for a duration according to the counter. The pertinent output voltage level is then applied to the high-voltage amplifier 1450 and is output as the nozzle-drive waveform. The next number pair is then latched out from registers 1443 to define the next signal level value/duration, and so forth.

The depicted circuitry provides an effective means of defining any desired waveform according to data provided by the processor 1403. As noted, in one embodiment, the processor decides upon a set of waveforms in advance (e.g., 16 possible waveforms, per-nozzle) and it then writes definition for each of these selected waveforms into SRAM for each nozzle's driver circuitry, with a "firing-time" decision of programmable waveform then being effected by writing a four-bit drive waveform ID into each nozzles registers.

Figure 14C:
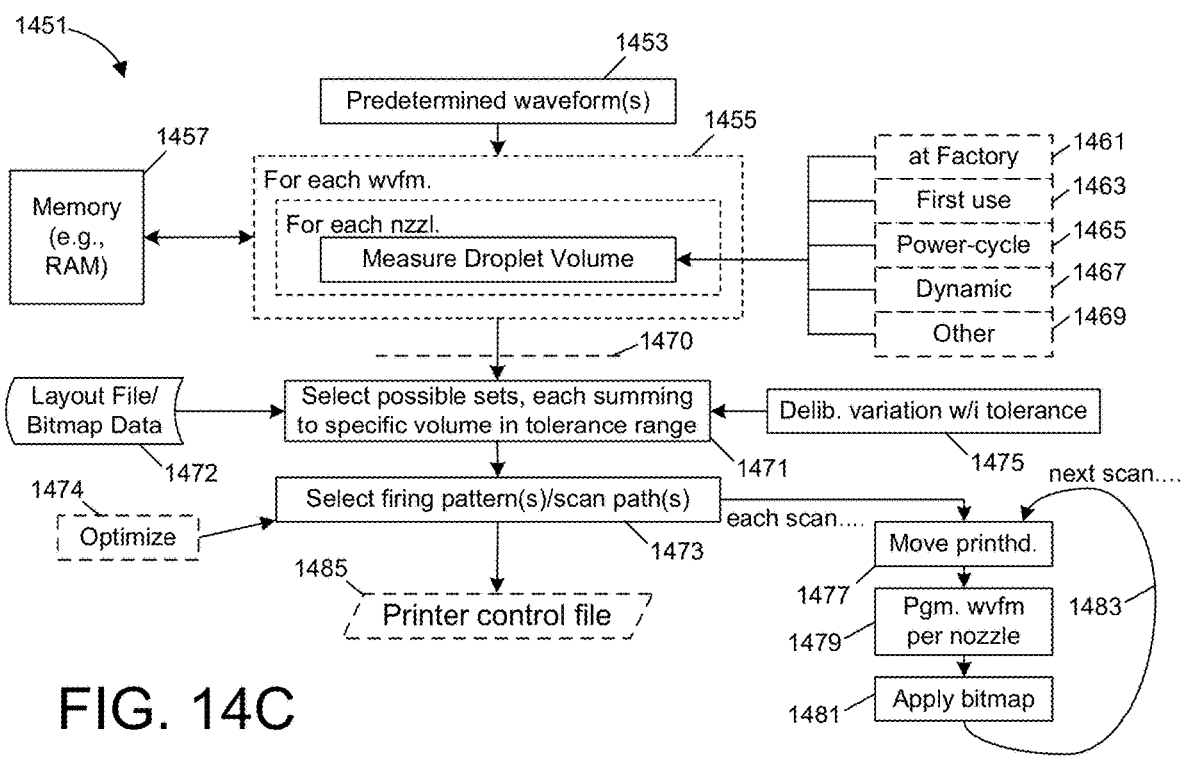
FIG. 14C shows a flow diagram of one embodiment that uses different nozzle firing waveforms.

FIG. 14C provides a flow chart 1451 that discusses methods of using different waveforms per nozzle and different configuration options. As denoted by 1453, a system (e.g., one or more processors acting under instruction from suitable software) selects a set of predetermined nozzle drive waveforms. For each waveform and for each nozzle (1455), droplet volume is specifically measured, e.g., using a laser measurement device or CCD camera for example. These volumes are stored in memory accessible to the processor, such as memory 1457. Again, measured parameters can vary depending on choice of ink and many other factors; therefore, calibration is performed depending on those factors and planned deposition activities. For example, in one embodiment 1461, calibration can be performed at the factory that manufactures the print head or printer, and this data can be preprogrammed into a sold device (e.g., a printer) or made available for download. Alternatively, for printers that possess an optional droplet measurement device or system, these volume measurements can be performed at first use (1463), e.g., upon initial device configuration. In still another embodiment, the measurements are performed with each power cycle (1465), for example, each time the printer is turned "on" or is awakened from a low-power state or otherwise moved into a state in which it is ready for printing. As mentioned previously, for embodiments where ejected droplet volumes are affected by temperature or other dynamic factors, calibration can be performed on an intermittent or periodic basis (1467), for example, after expiration of a defined time interval, when an error is detected, at the state of each new substrate operation (e.g. during substrate loading and/or loading), every day, or on some other basis. Other calibration techniques and schedules can also be used (1469).

The calibration techniques can optionally be performed in an offline process, or during a calibration mode, as represented by process separation line 1470. As mentioned, in one embodiment, such a process is completed in less than thirty minutes, potentially for thousands of print nozzles and one or more associated nozzle firing waveforms. During an online operation (or during a printing mode), represented below this process separation line 1470, the measured droplet volumes are used in selecting sets of droplets per target region, based on specific, measured droplet volumes, such that droplet volumes for each set sum to a specific aggregate volume within a defined tolerance range, per 1471. The volumes per region can be selected based on a layout file, bitmap data, or some other representation, as represented by numeral 1472. Based on these droplet volumes and the permissible combinations of droplet volumes for each target region, a firing pattern and/or scan path is selected, in effect representing a particular combination of droplets (i.e., one of the acceptable sets of combinations) for each target region that will be used for the deposition process, as represented by numeral 1473. As part of this selection or planning process 1473, an optimization function 1474 can optionally be employed, for example, to reduce the number of scans or passes to fewer than the product of the average number of droplets per target region times the number of rows (or columns) of target regions (e.g., to less than what would be required for one row of nozzles, turned 90 degrees such that all nozzles in the row could be used in each scan for each affected target region, and depositing droplets in multiple passes for each row of target region, proceeding one row at a time). For each scan, the print head can be moved, and per-nozzle waveform data can be programmed into the nozzle to effectuate droplet deposition instructions according to the bitmap or layout file; these functions are variously represented by numerals 1477, 1479 and 1481 in FIG. 14C. After each scan, the process is repeated for an ensuing scan, per numeral 1483.

Note once again that several different implementations have been described above which are optional relative to one another. First, in one embodiment, drive waveform is not varied, but remains constant for each nozzle. Droplet volume combinations are produced, as necessary, by using a variable geometric step representing print head/substrate offset to overlay different nozzles with different rows of target regions. Using measured per-nozzle droplet volumes, this process permits combination of specific droplet volumes to achieve very specific fill volumes (e.g., to 0.01 pL resolution) per target region. This process can be planned such that multiple nozzles are used to deposit ink in different rows of target regions with each pass. In one embodiment, the print solution is optimized to produce the fewest scans possible and the fastest printing time possible. Second, in another embodiment, different drive waveforms can be used for each nozzle, again, using specifically measured droplet volumes. The print process controls these waveforms such that specific droplet volumes are aggregated in specific combinations. Once again, using measured per-nozzle droplet volumes, this process permits combination of specific droplet volumes to achieve very specific fill volumes (e.g., to 0.01 pL resolution) per target region. This process can be planned such that multiple nozzles are used to deposit ink in different rows of target regions with each pass. In both of these embodiments, a single row of nozzles can be used or multiple rows of nozzles can used, arranged as one or more print heads; for example, in one contemplated implementation, thirty print heads can be used, each print head having a single row of nozzles, with each row having 256 nozzles. The print heads can be further organized into various different groupings; for example, these print heads can be organized into groups of five print heads that are mechanically mounted together, and these resulting six groupings can be separately mounted into a printing system at the same time so as to provide for concurrent firing of nozzles from all of the print heads in a single scan. In yet another embodiment, an aggregate print head having multiple rows of nozzles that can further be positionally offset from each other, is used. This embodiment is similar to the first embodiment mentioned above, in that different droplet volumes can be combined using variable effective positional offsets or geometric steps. Once again, using measured per-nozzle droplet volumes, this process permits combination of specific droplet volumes to achieve very specific fill volumes (e.g., to 0.05 pL, or even to 0.01 pL resolution) per target region. This does not necessarily imply that measurements are free from statistical uncertainties, such as measurement error; in one embodiment, such error is small and is factored into target region fill planning. For example, if droplet volume measurement error is $\pm a$ %, then fill volume variation across target regions can be planned to within a tolerance range of a target fill$\pm(b-an^{1/2})$%, where $\pm(b^2)$% represents the specification tolerance range and $\pm(n^{1/2})$ represents the square root of the average number of droplets per target region or well. Perhaps otherwise stated, a range that is smaller than specification can be planned for, such that when expected measurement error is factored in, the resultant aggregate fill volumes for target region can be expected to fall within the specification tolerance range. Naturally, the techniques described herein can be optionally combined with other statistical processes.

Droplet deposition can optionally be planned such that multiple nozzles are used to deposit ink in different rows of target regions with each pass, with the print solution optionally being optimized to produce the fewest scans possible and the fastest printing time possible. As mentioned earlier, any combination of these techniques with each other and/or with other techniques can also be employed. For example, in one specifically-contemplated scenario, variable geometric stepping is used with per-nozzle drive waveform variation and per-nozzle, per-drive-waveform volume measurements to achieve very specific volume combinations, planned per target region. For example, in another specifically-contemplated scenario, fixed geometric stepping is used with per-nozzle drive waveform variation and per-nozzle, per-drive-waveform volume measurements to achieve very specific volume combinations, planned per target region.

By maximizing the number of nozzles that can be concurrently used during each scan and by planning droplet volume combinations such that they necessarily meet specification, these embodiments promise high-quality displays; by also reducing printing time, these embodiments help promote ultra-low per-unit printing costs, and thus lower the price point to end consumers.

As also noted above, the use of precision fill volumes per target region enables the use of advanced techniques that vary fill volumes according to defined criteria (within specification) so as to avoid line effect. This provides for further quality improvements relative to conventional methods.

The foregoing description and in the accompanying drawings, specific terminology and drawing symbols have been set forth to provide a thorough understanding of the disclosed embodiments. In some instances, the terminology and symbols may imply specific details that are not required to practice those embodiments. The terms "exemplary" and "embodiment" are used to express an example, not a preference or requirement.

As indicated, various modifications and changes may be made to the embodiments presented herein without departing from the broader spirit and scope of the disclosure. For example, features or aspects of any of the embodiments may be applied, at least where practical, in combination with any other of the embodiments or in place of counterpart features or aspects thereof. Thus, for example, not all features are shown in each and every drawing and, for example, a feature or technique shown in accordance with the embodiment of one drawing should be assumed to be optionally employable as an element of, or in combination of, features of any other drawing or embodiment, even if not specifically called out in the specification. Accordingly, the specification and drawings are to be regarded in an illustrative rather than a restrictive sense.

What is claimed is:

1. A method for fabricating layers on respective substrates, to produce from each of the respective substrates a respective electronic device, the method comprising:
   using a print head to print a liquid comprising an organic monomer onto each of the respective substrates, wherein the print head has nozzles that each eject droplets of the liquid;
   transporting each of the respective substrates in succession to-and-from a printer where each of the respective substrates can be printed on by the print head;
   processing a film formed on each substrate from the droplets, in order to convert the organic monomer to a polymer to form a corresponding one of the layers; and
   measuring a characteristic of one of the droplets of the liquid ejected from one of the nozzles during droplet flight with a laser.

2. The method of claim 1, wherein the method comprises measuring the characteristic during the loading or unloading of the respective substrates.

3. The method of claim 1, wherein the method further comprises using at least one processor to generate nozzle firing instructions for respective nozzles of the print head, the nozzle firing instructions to cause the print head to print the liquid onto each of the respective substrates, and to plan printing according to expected droplet volumes for the respective nozzles, such that each region of target regions of each of the respective substrates is to receive an aggregate expected volume of the liquid that is restricted to lie within a predetermined volume tolerance range, wherein the nozzle firing instructions are dependent on per-nozzle droplet volume measurements produced by said measuring.

4. The method of claim 3, wherein the print head is a first print head, wherein the method comprises using one or more printheads including the first print head to print the liquid onto each of the respective substrates, wherein the one or more printheads collectively comprise at least one thousand nozzles, and wherein the method further comprises measuring the characteristic for at least one droplet produced by each nozzle of the at least one thousand nozzles, in order to obtain at least one of an expected volume or expected trajectory in a manner respective to each nozzle of the at least one thousand nozzles.

5. The method of claim 3, wherein the aggregate expected volume for at least one region can include droplets produced from a common nozzle according to respective ones of electronic drive waveform choices for the common nozzle, and wherein the method further comprises using the at least one processor to select at least two electronic drive waveforms for the common nozzle from among the electronic drive waveform choices for the common nozzle, and causing the print head to print droplets according to each selected electronic drive waveform.

6. The method of claim 5, wherein the method further comprises using the at least one processor to program a set of at least two parameters into electronic drive circuitry for each one of the respective nozzles, and wherein each selected electronic drive waveform has a waveform shape defined according to a set of the at least two parameters.

7. The method of claim 3, wherein the method further comprises causing the print head to deposit, for a common one of the target regions, droplets from respective ones of the nozzles to form the aggregate expected volume for the common one of the target regions, in respective scans of relative motion between the print head and the substrate, the respective scans being differentiated by a print head offset in a spatial dimension independent from a direction of the respective scans.

8. The method of claim 3, wherein the method further comprises using the at least one processor to program a digital value into electronic drive circuitry for each one of the respective nozzles, the digital value to define a selected electronic drive waveform for the one of the respective nozzles, relative to other possible waveform choices, and wherein the method further comprises using an electronic trigger signal to trigger the electronic drive circuitry for plural ones of the nozzles to responsively and concurrently eject droplets for the plural ones of the nozzles according to the digital value programmed into the electronic drive circuitry for corresponding ones of the nozzles.

9. The method of claim 3, wherein the predetermined volume tolerance range for each of the target regions lies within a range of plus two percent of a target volume and minus two percent of the target volume.

10. The method of claim 1, wherein the method further comprises containing the print head and the processing mechanism within a controlled atmosphere, wherein the printing of the liquid and the processing of the liquid coat are each to be performed within the controlled atmosphere, in a manner uninterrupted by exposure to an uncontrolled atmosphere.

11. The method of claim 1, wherein each respective electronic device is an electronic light emitting device.

12. The method of claim 1, wherein each electronic light emitting device is an electronic display device comprising pixels, and wherein each of the layers for the respective electronic device is to provide a film for each of the pixels of the respective electronic display device, post-manufacture of said electronic display device.

13. The method of claim 12, wherein each of the layers is to provide a color filter for one or more of the pixels.

14. The method of claim 12, wherein each of the layers is to be a light generating layer for one or more the pixels.

15. The method of claim 12, wherein each of the layers is to be an organic encapsulation layer for one or more of the pixels.

16. The method of claim 12, wherein each of the layers for the respective electronic device is to blanket-cover pixels of the respective electronic device.

17. The method of claim 1, wherein processing comprises curing each of the layers using radiation.

18. The method of claim 17, wherein the radiation is ultraviolet radiation.

19. A method for fabricating layers on respective substrates, to produce from each of the respective substrates a respective electronic device, the method comprising:
using a print head to print a liquid comprising an organic monomer onto each of the respective substrates, wherein the print head has nozzles that each eject droplets of the liquid;
transporting each of the respective substrates in succession to-and-from a printer where each of the respective substrates can be printed on by the print head;
processing a film formed on each substrate from the droplets, in order to convert the organic monomer into a polymer to form a corresponding one of the layers; and
measuring, during the loading or unloading of the respective substrates, a characteristic of one of the droplets of the liquid ejected from one of the nozzles during droplet flight with a laser;
wherein each respective electronic device is an electronic light emitting device.

20. A method for fabricating layers on respective substrates, to produce from each of the respective substrates a respective electronic device, the method comprising:
using a print head to print a liquid comprising an organic monomer onto each of the respective substrates, wherein the print head has nozzles that each eject droplets of the liquid;
transporting each of the respective substrates in succession to-and-from a printer where each of the respective substrates can be printed on by the print head;
processing a film formed on each substrate from the droplets, in order to convert the organic monomer to a polymer to form a corresponding one of the layers; and
measuring a characteristic of one of the droplets of the liquid ejected from one of the nozzles during droplet flight with a laser;
wherein the method further comprises using at least one processor to generate nozzle firing instructions for respective nozzles of the print head, the nozzle firing instructions to cause the print head to print the liquid onto each of the respective substrates, and to plan printing according to expected droplet volumes for the respective nozzles, such that each region of target regions of each of the respective substrates is to receive an aggregate expected volume of the liquid that is restricted to lie within a predetermined volume tolerance range, wherein the nozzle firing instructions are dependent on per-nozzle droplet volume measurements produced by said measuring; and wherein each respective electronic device is an electronic light emitting device.

* * * * *